(12) United States Patent
Doubchak et al.

(10) Patent No.: US 11,742,879 B2
(45) Date of Patent: Aug. 29, 2023

(54) MACHINE-LEARNING ERROR-CORRECTING CODE CONTROLLER

(71) Applicant: SAMSUNG ELECTRONICS CO., LTD., Suwon-si (KR)

(72) Inventors: Ariel Doubchak, Herzliya (IL); Dikla Shapiro, Petah Tikva (IL); Evgeny Blaichman, Tel Aviv-Jaffa (IL); Lital Cohen, Yavne (IL); Amit Berman, Binyamina (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 77 days.

(21) Appl. No.: 17/495,474

(22) Filed: Oct. 6, 2021

(65) Prior Publication Data

US 2022/0116057 A1 Apr. 14, 2022

Related U.S. Application Data

(63) Continuation-in-part of application No. 16/585,186, filed on Sep. 27, 2019, now Pat. No. 11,221,769, and a continuation-in-part of application No. 16/352,052, filed on Mar. 13, 2019, now Pat. No. 11,184,026.

(51) Int. Cl.
*H03M 13/00* (2006.01)
*H03M 13/11* (2006.01)
*G06N 3/10* (2006.01)

(52) U.S. Cl.
CPC .......... *H03M 13/1108* (2013.01); *G06N 3/10* (2013.01); *H03M 13/1111* (2013.01)

(58) Field of Classification Search
None
See application file for complete search history.

(56) References Cited

U.S. PATENT DOCUMENTS

| | | | |
|---|---|---|---|
| 10,460,749 B1* | 10/2019 | Ru | G10L 15/063 |
| 2004/0006733 A1* | 1/2004 | Hamalainen | H04L 1/0071 |
| | | | 714/752 |
| 2006/0013181 A1* | 1/2006 | Stolpman | H03M 13/353 |
| | | | 370/441 |

(Continued)

FOREIGN PATENT DOCUMENTS

CN 112216334 1/2021

OTHER PUBLICATIONS

Office Action dated Nov. 17, 2020 in related U.S. Appl. No. 16/352,052.

(Continued)

*Primary Examiner* — Mujtaba M Chaudry
(74) *Attorney, Agent, or Firm* — F. Chau & Associates, LLC

(57) ABSTRACT

A machine-learning (ML) error-correcting code (ECC) controller may include a hard-decision (HD) ECC decoder optimized for high-speed data throughput, a soft-decision (SD) ECC decoder optimized for high-correctability data throughput, and a machine-learning equalizer (MLE) configured to variably select one of the HD ECC decoder or the SD ECC decoder for data throughput. An embodiment of the ML ECC controller may provide speed-optimized HD throughput based on a linear ECC. The linear ECC may be a soft Hamming permutation code (SHPC).

20 Claims, 60 Drawing Sheets

(56) References Cited

U.S. PATENT DOCUMENTS

| | | |
|---|---|---|
| 2007/0043998 A1 | 2/2007 | Lakkis |
| 2007/0136641 A1 | 6/2007 | Juluri et al. |
| 2009/0164871 A1 | 6/2009 | Jo |
| 2010/0192043 A1 | 7/2010 | Alrod |
| 2012/0182804 A1 | 7/2012 | Hung et al. |
| 2017/0126360 A1* | 5/2017 | Millar .................. H04L 1/0045 |
| 2017/0139769 A1 | 5/2017 | Blaichman et al. |
| 2018/0343017 A1* | 11/2018 | Kumar ............... H03M 13/1111 |
| 2018/0349359 A1 | 12/2018 | McCann et al. |
| 2019/0007062 A1 | 1/2019 | Twitto et al. |
| 2019/0164599 A1 | 5/2019 | Avraham et al. |
| 2019/0236458 A1* | 8/2019 | Taylor ..................... G06F 17/17 |
| 2019/0280885 A1* | 9/2019 | Afghah .................... G06N 5/02 |
| 2020/0210831 A1 | 7/2020 | Zhang et al. |
| 2020/0285419 A1 | 9/2020 | Ng et al. |
| 2020/0295783 A1 | 9/2020 | Berman et al. |
| 2021/0096751 A1 | 4/2021 | Berman et al. |

OTHER PUBLICATIONS

Office Action dated Apr. 27, 2021 in related U.S. Appl. No. 16/585,186.

Notice of Allowance dated Sep. 3, 2021 in related U.S. Appl. No. 16/585,186.

\* cited by examiner

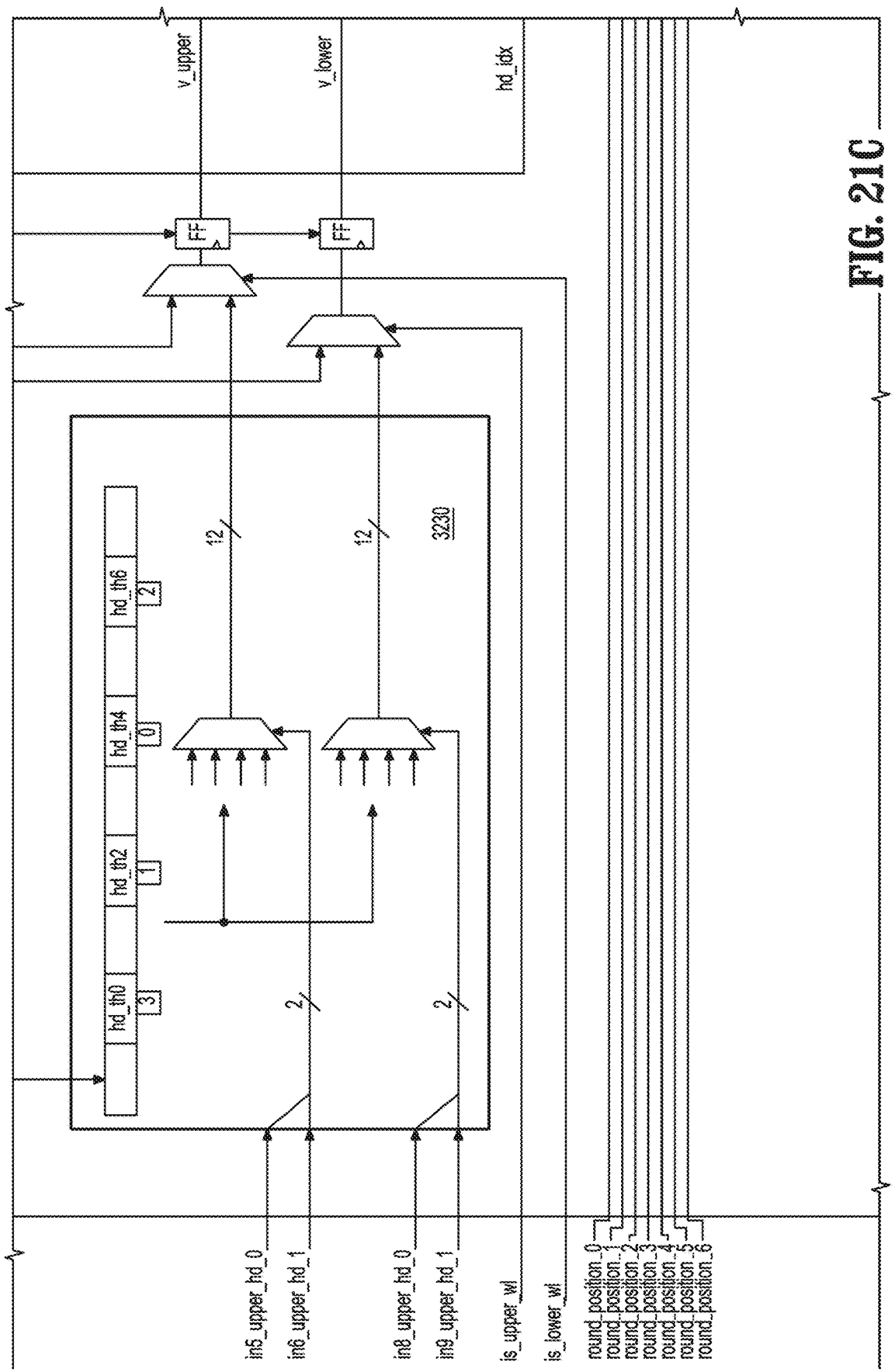

| Korean WL | RD Scheme ||||||||||||
| | SSL0 ||| SSL1 ||| SSL2 ||| SSL3 |||
|---|---|---|---|---|---|---|---|---|---|---|---|---|
| Dummy2 | 1100 | | | 1101 | | | 1102 | | | 1103 | | |
| 91 | 0 | 1 | | 2 | 3 | | 4 | 5 | | 6 | 7 | |
| 90 | 8 | 9 | 10 | 11 | 12 | 13 | 14 | 15 | 16 | 17 | 18 | 19 |
| 89 | 20 | (21) | 22 | 23 | 24 | 25 | 26 | 27 | 28 | 29 | 30 | 31 |
| 88 | 32 | 33 | 34 | 35 | 36 | 37 | 38 | 39 | 40 | 41 | 42 | 43 |
| 87 | 44 | 45 | 46 | 47 | 48 | 49 | 50 | 51 | 52 | 53 | 54 | 55 |
| 86 | 56 | 57 | 58 | 59 | 60 | 61 | 62 | 63 | 64 | 65 | 66 | 67 |

FIG. 28

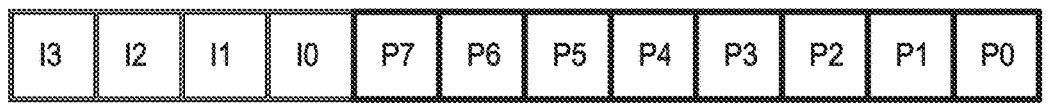
FIG. 29
| I3 | I2 | I1 | I0 | Identifier |
|---|---|---|---|---|
| 0 | 0 | 0 | 0 | Address |
| 0 | 0 | 0 | 1 | Data |
FIG. 30
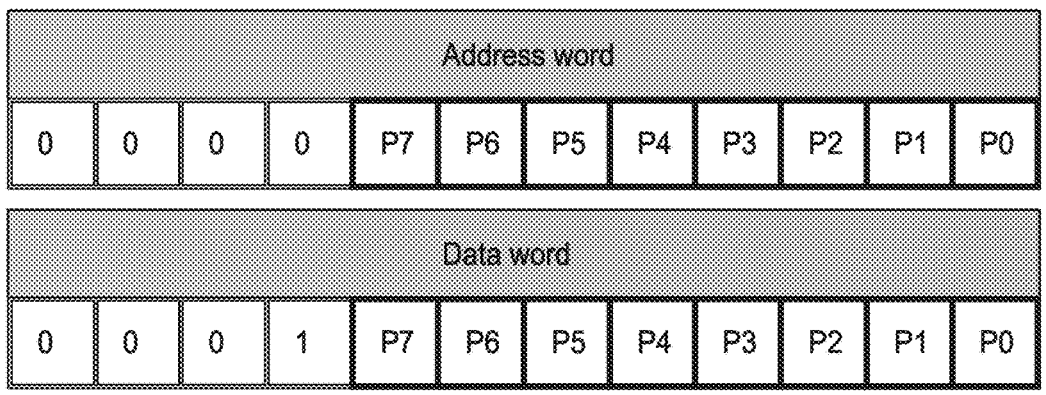
FIG. 31

Initialization -                                                                                    7100

┌─────────────────────────────────────────────────────────────────────────────┐
│ • Calculate channel LLR for all inputs - $L_{ch} = |LLR_{ch}|$ [$L_{ch} = LLR_{ch}$]   7110 │
│ • Calculate channel syndrome for all rows and columns for extended hamming codes - │
│   $S_{ch} = H \cdot sign(LLR_{ch})$. │
│ • Initialize the decision syndrome of the transpose codes to zero - $S_{dec} = 0$ │
└─────────────────────────────────────────────────────────────────────────────┘

Pre-Decode -

┌─────────────────────────────────────────────────────────────────────────────┐
│ • Compute right messages for all bit in col/row codes - $L_r = L_{ch} + L_l$        7120 │
│ • Calculate syndrome for the error pattern defined by the $sign(L_r)$ - $S_r = H \cdot sign(L_r)$ │
│ • Update syndrome including the current errors - $S_{data} = S_{ch} + S_r$ [$S_{data} = S_r$]. │
│ • Initialize error decision - $E_{dec} = sign(L_r)$ [$C_{dec} = sign(L_r)$] │
└─────────────────────────────────────────────────────────────────────────────┘

SISO Decoder (Decode) -

┌─────────────────────────────────────────────────────────────────────────────┐
│ • Check parity bit (the last bit in $S_{data}$) which indicates for even or odd flips  7130 │
│ • Go over all flip even (or odd) hypothesis (flip patterns) - $h$ │
│ • For each flip hypothesis calculates the syndrome - $S_h = H \cdot h$ │
│ • Calculate the syndrome for data with flip pattern - $S_{data+h} = S_{data} + S_h$ │
│ • Find legitimate flip bit from $S_{data+h}$ │
│ • Calculate coss for each hypothesis - $Q(h) = \sum_{m \in flip\ \&\ suspect} |LLR_{in,m}|$ │
│ • Save the flipped bit index for each hypothesis and its cost($Q_{flip} = Q(h)$) │
│ • Save the minimmal cost of all hypothesis - min1 │
│ • Save the minimal hypothesis (ML error pattern) - $h_{min}$ │
│ • Save the second minimmal cost of all hypothesis - min2 │
│ • Calculate minimal cost for suspect bits equal to zero - $B_0 = Q(D^{non-flip})$ │
│ • Calculate minimal cost for suspect bits equal to one - $B_1 = Q(D^{flip})$ │
└─────────────────────────────────────────────────────────────────────────────┘

3bit SD decoding performed with Machine-Learning Equalizer flow.

FIG. 32A

Post-Decode -

- Calculate decoder message for suspect bits - $L_{dec} = (B_1 - B_0) \cdot sign(L_r)$     7140
- Calculate decoder message for flipped bits in minimal cost pattern - $L_{dec} = (min1 - min2) \cdot sign(L_r)$
- Calculate decoder message for flipped bits in non-minimal cost pattern - $L_{dec} = (Q_{flip}[i] - min1) \cdot sign(L_r)$
- Set $\alpha = \alpha(min1)$ and $\beta = \beta(min1)$ using look up table
- Calculate left message for special bits (suspect and flipped bits) - $L_l = \alpha \cdot (L_{dec} - L_r)$
- Calculate left message for regular bits (the rest bits) - $L_l = \beta \cdot sign(L_r)$ Error Decision -

- Update error decision, $E_{dec}[C_{dec}]$, by flipping the bits that were actually flipped (i.e., suspect bits with "1" in ML error pattern, and the flipped bit for this hypothesis).    7140

Decision Syndrome -

- Update the decision syndrome for the transpose code by the bits that were actually flipped - $S_{dec} = S_{ch} \oplus S(index\ flip\ bit)$    7160

Stopping Criteria -

- Stop when all syndromes in $S_{dec}$ are zero or maximum iteration counter has reached    7170

Decoded Codeword -

- Decode codeword - $\hat{C} = C_{dec} \oplus sign(R)[\hat{C} = C_{dec}]$    7180

| | Area (um^2) | | | GC (K) | | |
|---|---|---|---|---|---|---|
| Block | Logic | SRAM | Total | Logic | SRAM | Total |
| Decoder 2ch | 123,425.48 | 37924.83 | 161350.31 | 1,700.63 | 522.55 | 2,223.19 |
| Encoder | 9320.45 | 0.00 | 9320.45 | 128.42 | 0.00 | 128.42 |

9410

9420

| Peak Power [mA] per Channel | 83 @ UNCOR HD |
|---|---|
| Average Power [mA] per Channel | 43 @ 4e-3 RBER |

FIG. 55

MACHINE-LEARNING ERROR-CORRECTING CODE CONTROLLER

CROSS-REFERENCE

This application is a continuation-in-part of co-pending U.S. patent application Ser. No. 16/352,052 titled SUPER-HPC ERROR CORRECTION CODE and filed on Mar. 13, 2019, and is also a continuation-in-part of co-pending U.S. patent application Ser. No. 16/585,186 titled PERFORMING NOISE CANCELLATION ON A MEMORY DEVICE USING A NEURAL NETWORK and filed on Sep. 27, 2019, the disclosures of which are incorporated by reference in their entireties.

FIELD

The present disclosure generally relates to controllers for error detection and correction, and more particularly relates to a machine-learning error-correcting code controller.

DISCUSSION OF RELATED ART

Error-correcting codes (ECC) adopted for reliability in universal flash storage (UFS) and/or solid-state drives (SSD), such as Reed-Solomon (RS), low-density parity check (LDPC) codes, or the like, may be mis-matched for flash memory controllers having NAND flash memory without substantial dynamic random-access memory (DRAM).

SUMMARY

A memory controller embodiment is provided, including: a hard-decision (HD) error-correcting code (ECC) decoder configured to receive and decode at least one first binary vector indicative of an encoded data word based on the encoded data word itself; a soft-decision (SD) ECC decoder configured to receive and decode at least one second binary vector indicative of the encoded data word based on the encoded data word and an associated probability of reliability measure; and a machine-learning equalizer (MLE) configured to variably select for output a decoded data word from one of the HD ECC decoder or the SD ECC decoder on a per data word basis in accordance with a learned cost function.

A method embodiment is provided for controlling a memory device, comprising: reading voltage levels as binary vectors from a plurality of memory cells connected to a string select line (SSL) of a memory device into a machine-learning (ML) neural network configured to minimize a learned cost function based on data word speed and correctability through the memory device; receiving and decoding at least one first binary vector indicative of a data word encoded based on a hard-decision (HD) error-correcting code (FCC); receiving and decoding at least one second binary vector indicative of the data word encoded based on a soft-decision (SD) ECC including an associated probability of reliability measure; variably selecting for output a decoded data word based on the ML neural network's selection of one of the HD ECC or the SD ECC for each data word; and cancelling noise on the SSL based on the selection, wherein each of the HD ECC and the SD ECC are based on a linear ECC, wherein the at least one first binary vector and the at least one second binary vector are mapped through an inverse interleave.

A memory control circuit embodiment is provided, including: an input control circuit configured to receive a data input signal and a validity signal, and output a status signal; an equalization arbitration circuit coupled to the input control circuit and configured to select one of a hard-decision (HD) error-correcting code (ECC) or a soft-decision (SD) ECC for decoding the data input signal based on the status signal and a learned cost function of a machine-learning (ML) neural network; a weak scan circuit coupled to the input control circuit and the equalization arbitration circuit and configured to receive an index and output a corresponding bit value based on whether the data input signal matches a valid codeword; a weak write circuit coupled to the weak scan circuit and the equalization arbitration circuit and configured to receive the index and the bit value and to output a data output signal; a calculation control circuit coupled to the equalization arbitration circuit; a configuration management buffer configured to store at least one of HD ECC codewords or SD ECC codewords in accordance with an inverse interleaver; a pre-calculation circuit coupled to the configuration management buffer; an equalization calculation circuit coupled to the configuration management buffer, the pre-calculation circuit and the calculation control circuit; and an input emulation circuit coupled to the calculation control circuit and the equalization arbitration circuit, and configured to provide a linear ECC output.

BRIEF DESCRIPTION OF THE DRAWINGS

FIGS. 21 and 21A-21H are block diagrams showing equalizer calculation blocks of an ML equalizer in accordance with an embodiment of the present disclosure;

FIG. 28 is a tabular diagram showing word-line to pages mappings for TLC Flash memory in an ML equalizer in accordance with an embodiment of the present disclosure;

FIG. 29 is a block diagram showing a 12-bit Micro Special Function Register (uSFR) register for use with a uSFR protocol in an ML equalizer in accordance with an embodiment of the present disclosure;

FIG. 30 is a tabular diagram showing the four left-most bits or access identifier of the uSFR register of FIG. 29 in accordance with an embodiment of the present disclosure;

FIG. 31 is a block diagram showing an address word and a data word each using a 12-bit uSFR register of FIG. 29 in accordance with an embodiment of the present disclosure;

FIGS. 32A and 32B form a pseudocode diagram for operation of a machine-learning memory controller in accordance with an embodiment of the present disclosure;

FIG. 55 is a tabular diagram that shows a machine-learning memory controller in accordance with an embodiment of the present disclosure.

DETAILED DESCRIPTION

Figure 1:
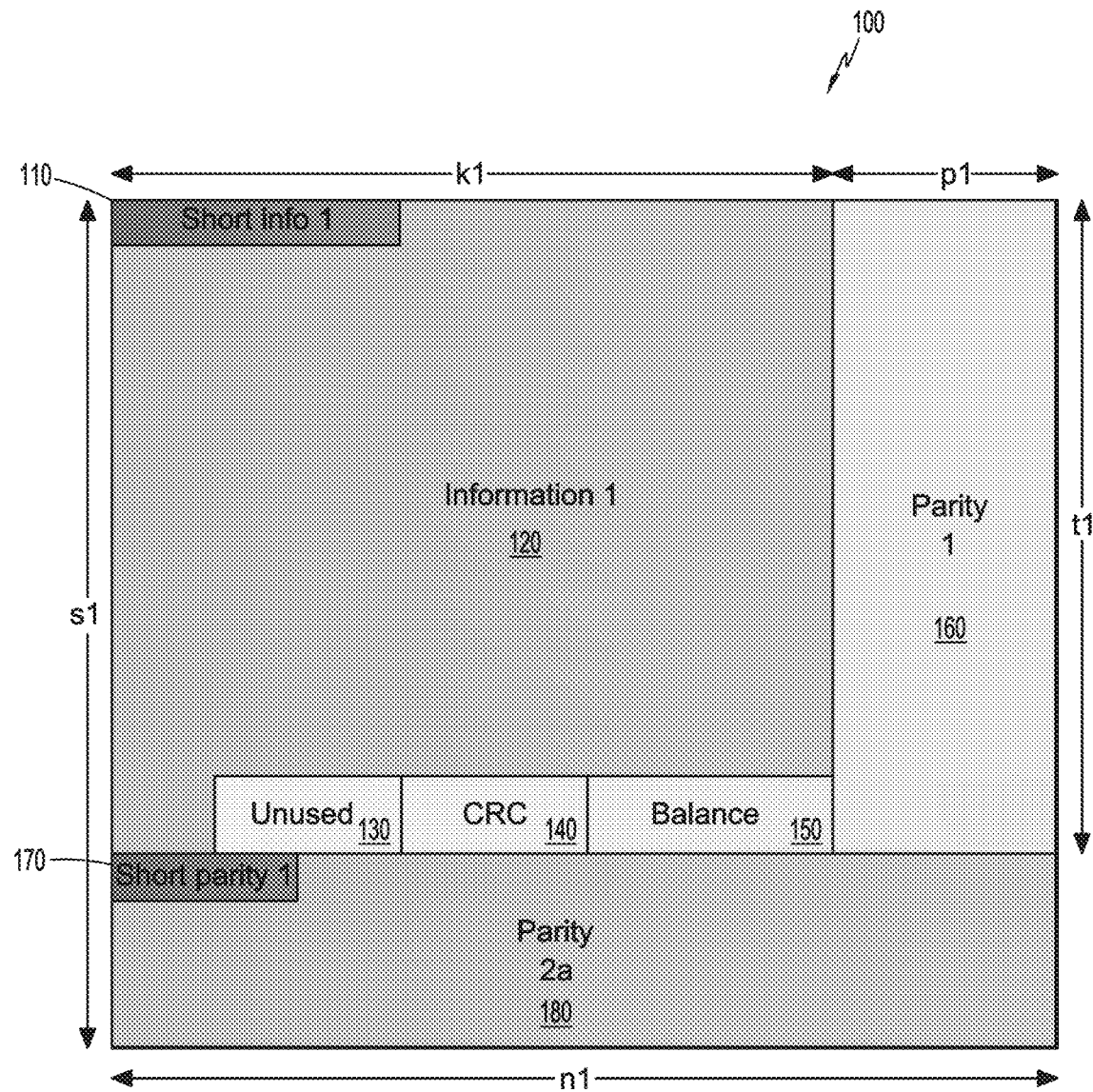
FIG. 1 is a conceptual diagram showing a soft Hamming permutation code (SHPC) J1 plane structure for an interleaver in accordance with an embodiment of the present disclosure.

Embodiments of the present disclosure may meet design criteria with error-correcting code (ECC) specifically designed for NAND-Flash memory, such as optimized hard-decision (HD) throughput speed with soft Hamming permutation code (SHPC) decoding, and NAND-aware soft-decision (SD) decoding with a combination of machine-learning (ML) and SHPC. An illustrative example based on co-design and co-optimization using Gnu's Not Unix (GNU) compiler collection (GCC) to implement SHPC with an ML equalizer may use joint hardware resources to provide HD throughput scalability and NAND correctability. Embodiments may offer a new type of ECC decoder including SHPC code for high throughput in HD decoding and an ML-equalizer mode for high correctability in SD decoding.

An embodiment of the present disclosure includes an ML controller with NAND-aware ECC decoder optimized for use in NAND-Flash memories. An embodiment provides speed-optimized HD throughput based on a SHPC coder/decoder (CODEC) engine, where the term "soft" may indicate at least one additional parity bit, and the term "permutation" may indicate Hamming matrices mutated into equivalent non-systematic codes by column permutations such as swapping columns or the like; and correctability-optimized SD throughput based on an ML equalizer (MLE).

Each code may be a group of binary vectors. ECC may map user data to codewords independent of HD or SD decoding mechanisms. HD input may be a binary vector to be de-noised or decoded. SD input may be a binary vector plus a probability of reliability measure such as a log-likelihood ratio (LLR) to be de-noised or decoded, without limitation thereto.

The SHPC is an example of a linear error-correcting code, but embodiments are not limited to this example. ML controller embodiments may be adapted for use in memory systems such as NAND Flash memories and communications systems such as wireless and/or Internet packet communications systems, without limitation thereto.

In NAND Flash memories, optimized soft-decision (SD) throughput may be provided based on at least one of the SHPC CODEC, a machine-learning equalizer (MLE), or a co-optimized combination thereof utilizing joint hardware resources. Solid-state drives (SSD) and universal Flash storage (UFS) embodiments may provide high reliability, high HD throughput scalability, and high NAND correctability.

In an SHPC CODEC embodiment having a transpose block interleaver, each row and each column respectively includes a shortened Hamming codeword. Checks-on-checks bits may be used to assure that each row and each column is a constituent codeword, respectively.

In an SHPC CODEC embodiment having a more general interleaver, the behavior of such checks-on-checks bits may no longer be satisfied. Moreover, the code structure for the general interleaver need not be presentable in a single domain such as rows and columns, but may be presented in two planes such as J1 and J2 planes, where J1 and J2 represent two different permutations of codewords. The J1 and J2 planes may be related by the general interleaver, where each row in each plane is a shortened Hamming code.

As shown in FIG. 1, the J1 plane of an inverse interleaver is indicated generally by the reference numeral 100. The J1 plane 100 includes a first short information block (Short Information 1) 110, a first information block (Information 1) 120, an unused or reserved block 130, a cyclic redundancy check (CRC) block 140, a balance block 150, a parity block (Parity 1) 160, a first short parity block (Short Parity 1) 170, and another parity block (Parity 2a) 180.

Figure 2:
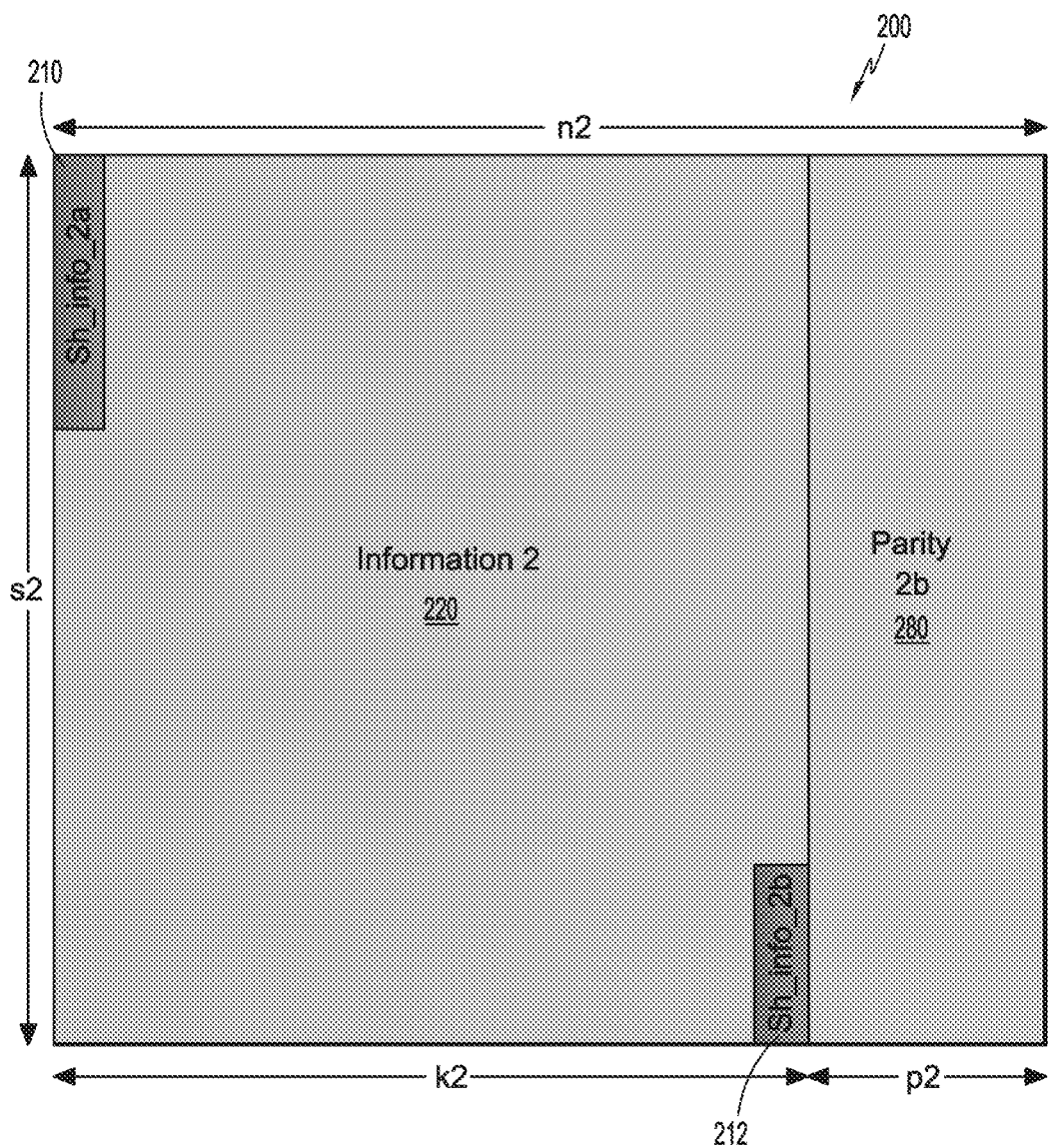
FIG. 2 is a conceptual diagram showing an SHPC J2 plane structure for an inverse interleaver in accordance with an embodiment of the present disclosure.

Turning to FIG. 2, the J2 plane of the inverse interleaver is indicated generally by the reference numeral 200, and has an inverse plane structure relative to J1. The J2 plane 200 includes a short information block (Short Information 2a) 210, another short information block (Short Information 2b) 212, a second information block (Information 2) 220, and another parity block (Parity 2b) 280.

In both the J1 and J2 planes, each row is a constituent codeword of a shortened Hamming code. Parity 1 and Parity 2 (including Parity 2a and Parity 2b) are the parity bits systematically added in each row to the information bits for J1 and J2, respectively. Parity 2a bits in J1 have an inverse mapping to Parity 2b bits in J2. The balance block 150 of J1 includes extra bits or balanced bits that may be used where the checks-on-checks bits are no longer fulfilled due the general interleaver, for example.

Therefore, the extra bits, or balanced bits, may be used to assure that all rows in J1 and J2 are Hamming codewords. A procedure explaining how these bits are set may be explained in greater detail below with respect to an encoder embodiment. Cyclic redundancy check (CRC) bits are added for a CRC verification, as may also be explained in greater detail below with respect to an encoder embodiment. The short information blocks in J1 and J2 include shortening bits.

This SHPC code structure may include parameters as set forth below.

Parameters in J1:
s1: Number of sub-codewords in J1.
t1: Number of sub-codewords in the Information part.
k1: Number of information bits in sub-codewords at J1.
p1: Number of parity bits in sub-codewords at J1.
n1: Sub-codewords length at J1, that is n1=k1+p1.
s1−t1: Number of parity rows in J1. This is the parity bits of J2 mapped into J1.

Parameters in J2:
s2: Number of sub-codewords in J2.
k2: Number of information bits in sub-codewords at J2.
p2: Number of parity bits in sub-codewords at J2.
n2: Sub-codewords length at J2, that is n2=k2+p2.

General parameters:
I0: Number of pure information bits.
P0: Number of bits allocated for other purposes than info; such as parity, balancing, CRC etc.
N0: Total number of stored bits, that is N0=I0+P0.
$sh_{total}$: Number of non-transmitted bits that are considered part of the SHPC codeword.
N: Total number of bits, that is N=N0+shtotal.
R: Code rate, that is R=I0/N0.
OH: Code overhead, that is OH=P0/I0.

An SHPC embodiment may support any generalized random interleaver. From an implementation perspective, an interleaver with a simple structure may be preferred, such as one retaining a pseudo-random nature as may be desirable for code performance. The general interleaver maps the bits from J1 to J2, and vice-versa.

Figure 3:
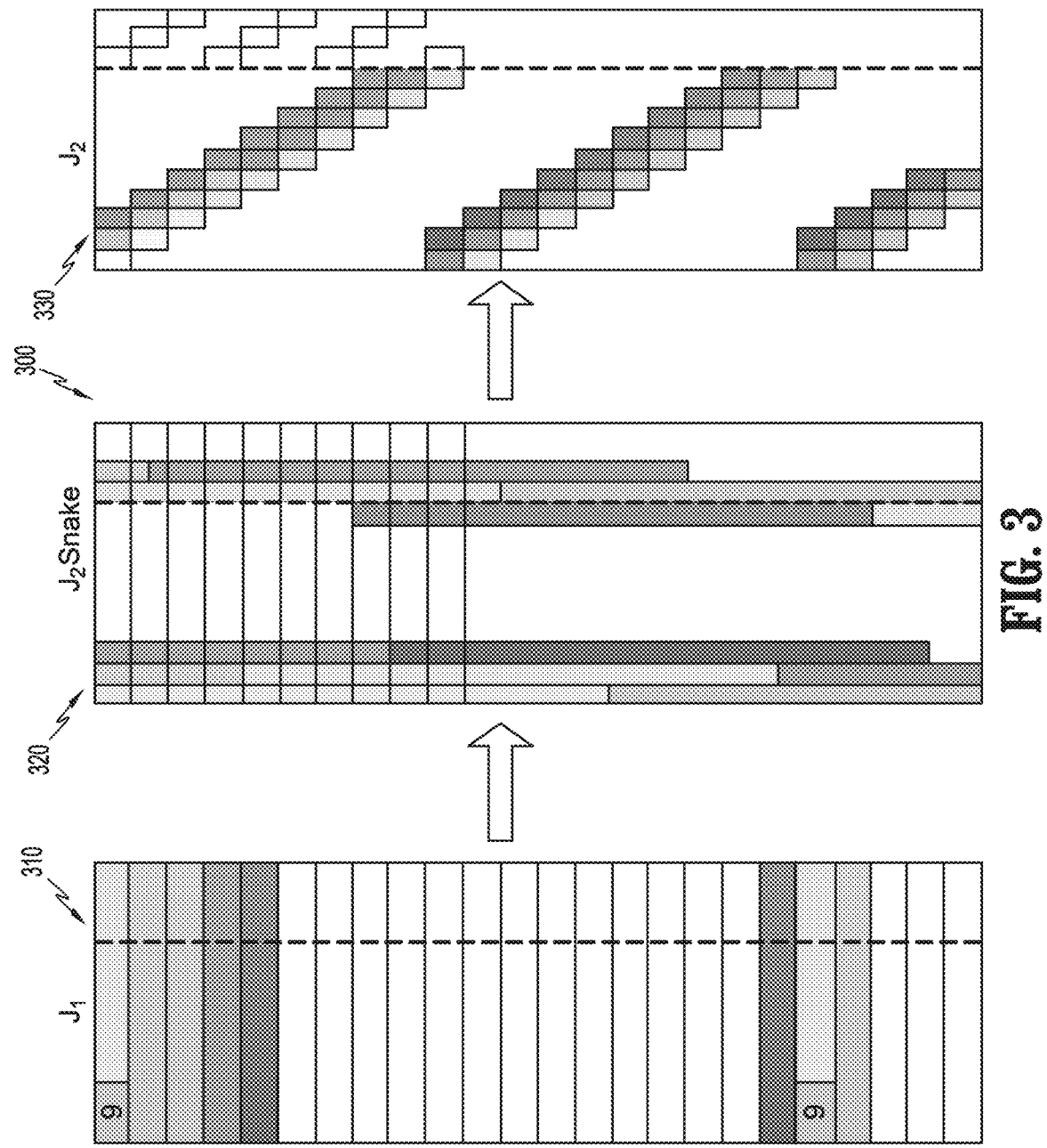
FIG. 3 is a hybrid diagram showing SHPC plane structures for a diagonal interleaver in accordance with an embodiment of the present disclosure.

Turning now to FIG. 3, a diagonal interleaver is indicated generally by the reference numeral 300. In J1, denoted 310, the diagonal interleaver is split into two parts for the upper block in J1 or "information block" and for the lower block in J1 or "parity block".

The information block is interleaved as follows: A) Each row in J1 is arranged in a column or columns of J2_snake, denoted 320, with the other rows concatenated into the J2_snake. B) Each sub-block of 32 bits in this column is pseudo-interleaved.

The columns are mapped to an information part of J2, denoted 330, with s2 rows and n2−p2 columns, with reference from the main diagonal to the next sub-diagonal as shown in FIG. 3.

The parity block is interleaved as follows: A) Each row in J1 is arranged in a column in the J2 snake. B) Each sub-block of 32 bits in this column is pseudo-interleaved. C) The columns are mapped to a parity part of J2 with s2 rows and p2 columns, with reference from the main diagonal to the next sub-diagonal as shown in FIG. 3.

Figure 4:
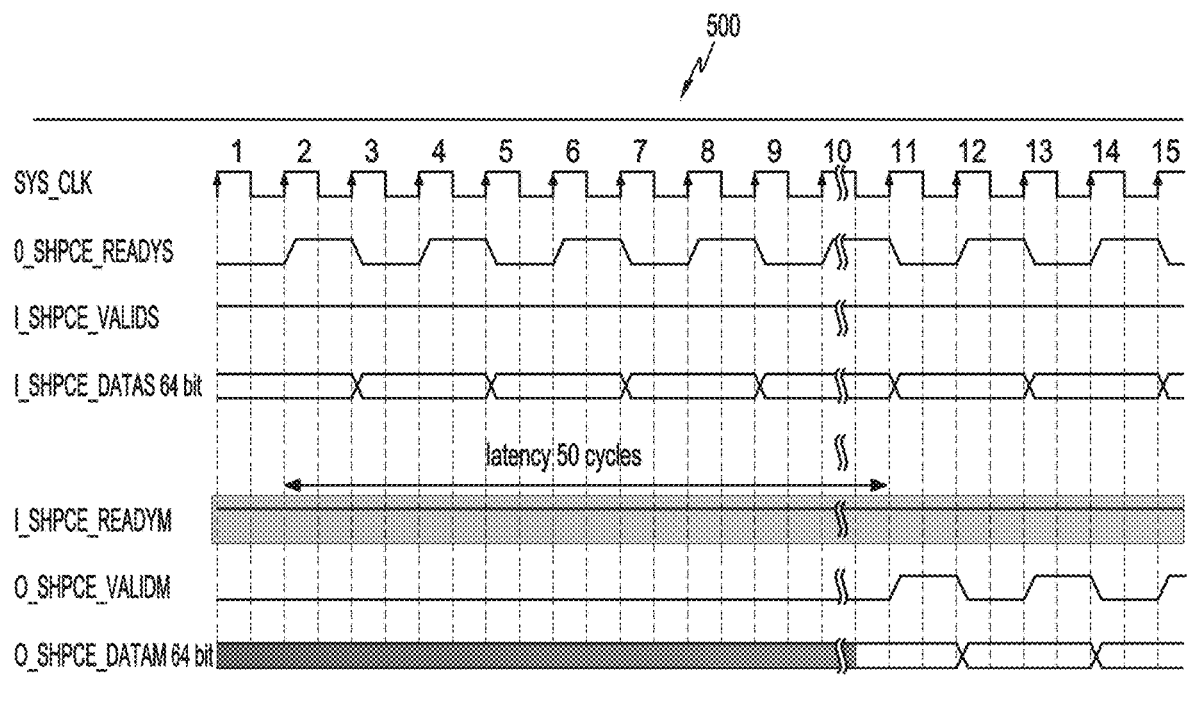
FIG. 4 is a graphical diagram showing an interface protocol for an SHPC encoder with a second output buffer in accordance with an embodiment of the present disclosure.

Turning to FIG. 4, an interface protocol for the SHPC encoder is indicated generally by the reference numeral 500. Interface signals for the SHPC encoder may carry information bits as input from a host to generate codewords for four different rates.

In response to an SHPC encoder core system clock SYS_CLK, an SHPC encoder output data ready signal O_SHPCE_READYS transitions to high on each rising edge of an even clock cycle and transitions to low on each rising edge of an odd clock cycle. An SHPC encoder input data valid signal I_SHPCE_VALIDS remains high. A 64-bit SHPC encoder input data signal I_SHPCE_DATAS transitions on each O_SHPCE_READYS low signal.

During a 50-cycle read latency period, for example, an SHPC encoder input data ready signal I_SHPCE_DATAM from the NAND remains high, an SHPC encoder output data valid signal O_SHPCE_VALIDM remains low, and a 64-bit SHPC encoder output data signal is indeterminate. But after the 50-cycle read latency period, while the SHPC encoder input data ready signal I_SHPCE_DATAM from the NAND remains high, the SHPC encoder output data valid signal O_SHPCE_VALIDM transitions high from the rising edge of each odd clock cycle to the rising edge of each even clock cycle, and the 64-bit SHPC encoder output data signal transitions on the rising edge of each even clock cycle.

Figure 5:
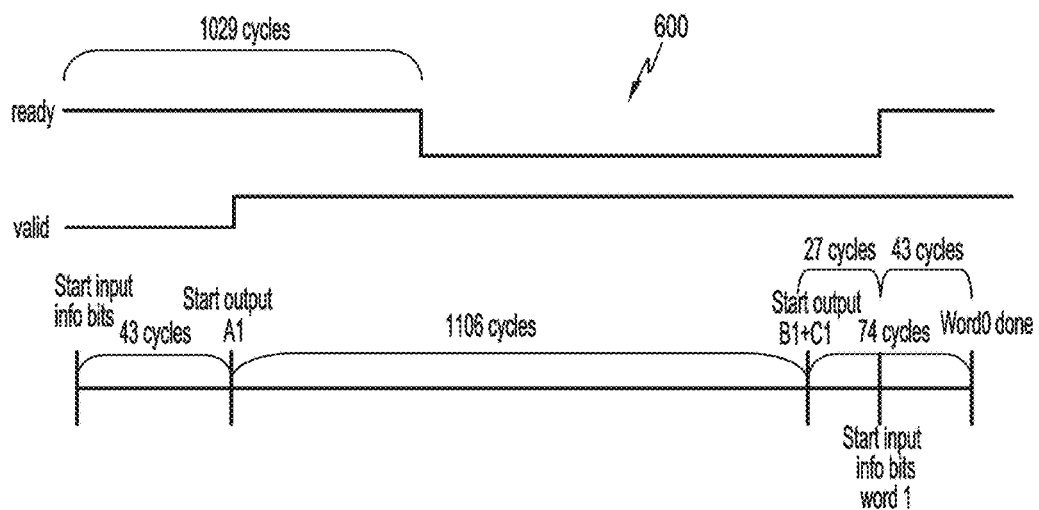
FIG. 5 is a graphical diagram showing general timing of an SHPC encoder with a main multiplexer in accordance with an embodiment of the present disclosure.

Turning now to FIG. 5, a timing diagram for the SHPC Encoder is indicated generally by the reference numeral 600. At the start of input information bits for word 0, a ready signal is high and a valid signal is low. After 43 cycles, for example, the start of output A1 begins. After 1029 cycles from the start of input information bits, the ready signal goes low. After 1106 cycles from the start of output A1, the start of output B1+C1 begins. After 27 cycles from the start of output B1+C1, the ready signal goes high and the start of input information bits for word 1 begins. 74 cycles from the start of output B1+C1, and 43 cycles form the start of input information bits for word 1, word 0 is done.

Figure 6:
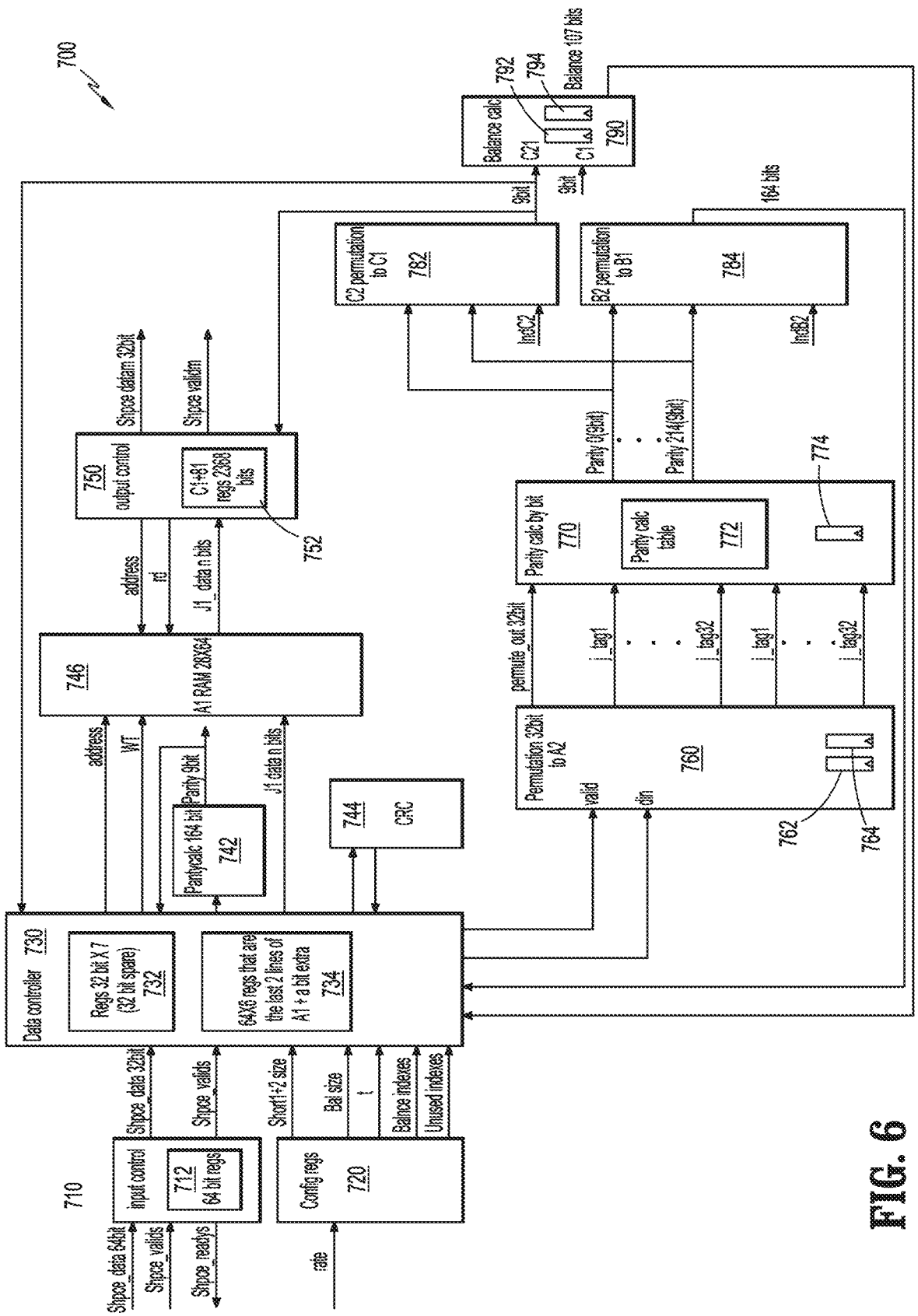
FIG. 6 is a block diagram showing an SHPC encoder with timing discrepancy calculation for a first version output buffer in accordance with an embodiment of the present disclosure.

As shown in FIG. 6, a block diagram for the SHPC encoder is indicated generally by the reference numeral 700. An input control unit 710 includes 64-bit registers 712, which may receive 64 bits of information from the host every two cycles. This is because it sets ready to be '1' every two cycles. The input control unit 710 is connected to external input lines carrying the 64-bit SHPCE_DATA signal and the SHPCE_VALIDS signal, and an external output line carrying the SHPCE_READYS signal. Configuration registers 720 are connected to an external input line carrying the RATE signal.

A data controller 730 includes 32-bit registers 732, such as seven active 32-bit registers plus one spare 32-bit register, and 64-bit registers 734 that may hold the last two lines of A1 plus an extra bit, for example. The data controller 732 is connected to input signal lines from the input control 712 carrying 32-bit SHPCE_DATA and SHPC_VALIDS signals. The data controller 732 is further connected to input signal lines from the configuration registers 720 carrying signals for SHORT1+2SIZE, BAL_SIZE, T, BALANCE_INDICES, and UNUSED_INDICES.

The SHPC encoder 700 further includes a 64-bit parity 1 calculator 742, a CRC 744, and a 28 by 64-bit A1 random-access memory (RAM) 746, each connected to the data controller 730. The A1 RAM 746 is connected to an output controller 750 that includes registers 752.

The data controller 730 is further connected to a 32-bit permutation circuit 760 to permute A1 to A2, including buffers 762 and 764. The permutation circuit 760 is connected to a bit-by-bit parity calculator 770 including a parity calculation table 772 and a buffer 774.

The parity calculator 770 is connected to a permutation circuit 782 to permute C2 to C1. The parity calculator 770 is further connected to a permutation circuit 784 to permute B2 to B1, which, in turn, is connected back to the data controller 730.

The permutation circuit 782 is connected to each of the data controller 730, the output controller 750, and to a balance calculator 790. The balance calculator 790 includes buffers 792 and 794, and is connected back to the data controller 730.

In operation, the SHPC encoder 700 receives data inputs from a host, 64 bits every two cycles. Input control 712 samples it and outputs 32 bits each cycle to the data controller 730. Each A1 line is sampled, saved inside the A1 RAM buffer 734 and input into a 164-bit parity calculator 742. In parallel, every 32 bits of A1 inputs are chunked by permutation at 760 to get those bits into A2.

The number of bits is a parameter of the code construction and may have alternate values. For example, an alternate embodiment may have a 176-bit parity calculator, without limitation thereto.

Next, the encoder 700 calculates J2 parity, including B2 and C2. Parity is calculated inside a block parity calculator 770 bit-by-bit. Every cycle, this block calculates the 32-bit contribution to parity and adds it to the parity calculated so far. The calculated parity is stored inside registers that update every time there is a new contribution. After about 1100 cycles, which depends on the rate, the parity is ready.

The next step is calculating balance bits at 790. In order to do that C1 may be obtained in two different ways: 1) C2 to C1 permutation at 782. 2) B2 to 131 permutation at 784, and then calculate parity which is C1. The C2 to C1 permutation and B2 to B1 permutation are done inside designated blocks 782 and 784, respectively. The B1 parity calculator is done in the parity calculator 176-bit block. The balance calculator block gets the C1 line calculated in both ways, each cycle. It outputs 143 balance bits, some of which may be unused, depending on the rate.

After getting the balance bits values, their impact on J1 is calculated at 730. This may include: 1) Updating A1 lines that have balance bits inside and writing them to RAM. 2) Calculating parity to those lines and writing to RAM. 3) Performing A1 to A2 permutation in order to re-calculate parity: C2,B2. The permutation and parity may be done only on the balance bits: a) When balance bits are ready, take two lines of zeros except for the balance bits to calculate the contribution to parity. b) Don't take the whole two lines since there is no use passing zeros. In a worst-case scenario, there may be 143 bits of balance at two lines. So, two parities: 143+18=161; 161/32=5.03. Thus, worst case, 6 cycles of 32 bits: balance bits and parity. 4) Performing a B2,C2 to B1,C1 permutation. After permutation, B1,C1 data will be written to the registers inside output control 750.

Figure 7:
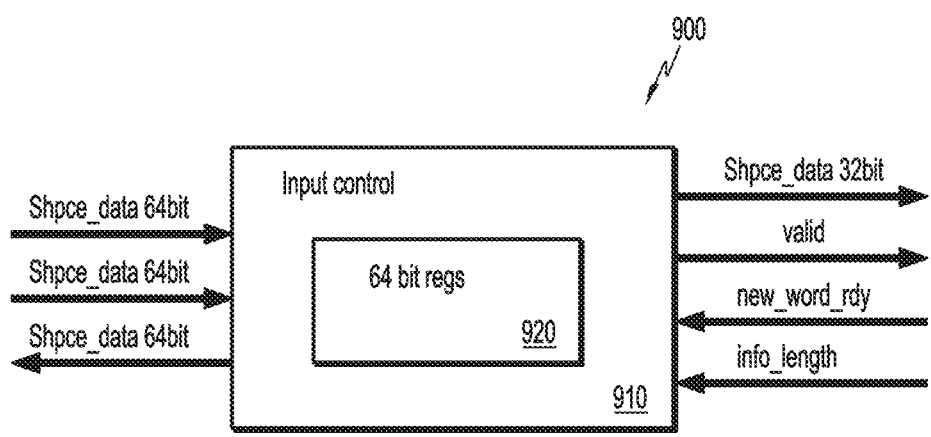
FIG. 7 is a block diagram showing the SHPC block of FIG. 4 with a non-inversionless implementation of a Berlekamp-Massey (BM) algorithm decoder for Bose-Chaudhuri-Hocquenghem (BCH) types of ECC in accordance with an embodiment of the present disclosure.

Turning now to FIG. 7, an SHPC encoder 900 includes an input control unit 910 having 64-bit registers 920. Here, each 64 bits are sampled and output towards the data controller 730 in chunks of 32 bits every cycle. A RAM buffer may be provided for keeping the A1 data. Since the start of outputting the data may begin before all of the information inputs are received, the RAM need not necessarily be at the full size of all A1. Where the RAM is to be read 50 cycles after information starts arriving, the RAM size may be 28×64. Shortening bits need not be written to the RAM.

Figure 8:
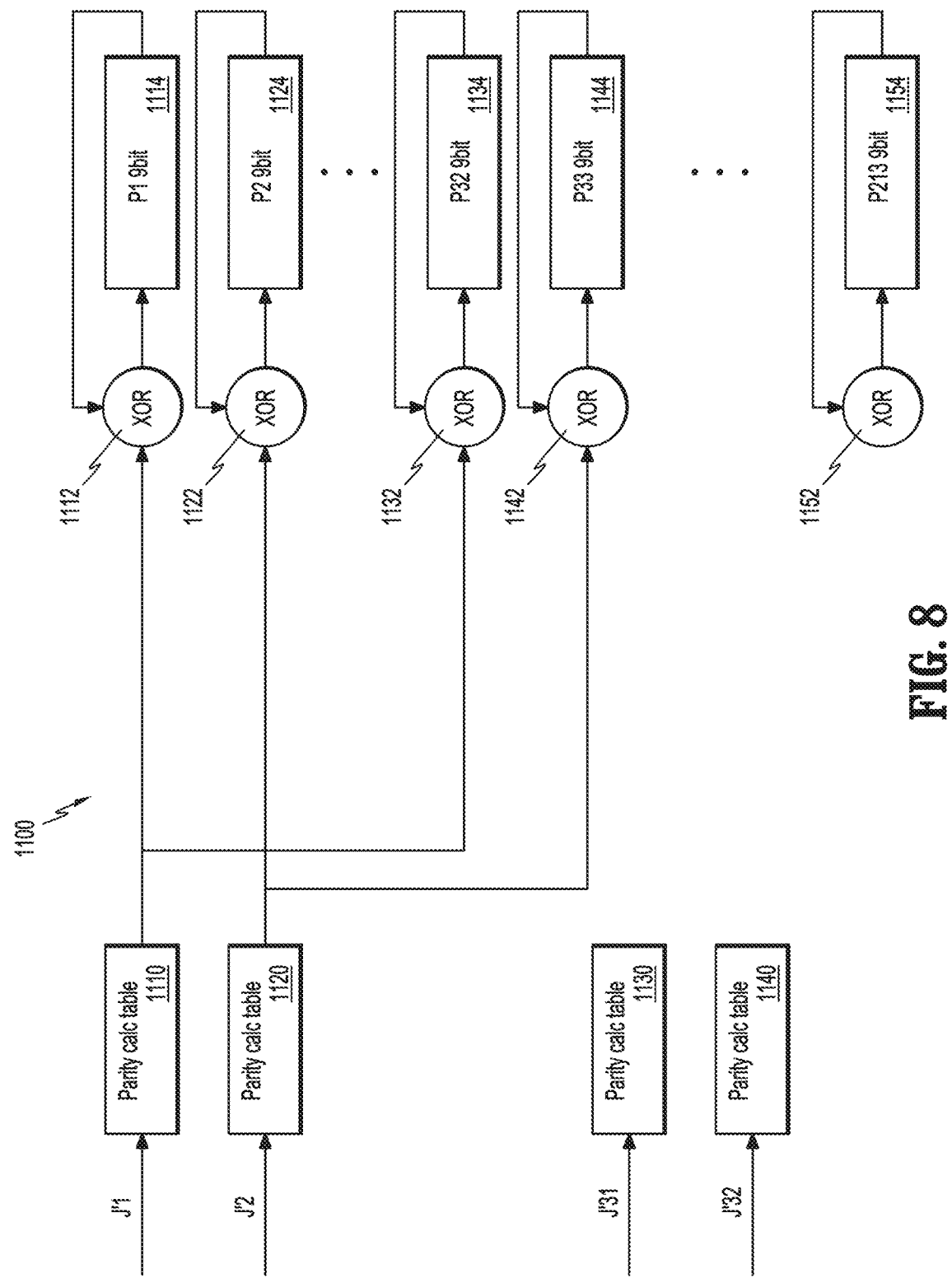
FIG. 8 is a block diagram showing an SHPC block in accordance with an embodiment of the present disclosure.

Turning to FIG. 8, a parity calculator 1100 may include a first parity calculation table 1110 connected to a first exclusive-or (XOR) unit 112, which is coupled to a first 9-bit parity register 1114; a second parity calculation table 1120 connected to a second XOR unit 1122, which is coupled to a second 9-bit parity register 1124; a third parity calculation table 1130 connected to a third XOR unit 1132, which is coupled to a third 9-bit parity register 1124; a fourth parity calculation table 1140 connected to a fourth XOR unit 1142, which is coupled to a fourth 9-bit parity register 1144; and a fifth parity calculation table 1150 connected to a fifth XOR unit 1152, which is coupled to a fifth 9-bit parity register 1154. Although a small number of parity calculation tables and related components are described for ease of explanation, embodiments are not limited thereto. Duplicate description may be omitted. The C1 bits may be arranged in order. The balance value should stay valid until the next new word indication starts a new word, and may erase the counter and previous data. If num_of_c1_lines is smaller than 16, all unused bits should be '0'.

Figure 9:
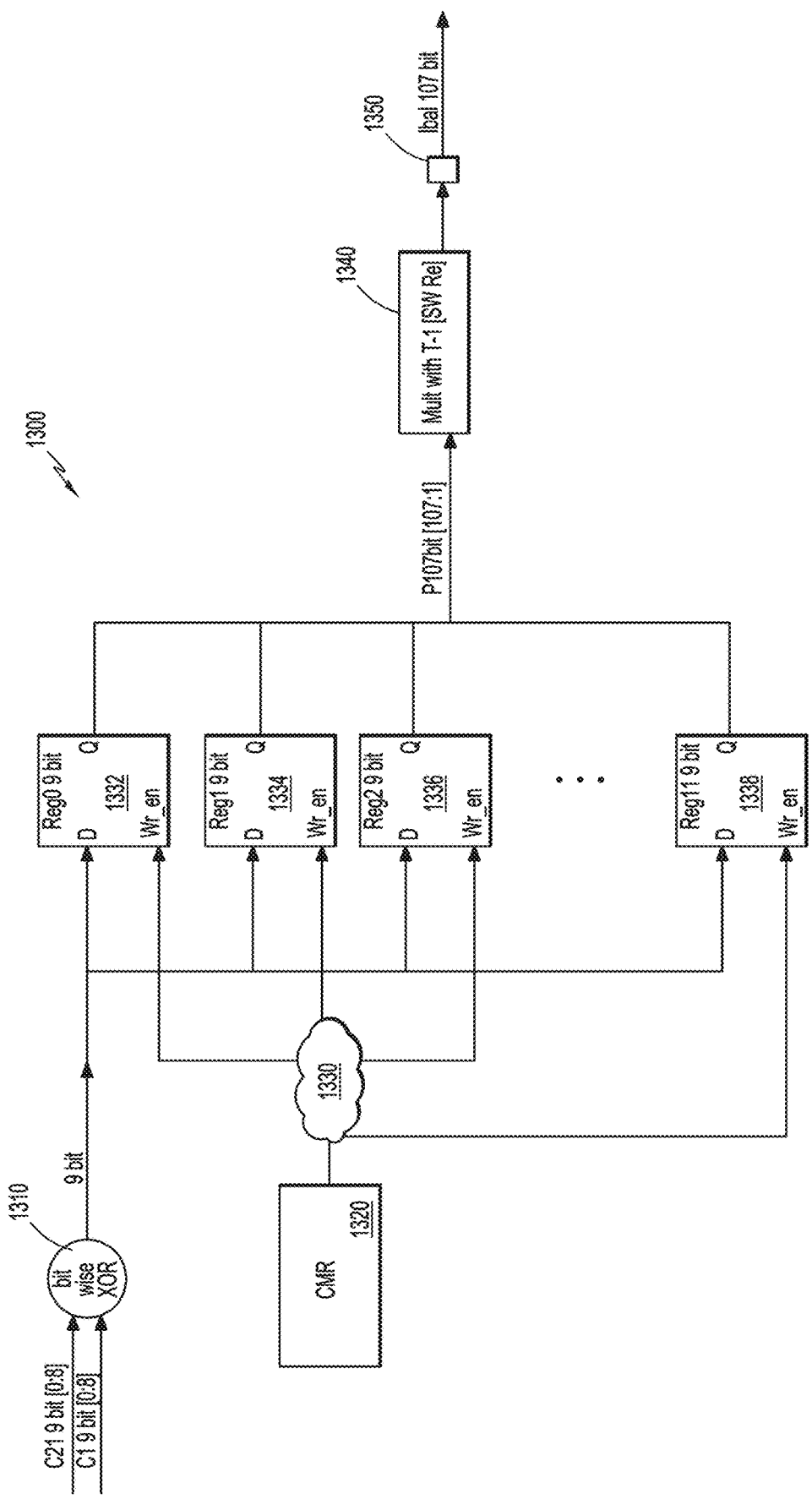
FIG. 9 is a block diagram showing an SHPC block during execution in accordance with an embodiment of the present disclosure.

Turning to FIG. 9, a parity calculator 1300 may include a bit-wise XOR 1310 connected to the D inputs of a zeroth 9-bit flip-flop 1332, a first 9-bit flip-flop 1334, a second 9-bit flip-flop 1336, up to an $11^{th}$ 9-bit flip-flop 1338 for a total of 12 flip-flops. The write-enable inputs of each of the 12 flip-flops may be connected to a controller 1320 through a network interface 1330. The Q outputs of the 12 flip-flops may be connected to a multiplier 1340 configured to receive the 107 bits from the flip-flops, and output to a storage buffer 1350. A B2 to B1 permutation block receives 214 chunks of 9 parity bits each, and outputs them by their order in J1, line after line. In case of rates that have a J1 line smaller than 164 bits, all redundant least significant bits (lsb) will be '0'.

The number of bits and chunks are parameters of the code construction and may have alternate values. For example, in an alternate embodiment, the B1 permutation block may receive 255 chunks of 9 parity bits each. In this alternate embodiment, in case of rates that have a J1 line smaller than 176 bits, all redundant least significant bits (lsb) may be '0'.

Figure 10:
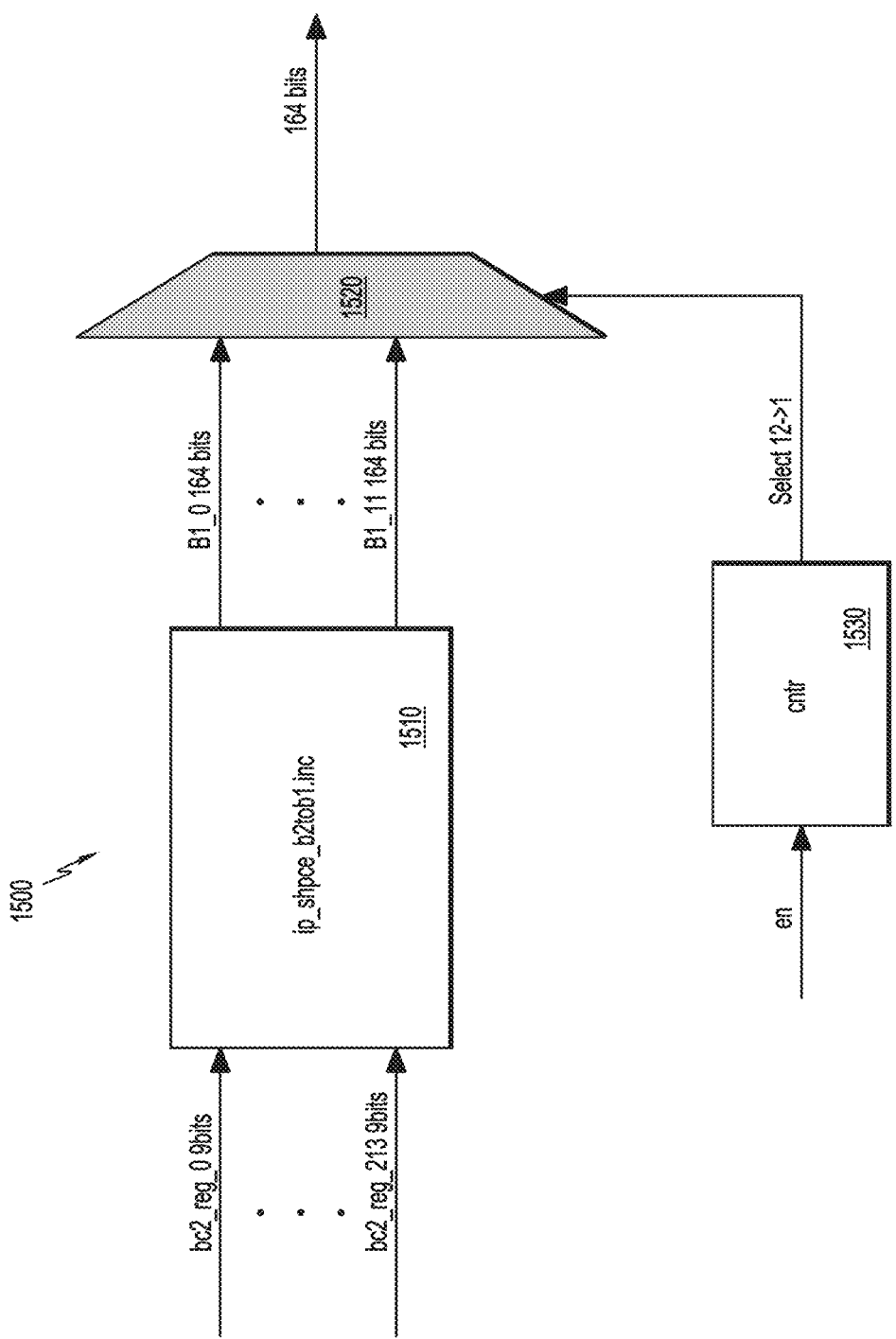
FIG. 10 is a block diagram showing an SHPC block with decoder average current in 1 us in accordance with an embodiment of the present disclosure.

As shown in FIG. 10, the B2 to B1 permutation block 1500 includes an interface 1510 connected to a multiplexer 1520 responsive to a row selection input from a controller 1530. The multiplexed output is 164 bits for each of 12 lines of B1. A C2 to C1 permutation block receives 214 chunks of 9 parity bits, and outputs them by their order in J1, line after line. In case of rates that have a J1 line smaller than 164 bits, all redundant least significant bits (lsb) will be '0'.

Figure 11:
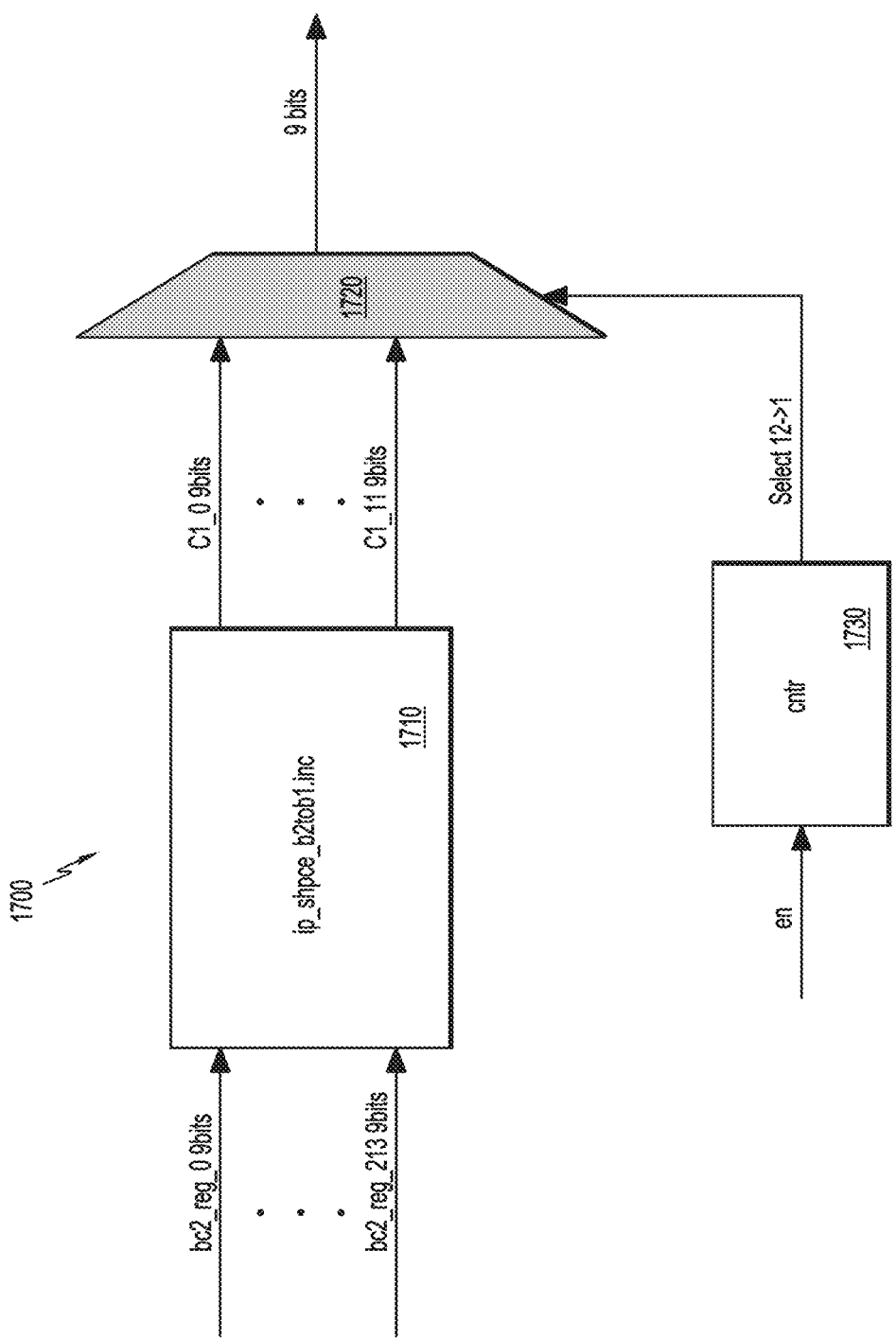
FIG. 11 is a block diagram showing an SHPC block in accordance with an embodiment of the present disclosure.

As shown in FIG. 11, the C2 to C1 permutation block 1700 includes an interface 1710 connected to a multiplexer 1720 responsive to a selection input from a controller 1730. The multiplexed output is 9 bits for each of 12 lines of C1. This permutation block receives 255 chunks of 9 parity bits each, and outputs them according to their order in J1, line after line.

Figure 12:
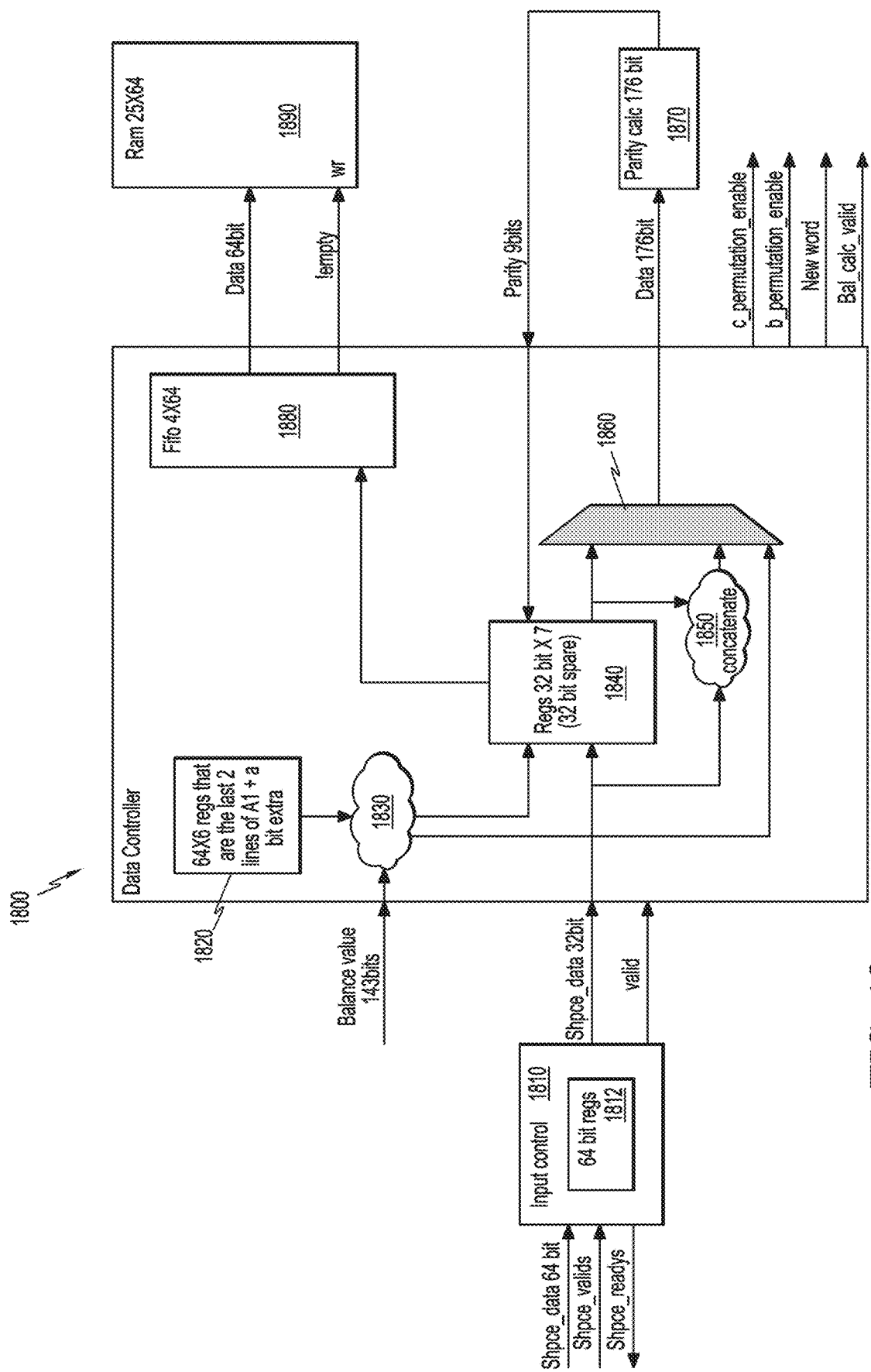
FIG. 12 is a block diagram showing an SHPC block for data control in accordance with an embodiment of the present disclosure.

Turning now to FIG. 12, an encoder is indicated generally by the reference numeral 1800. The encoder includes an input control circuit 1810, a data controller 1814 connected to the input control circuit, a parity calculator 1870 connected to the data controller, and a RAM 1890 connected to the data controller. The input control circuit 1810 includes 64-bit registers 1812. The data controller 1814 includes 64-bit registers 1820 connected to a network 1830, which, in turn, is connected to 32-bit registers 1840 and a multiplexer 1860. A concatenation network 1850 is connected to the input control 1810 and 32-bit registers 1840 as inputs, and the multiplexer 1860 as an output, which, in turn, is connected to the parity calculator 1870. A first-in first-out (FIFO) buffer 1880 is connected between the 32-bit registers 1840 and the RAM 1890.

When the last 32 or fewer bits that are needed to complete a line length arrives, which line length may be 176 bits or less depending on the rate, they are concatenated with the other information bits present in the registers, and sent to a 176-bit parity calculator. In order to complete the whole line, including the parity bits, in one cycle, the last 32 bits go in parallel to be sampled in the registers and to the parity calculator.

The last two lines of A1 need not be written to the RAM when the balance is '0'. Instead, they may be written to registers inside the data controller. These registers are six 64-bit registers. This way, when balance bits are ready, parity can be calculated and those last two lines of A1 can be written to RAM without the need to read from RAM.

For example, a 176-bit parity calculator may include 164 bits of J1 line data, one bit of line data validity, nine bits of J1 line parity, and one bit of line parity validity. Since there are no flip-flops inside the block, then a valid input yields a valid output. For integration of rates that have lines smaller than 176 bits, zeros may be added at the left side input. An SHPC encoder embodiment may be implemented within a reasonably small wafer area and/or gate count. Embodiments are not limited thereto.

Figure 13:
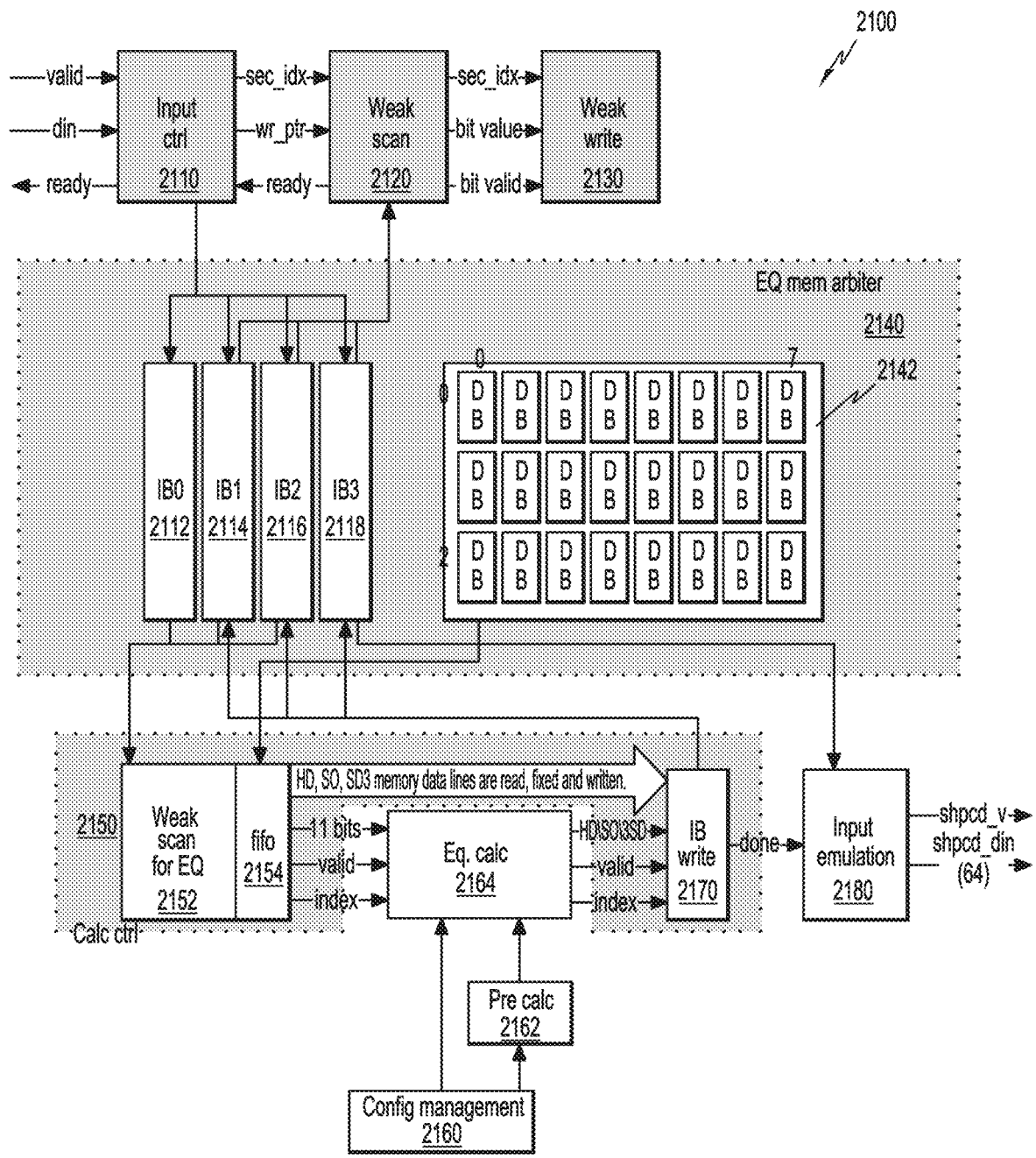
FIG. 13 is a block diagram showing top blocks of a machine-learning (ML) equalizer in accordance with an embodiment of the present disclosure.

Turning now to FIG. 13, a Machine-Learning (ML) Equalizer (EQ) has top blocks indicated generally by the reference numeral 2100. The ML EQ top blocks include an input control unit 2110; a weak scan unit 2120 connected to the input control unit; a weak write unit 2130 connected to the weak scan unit; an EQ memory arbiter unit 2140 connected to each of the input control unit, weak write unit, and weak scan unit; a calculation control unit 2150 connected to the EQ memory arbiter; an input emulation unit connected to the EQ memory arbiter unit and the calculation control unit; an EQ calculator unit 2164 connected to the calculation control unit; a configuration management unit 2160 connected to the EQ calculator unit; and a pre-calculation unit 2162 connected between the configuration management unit and the EQ calculator unit.

The EQ memory arbiter unit 2140 includes a zeroth input buffer (IB0) 2112; a first input buffer (IB1) 2114; a second input buffer (IB2) 2116; a third input buffer (IB3) 2118; and a memory data bank (Mem_DB) 2142. The calculation control unit 2150 includes a weak scan EQ unit 2152, a FIFO buffer 2154, and an input buffer (IB) write unit 2170.

Figure 14:
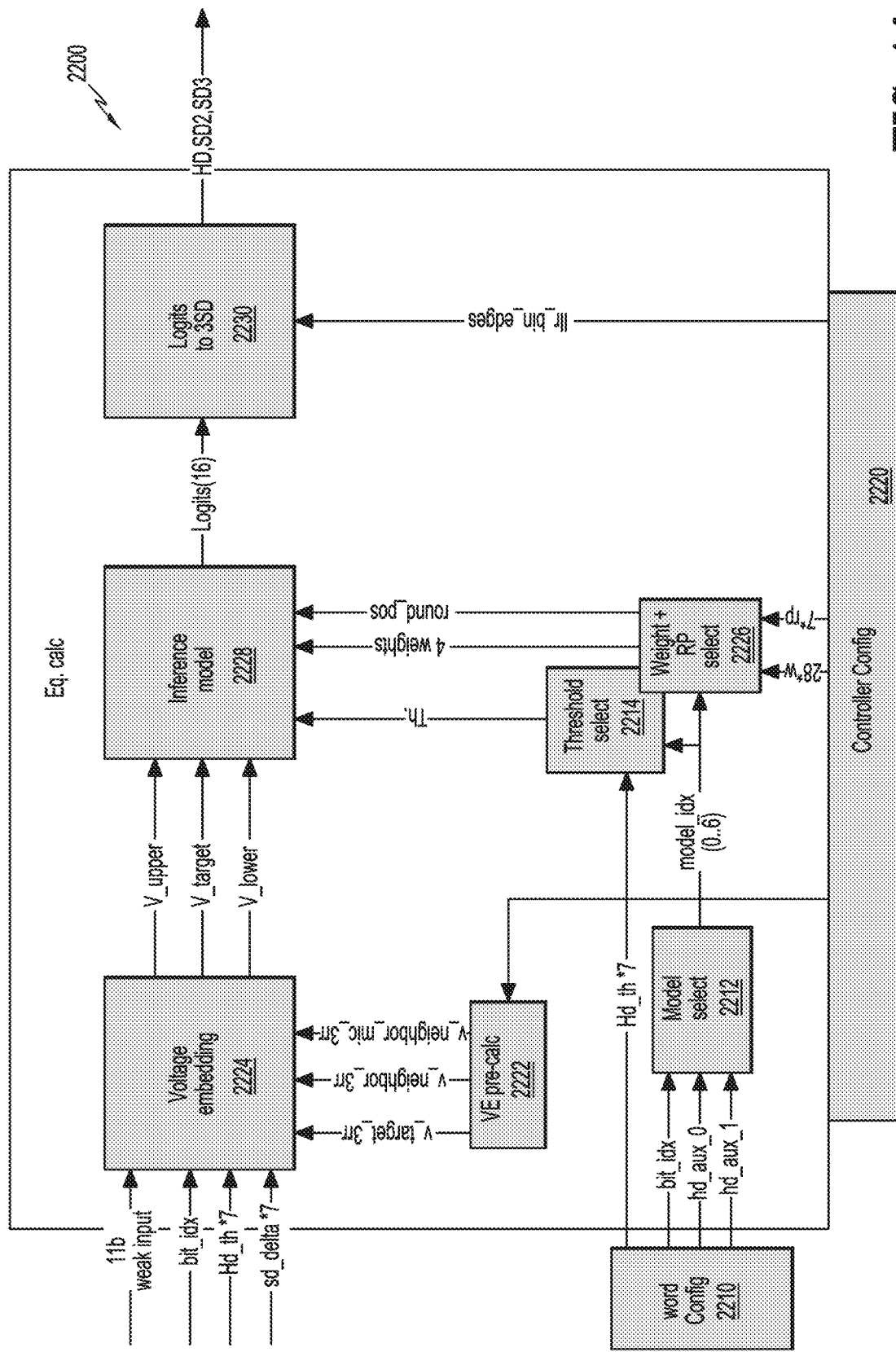
FIG. 14 is a block diagram showing calculation blocks of an ML equalizer in accordance with an embodiment of the present disclosure.

As shown in FIG. 14, an ML EQ has equalizer calculation blocks indicated generally by the reference numeral 2200. The ML EQ equalizer calculation blocks include a word configuration block 2210 connected to a model select block

2212. The word configuration block and the model select block are each connected to a threshold select block 2214. A controller configuration block 2220 is connected to a voltage embedding (VE) pre-calculation block 2222, which, in turn, is connected to a VE block 2224. A weight select block 2226 is connected between the controller configuration block and an interface control model block 2228, which is also connected threshold select block, the VE block, and a logits to 3SD translation block 2230.

Figure 15:
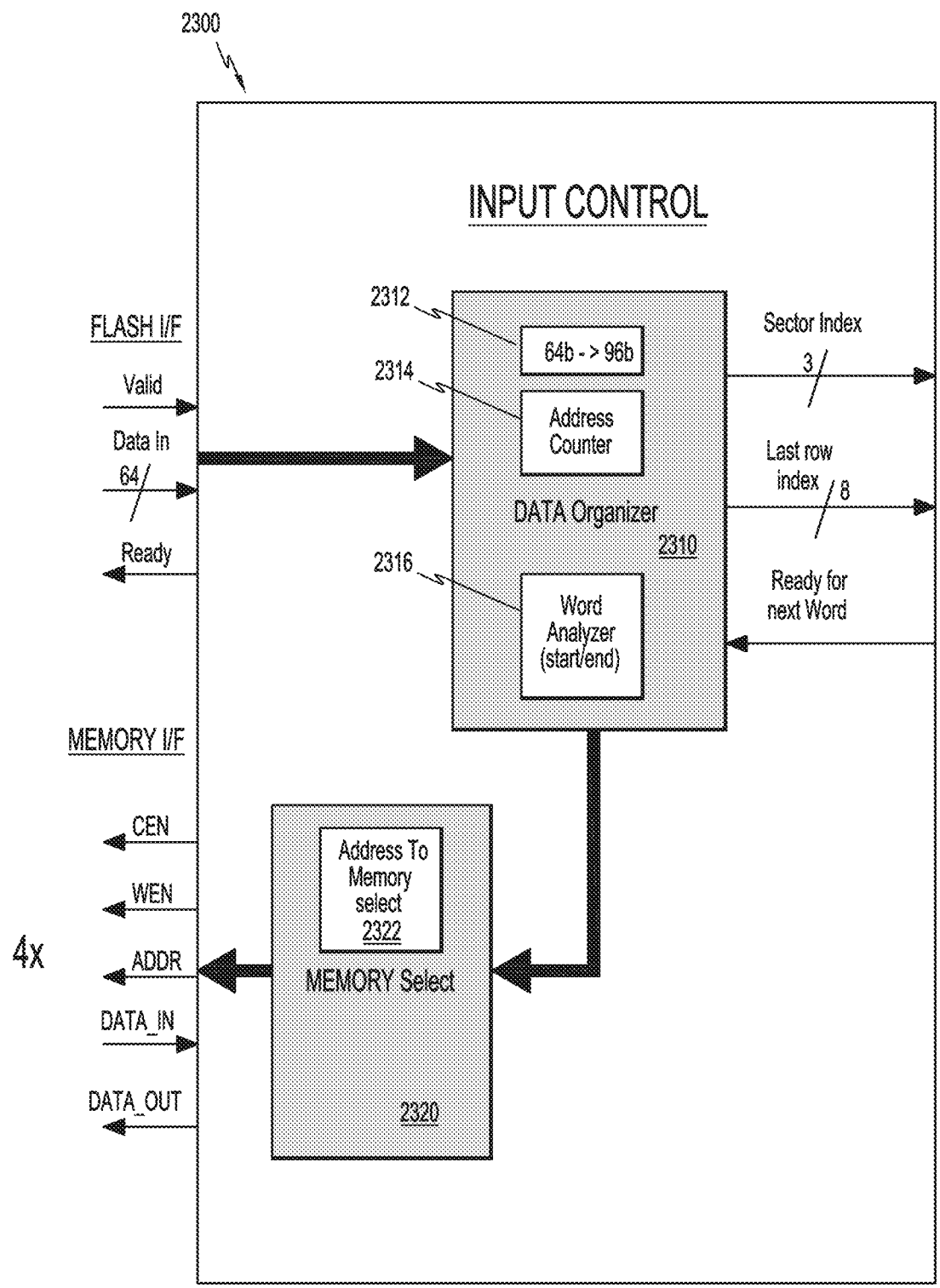
FIG. 15 is a block diagram showing an input control block of an ML equalizer in accordance with an embodiment of the present disclosure.

Turning to FIG. 15, an ML EQ has equalizer input control blocks indicated generally by the reference numeral 2300. The ML EQ equalizer input control blocks include a data organizer block 2310 connected to a memory select block 2320. The data organizer block includes a 64-bit to 96-bit converter 2312, an address counter 2314, and a word analyzer 2316. The memory select block includes an address to memory select block 2322.

In operation, the Input Control (IC) block role is to receive the HD/SD2/SD3 data from a System On a Chip (SOC), and write it to Input Buffers (IBs) 0/1/2. The IC block receives the 8 HD "neighbors" sectors and writes them to IB3. In parallel, it updates the next block (Weak Scan) with the information of the current sector and line written. Embodiments may support back pressure from a next block so as not to receive a new sector until the next block is ready.

The block has logic that handles re-organizing the input data from 64-bit to 96-bit, and is aware of what sector is currently written, the line count, and when data is complete. Embodiments may also manage writing the data to the correct IB according to the type of incoming data, such as HD, SD, or neighbor HD.

Figure 16:
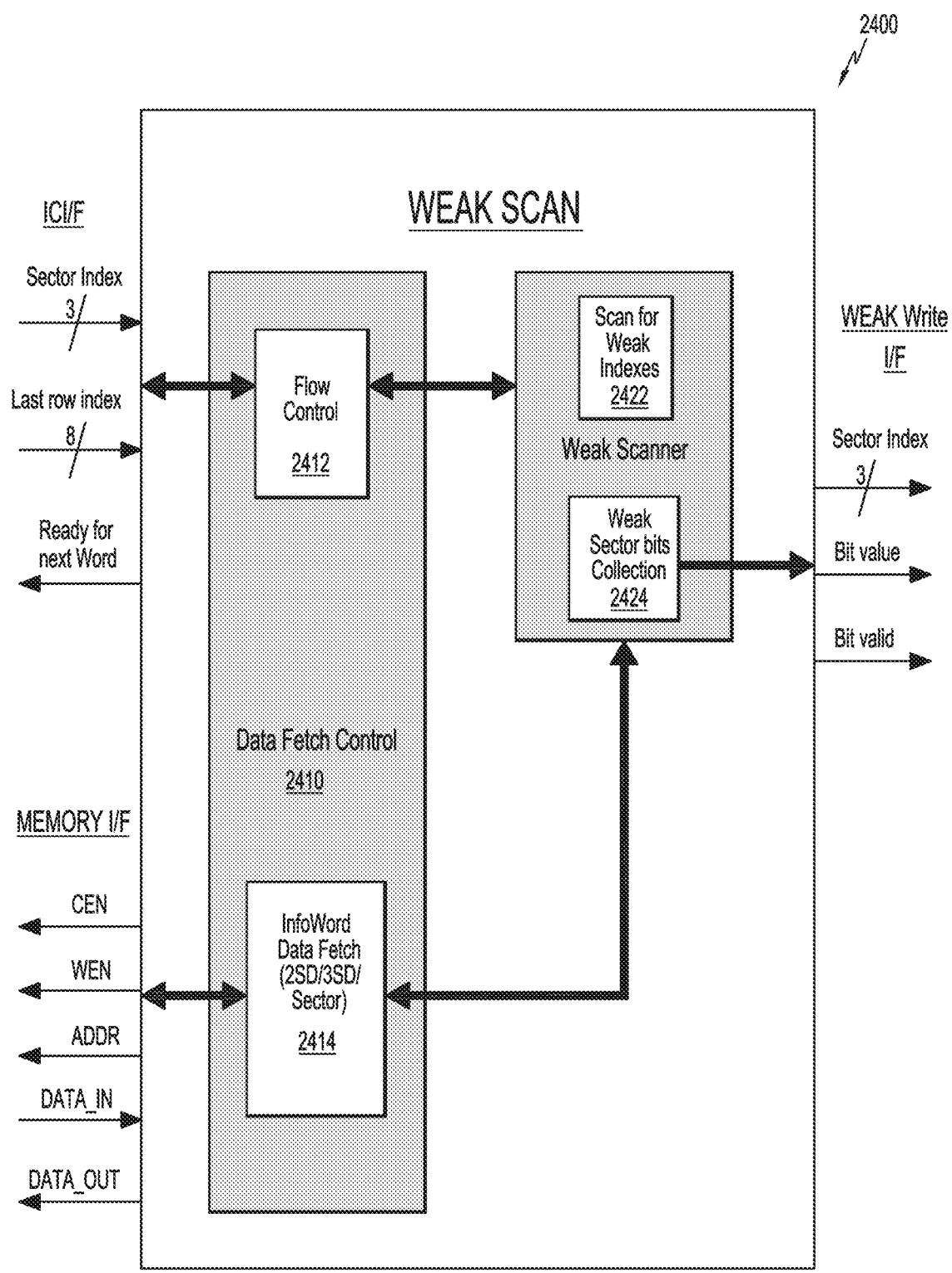
FIG. 16 is a block diagram showing weak scan blocks of an ML equalizer in accordance with an embodiment of the present disclosure.

Turning now to FIG. 16, an ML EQ has equalizer input weak scan blocks indicated generally by the reference numeral 2400. The weak scan blocks include a data fetch control block 2410 connected to a weak scanner block 2420. The data fetch control block includes a flow control block 2412 and an information word data fetch block 2414. The weak scanner block 2420 includes weak index block 2422 and a weak sector bit collection block 2424.

In operation, the weak scanner block may read the SD2 and SD3 data from a memory interface and find weak bits, such as those that are not very strong. Then it may pass to a weak write interface the relevant bit from every neighbor sector.

The flow control logic may communicate with an input control (IC) interface indicating the current sector written to IB3, and it may stop the IC from getting the next sector until it is finished scanning all of the current sector. The data fetch logic handles obtaining the relevant rows of SD2 and SD3, and the current sector row.

The weak scanner block includes logic that finds the weak bits, and for every-bit found, sends the relevant bit of same index from a neighbor HD to a weak write interface. For example, the weak scanner block may send 1-bit per cycle to the weak write interface.

Figure 17:
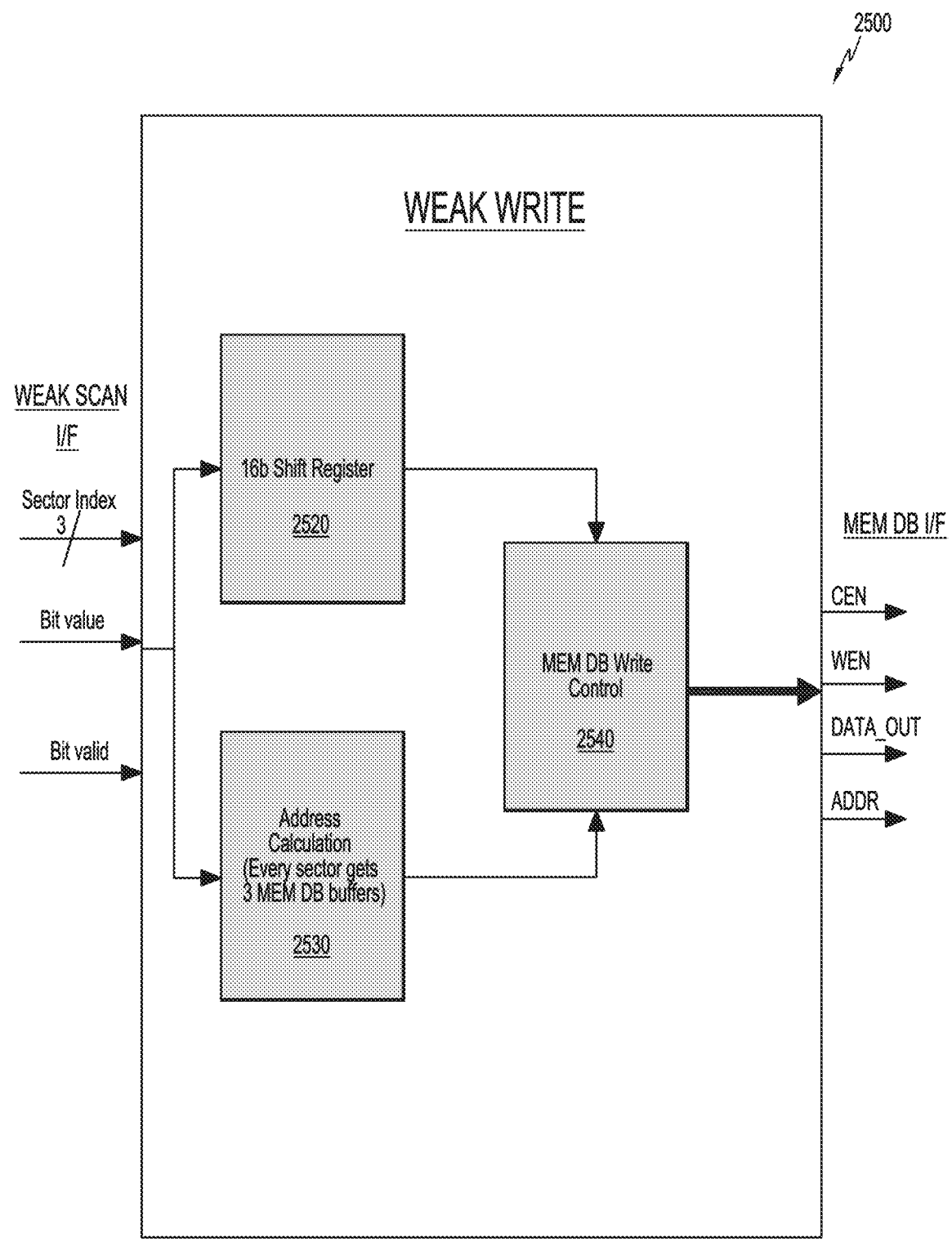
FIG. 17 is a block diagram showing weak write blocks of an ML equalizer in accordance with an embodiment of the present disclosure.

As shown in FIG. 17, an ML EQ has equalizer weak write blocks indicated generally by the reference numeral 2500. The weak write blocks include a 16-bit shift register block 2520, an address calculation block 2530, and a memory data bank write control block 2540 connected to each of the 16-bit shift register block and the address calculation block.

In operation, the weak write block may squeeze the bits received from the weak scan block to 16-bit format, and write them to the relevant memory data bank (Mem_DB) at the correct address. For example, each sector may have three allocated banks in Mem_DB, where each bank is 176*16=2816 bits, for a total of 8448 bits per sector. Weak write may stop the write of new bits if it reaches the end of allocated memory, such as 8448 bits.

Figure 18:
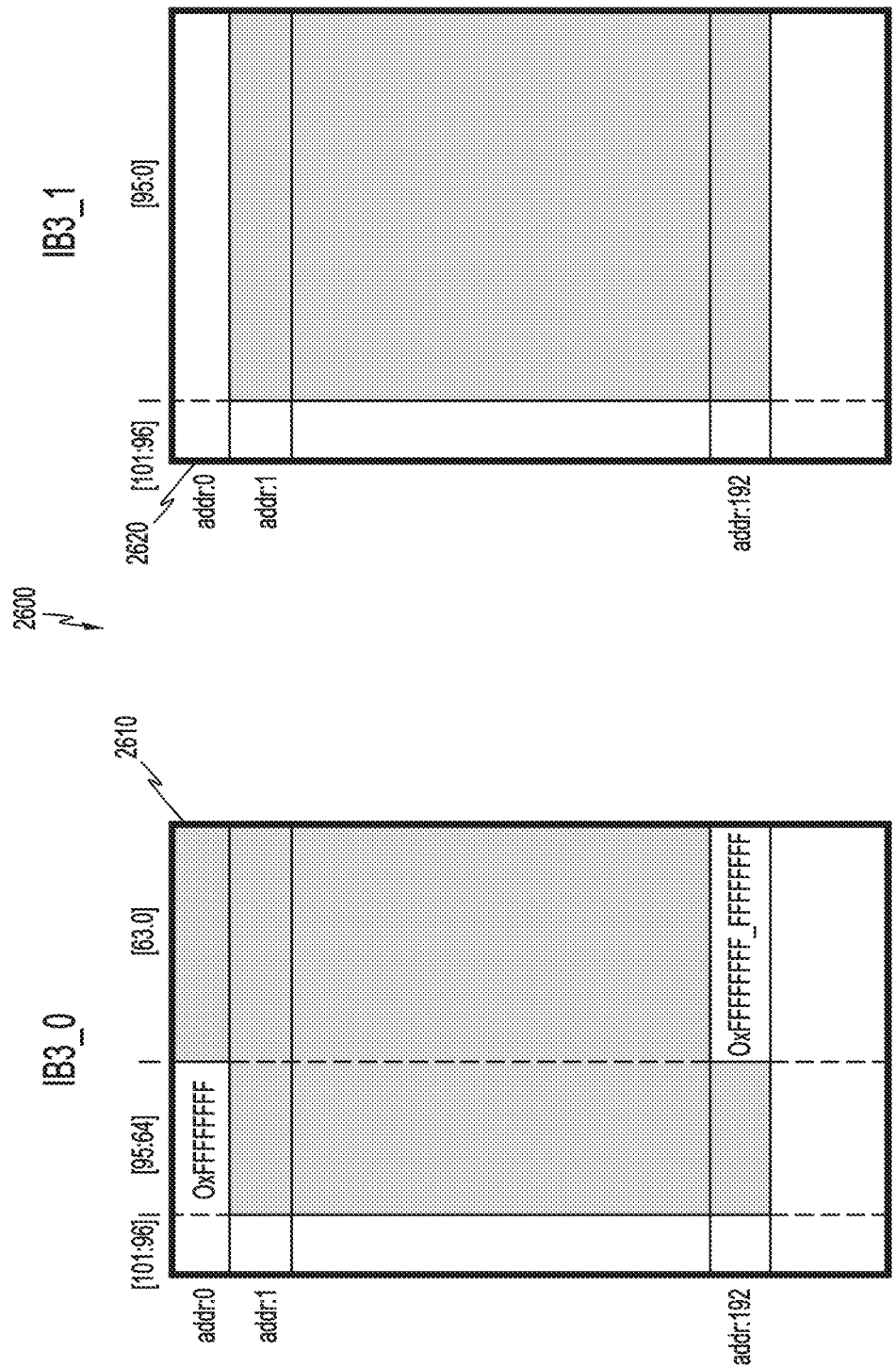
FIG. 18 is a block diagram showing input emulation blocks of an ML equalizer in accordance with an embodiment of the present disclosure.

Turning to FIG. 18, an ML EQ has input emulation blocks indicated generally by the reference numeral 2600. The input emulation blocks include first and second input buffer blocks IB3_0 and IB3_1. The input emulation blocks may enable the SHPC to calculate the error syndrome. This may be done by reading from SHPC IB3, and injecting the data continuously to the data input IF. Here, the HD data to be read are depicted in a darker shade of grey.

Upon receiving an 'emulation_start' signal data from IB3_0 and IB3_1, these will be read alternately. Since the memory IOs are being sampled, it takes three cycles to extract the desired data, where one cycle is spent inside the memory unit, and an additional cycle to store the just-arrived data inside a buffer. For example, a 64-bit by 4-line buffer may be used to facilitate a continuous flow of data to the SHPC input IF.

One embodiment may use a configurable FIFO as the buffer with 64 bits×4 lines to convert the 96 bits on the write side of the FIFO to 64 bits on the read side of the FIFO. Upon reaching 4 entries inside the buffer, a continuous read from the buffer may continue until the last address of the memory, such as at IB3_0 address 192.

Since the input to the buffer is 50% higher than the output, and due to area restrictions, embodiments may store the smallest amount of data possible. The write side to the buffer may occurs in bursts of 2 cycles, and then 1 cycle of pause.

Figure 19:
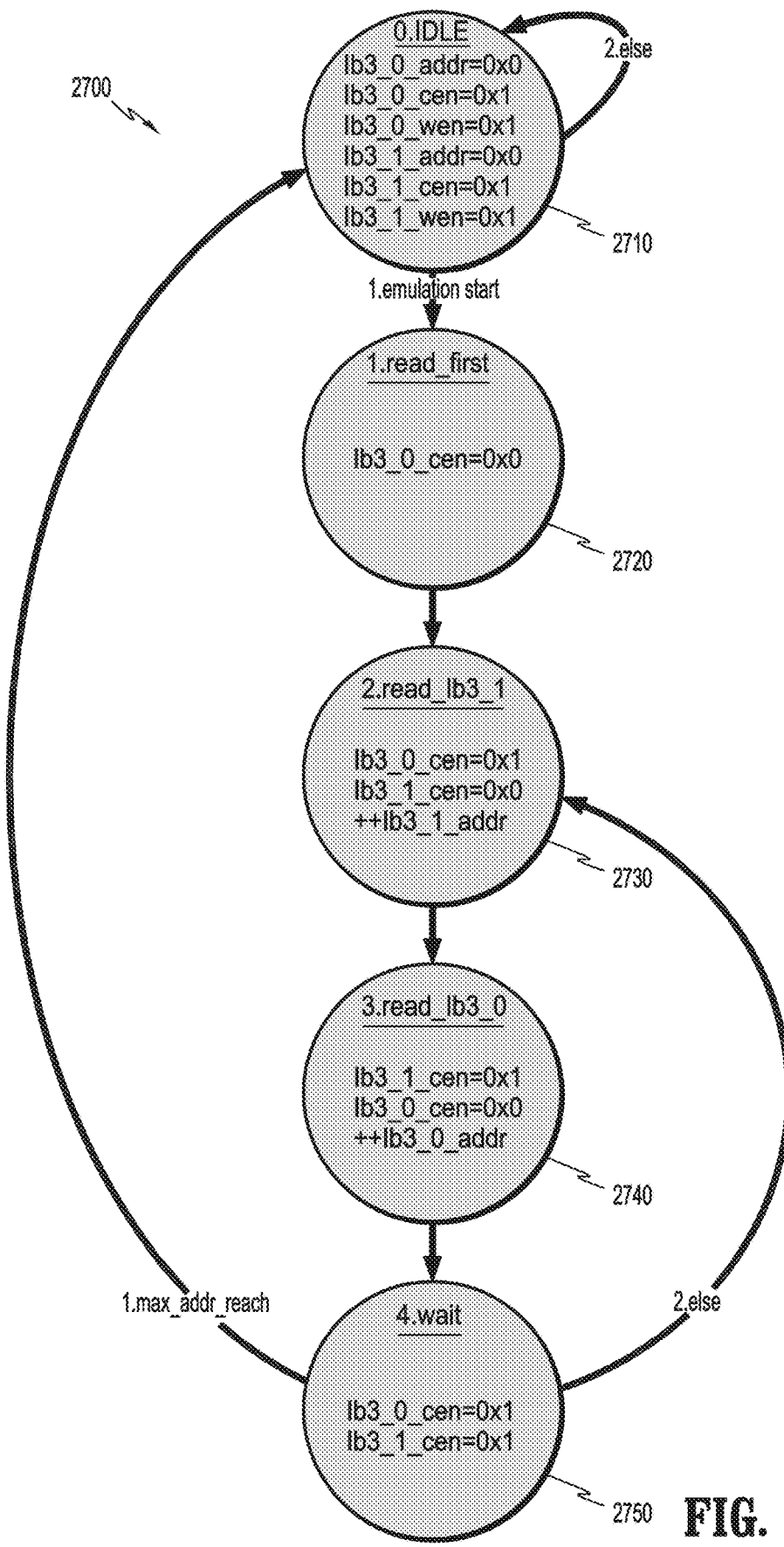
FIG. 19 is a conceptual diagram showing an input emulation state machine of an ML equalizer in accordance with an embodiment of the present disclosure.

Turning now to FIG. 19, an ML EQ may embody a state machine (SM) with input emulation machine states as indicated generally by the reference numeral 2700. The input emulation machine states may include an idle state 2710, a read_first state 2720 that transitions from the idle state, a read_IB3_1 state 2730 that transitions from the read_first state, a read_IB3_0 state 2740 that transitions from the read_IB3_1 state, and a wait state 2750 that transitions from the read_IB3_0 state before transitioning back to the idle state 2710. An alternate embodiment implementation of the above SM may utilize multiple counters instead of a SM.

In operation, the number of bits to be read may be 2 memory blocks×96 bits×192 addresses=36,864 bits. The number of words to be sent may be 36,864 bits/64 bits=576 output words.

For example, an ML EQ may have block inputs and outputs (IOs). Alternate embodiments are not limited to the particular block IOs set forth herein. An ML EQ may have a memory arbiter with hardware assignments as presented in tabular form. The memory arbiter may facilitate undisturbed access to the SHPC IB0 through IB3 blocks by arbitrating the read and write requests from and to the IB blocks. For example, this arbiter may support requests from five blocks, interfaces (IF), and/or units, such as input control (IC), weak scan (WS), weak scan for EQ (WSEQ), IB write (IBW), and input emulation (IE). Embodiments are not limited thereto.

The arbiter need not support read/write simultaneously from/to the same IBx IF, with the exception of IB3. Read while writing to IB3 can occur for one clock cycle followed by at least one cycle without requests to/from the IB3 IF. In this case, the read client may receive the old data comprising the data stored prior to the write request.

An ML EQ embodiment may have a memory arbiter with variations to the IF. While some embodiments may allow for each IF to be read only or write only, optimized block IOs may be made to meet design criteria. All IOs may be sampled inside the arbiter unit. Hence, the requests to the arbiter and the answers from it may be driven with asynchronous logic.

Figure 20:
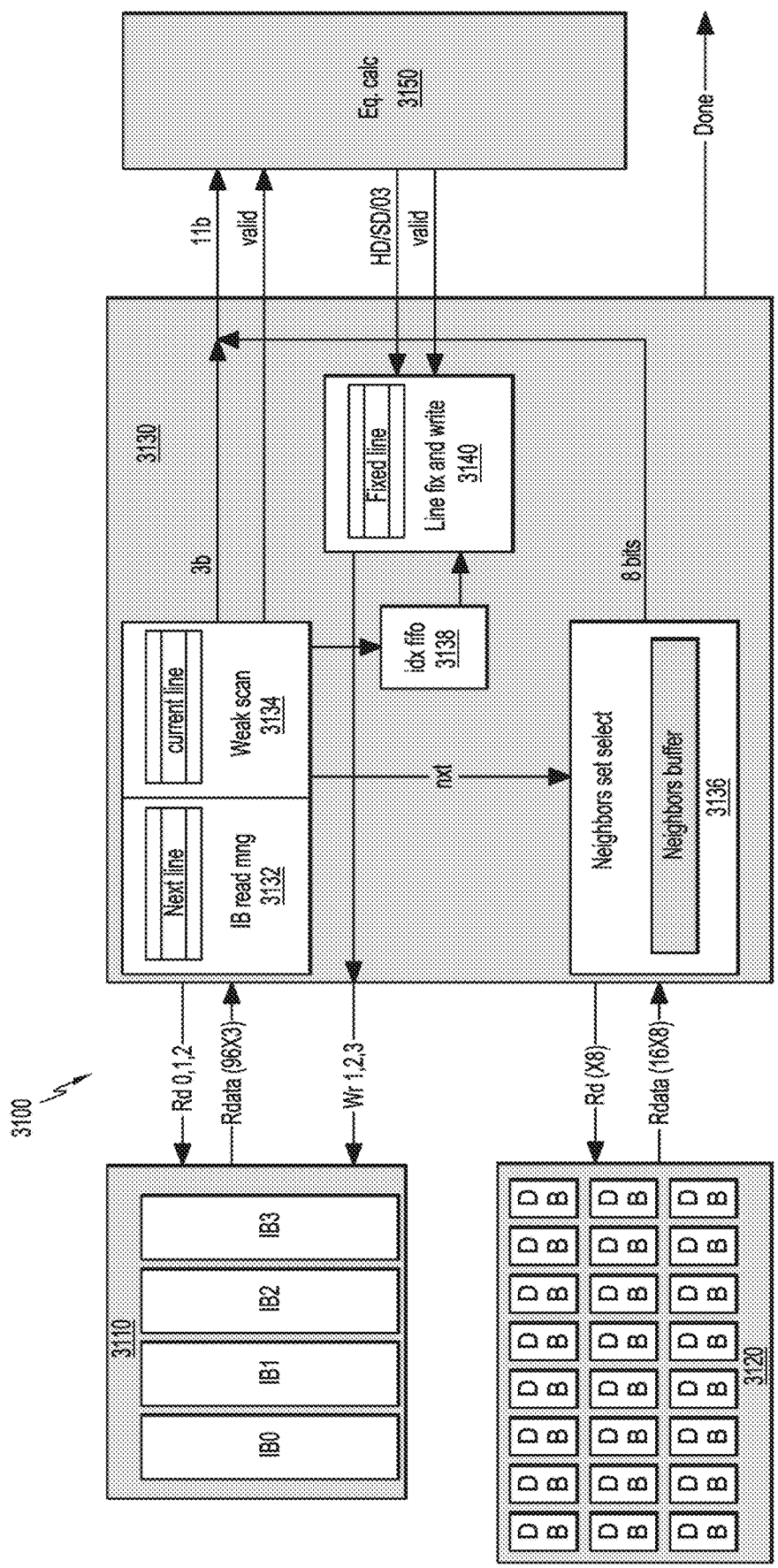
FIG. 20 is a block diagram showing equalizer calculation control blocks of an ML equalizer in accordance with an embodiment of the present disclosure.
Figure 21:
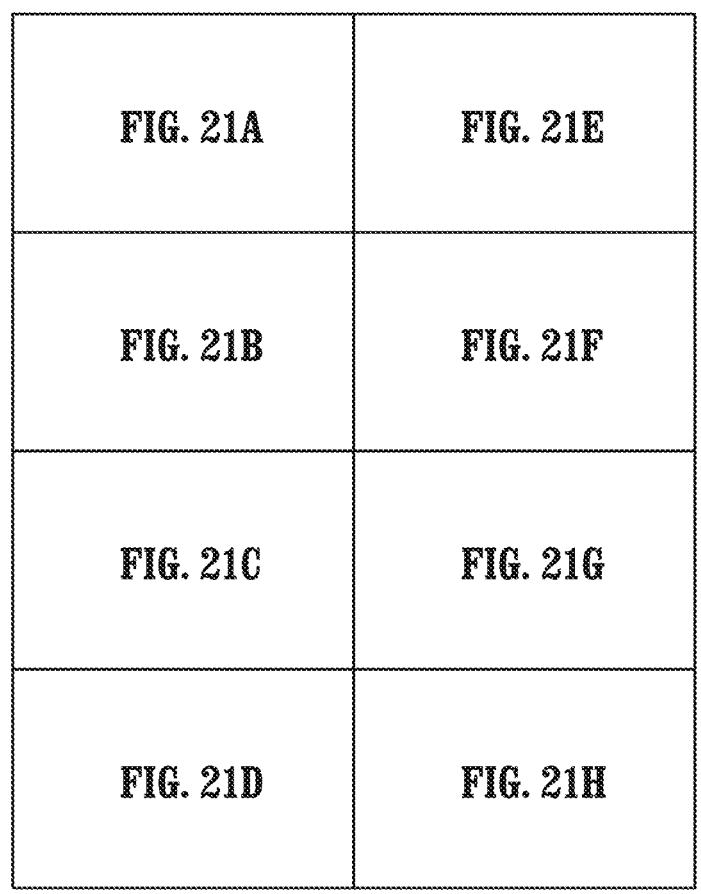
Figure 21A:
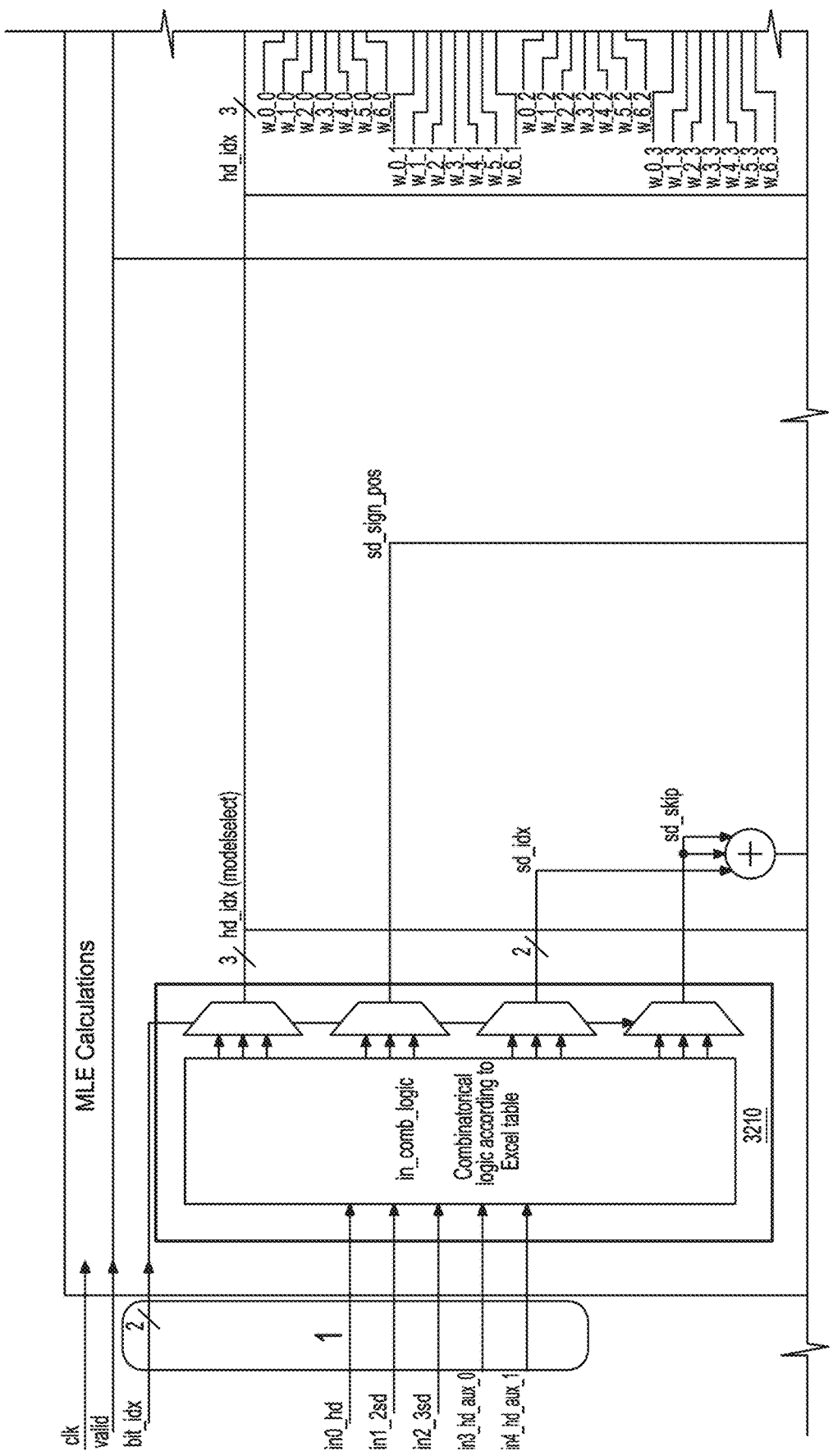
Figure 21B:
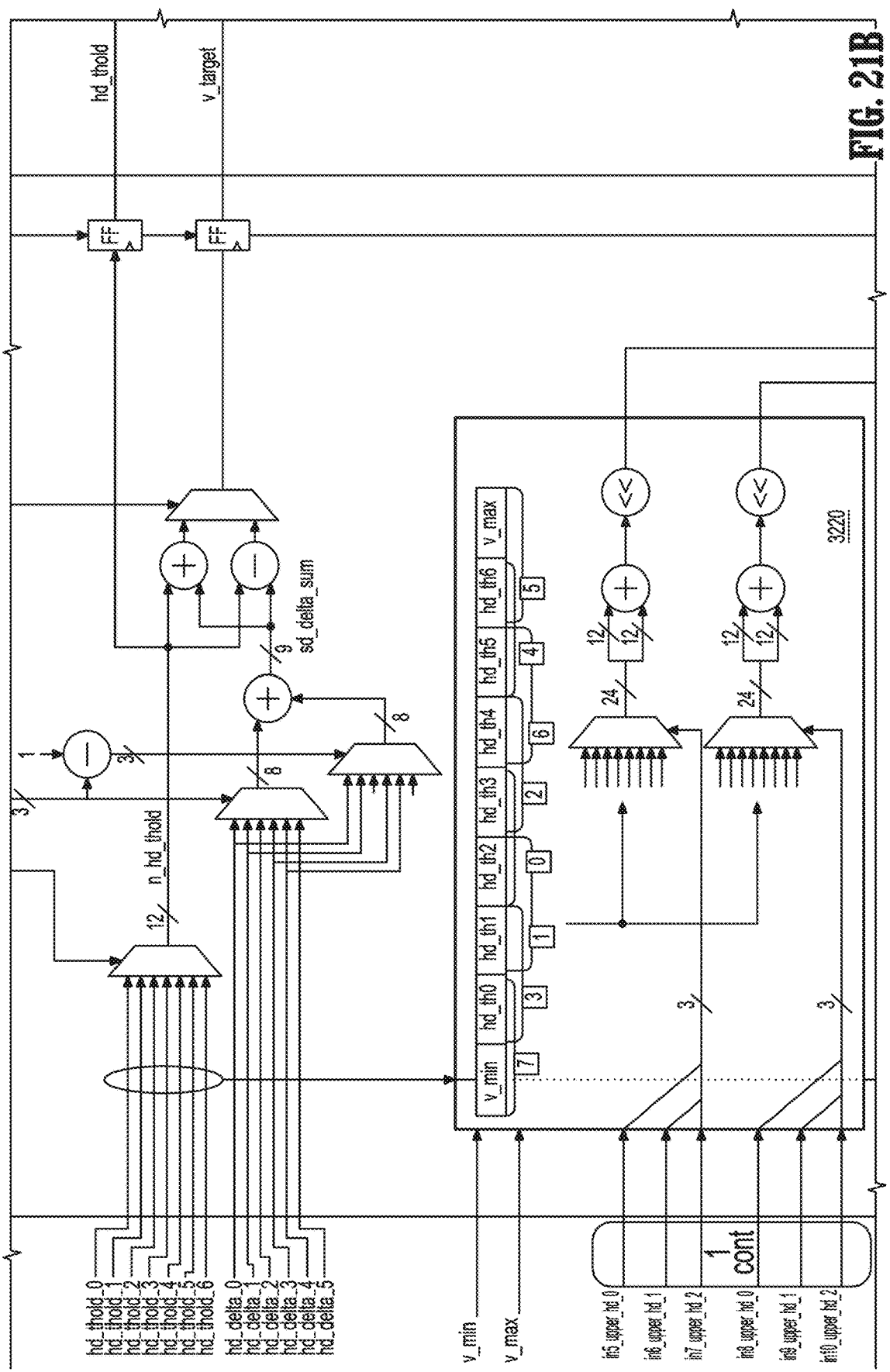
Figure 21D:
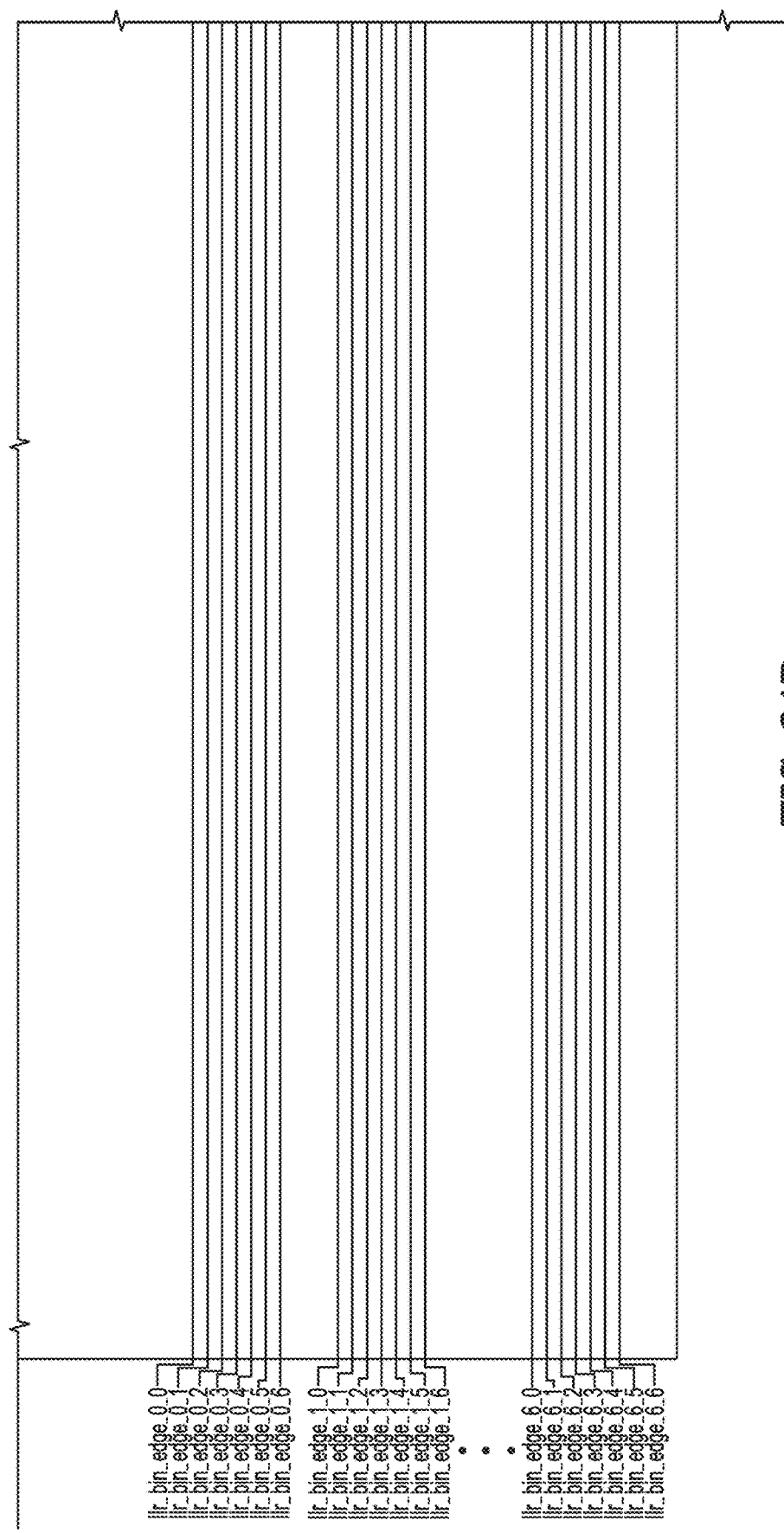
Figure 21E:
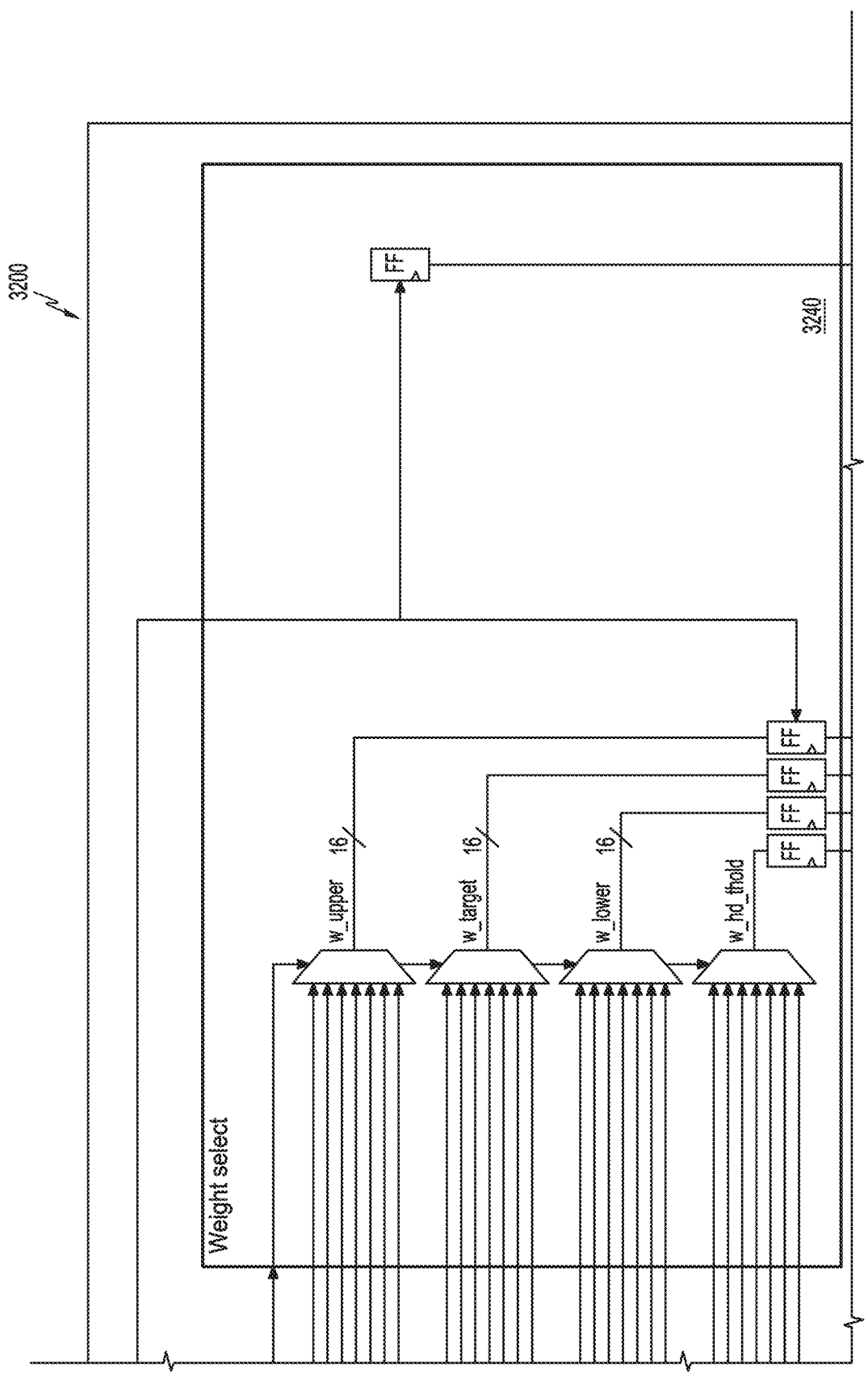
Figure 21F:
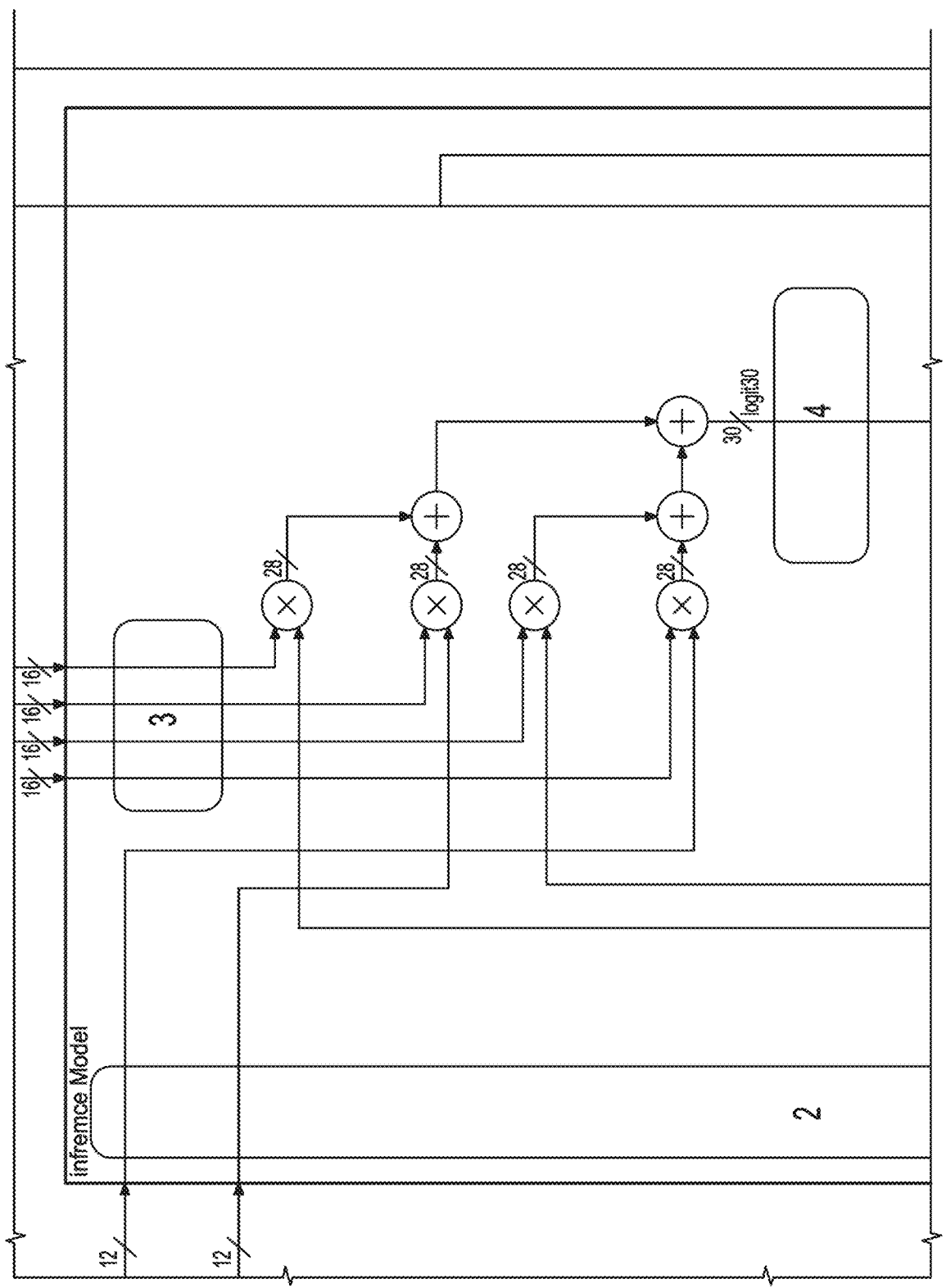
Figure 21G:
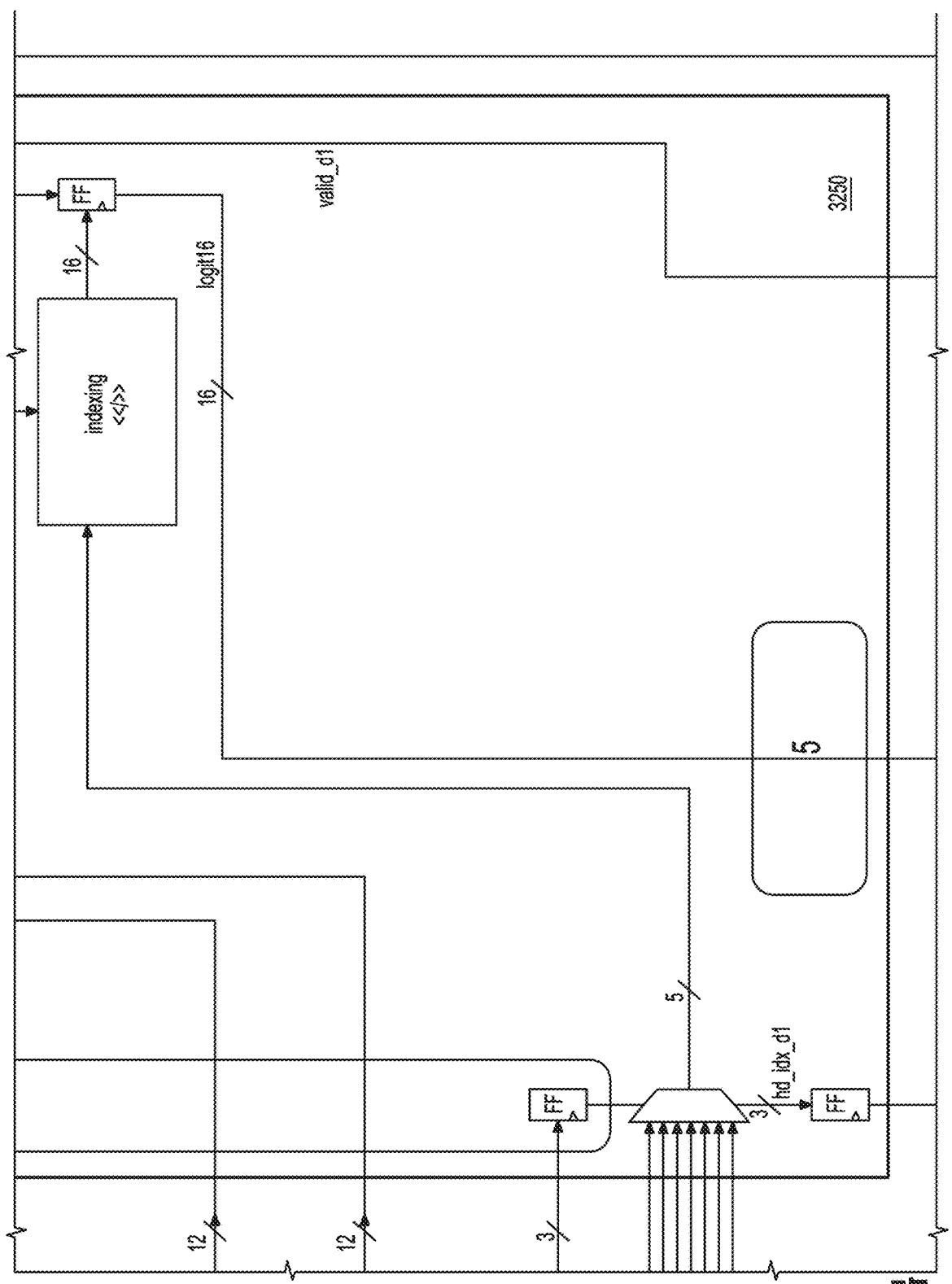
Figure 21H:
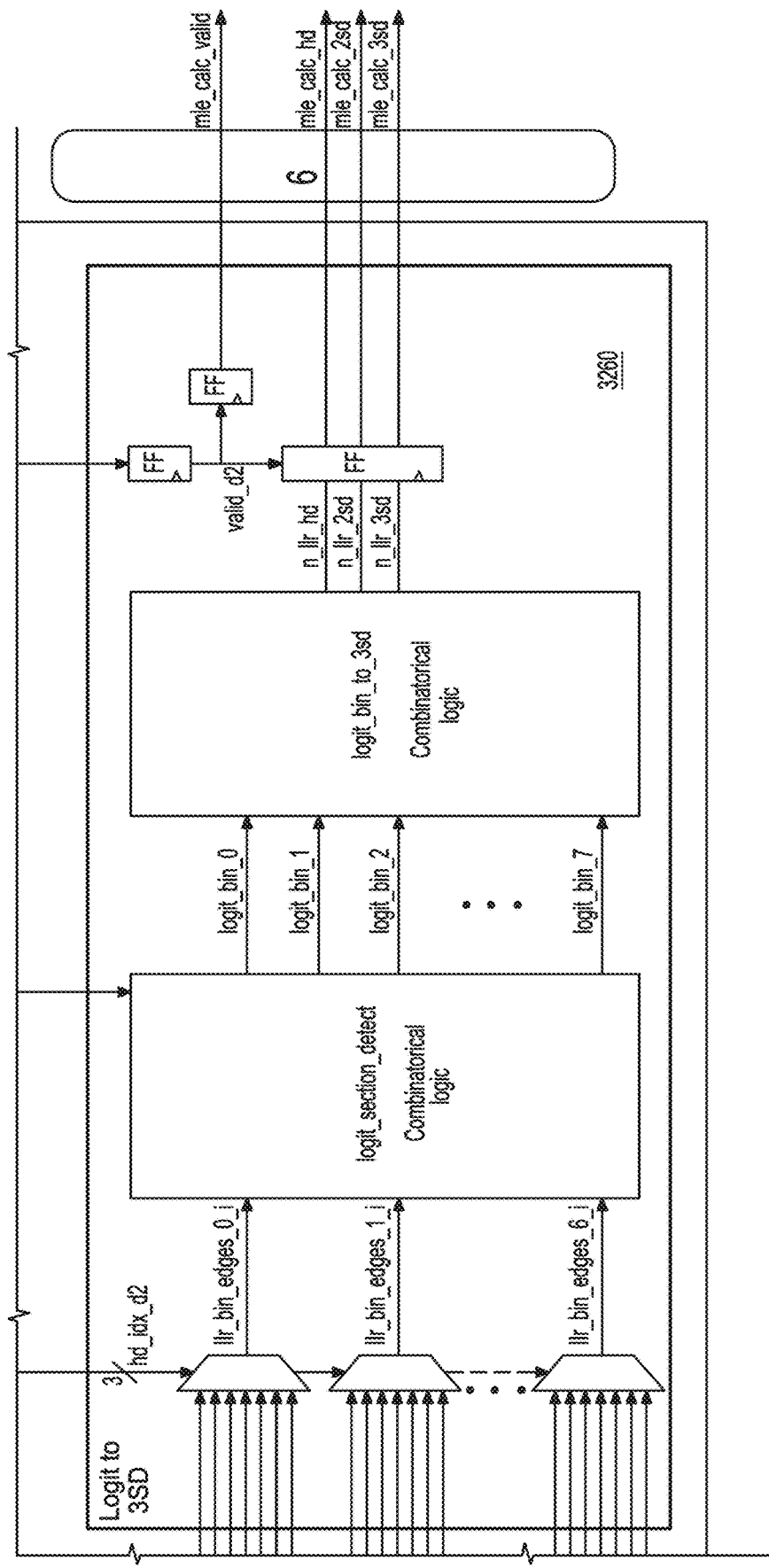

As shown in FIG. 20, an ML EQ has equalizer calculation control blocks indicated generally by the reference numeral 3100. The equalizer calculation control blocks include a calculator control block 3130 connected to each of an input buffer (IB) block 3110, a memory data bank (DB) block 3120, and an EQ calculator block 3150. The calculator control block includes an IB read manager 3132 having a next line buffer, a weak scan block 3134 having a current line buffer, a neighbors set select block 3136 having a neighbors buffer, an index FIFO buffer 3138, and a line fix and write block 3140 having a fixed line buffer.

In operation, the ML EQ calculation controller (mle_cal-c_ctrl) starts to work when input is finished and all relevant input data has been written to the DB memory. Control flow includes fetches, line-by-line, from input buffers (IB) 0+1+2. For each line, it scans SD lines for weak bits, where leading ones are detected up to 16 bits/cycle. For each weak-bit, it extracts 8 bits of neighbors, finds the bit index and pushes it to the index FIFO buffer. It sends HD+SD+3SD+neigbours with valid indications to the EQ calculator. For each result from the EQ calculator, it updates HD, SD, and 3SD fixed lines, which may be samples of the original line. When line scan and update have finished, the first and/or last flag may be attached to the index FIFO buffer, and it is written back to the IB buffers IB3, IB1, IB2. When finished scanning, the last line control goes to the input emulation block.

Turning to FIGS. 21 and 21A-21H, an ML EQ has an equalizer calculation block indicated generally by the reference numeral 3200. The equalizer calculation block may include a control logic block 3210 and four sub-blocks, such as at least one voltage embedding (VE) sub-block 3220 and/or 3230, a weight selection sub-block 3240, an inference model sub-block 3250, and a logit to LLR sub-block 3260. Values are sampled according to valid inputs. In this embodiment, there is no preliminary sampling on segment start indications, which may be redundant. There is a pipelined architecture for three clock cycles from input to output. Embodiments are not limited thereto.

For example, an ML EQ equalizer calculation block may include input combinations that result in the logic for four internal signals including hd_idx, sd_sign_pos, sd_idx, and sd_skip. Moreover, an ML EQ equalizer calculation block may incorporate verification based on equalizer calculation checkers 1 through 6. That is, of checkers 1 through 6, each checker may be qualified over a valid signal input. A separate file is generated over every word and sector combination. The six checker files may be arranged with their respective bits in a single line, but embodiments are not limited thereto.

In an example, an ML EQ equalizer calculation block may include a weak bits checker. A weak bits checker with the values of all eight "neighbor" HD of weak bits may be used. The weak bits checker may be divided into eight different files: MLE_weak_data_bank0, . . . , MLE_weak_data_bank7. Every row in each file may be 16 bits wide, starting from LSB to MSB, but embodiments are not limited thereto. The last line in every file may be padded with zeros in cases where data granularity is not 16-bit.

In another example, an ML EQ equalizer calculation block may include functional coverage checkers. Although two checkers are provided for ease of description, embodiments are not limited thereto.

High Level Design (HLD) specifications may be provided for an ML Equalizer hardware embodiment for use with eight-level or three bits per cell (TLC) NAND flash memory, without limitation thereto. Such an ML Equalizer may increase NAND reliability. It may be invoked when the ECC decoder fails to decode a 3SD word. Embodiments are not limited to TLC NAND flash memory. In an alternate embodiment, 16-level or four bits per cell (QLC) memory may be used.

The ML Equalizer may increase NAND reliability by calculating new 3SD values for the bits of the word. Each 3SD value is comprised of three bits representing the reliability of a codeword-bit. Without using the ML Equalizer, the 3SD values are obtained by performing threshold operations using 3SD voltage thresholds. The ML Equalizer IP updates these three bits with a new 3SD value, which will increase the probability that the decoder will successfully decode the codeword.

The ML Equalizer is capable of improving upon the 3SD value of a target cell by incorporating additional information about the target cell. This additional information may include: a) HD reads of other sectors within the same word-line as the target sector. The result of applying these reads on a target cell, together with the original HD+2SD+3SD reads of the target sector, let us obtain an accurate estimation of the cell's voltage; and b) HD reads of all the sectors from the word-line above and below the target word-line in the same SSL. These readings allow predicting the interference created by those neighbor cells, and this prediction may be used to improve the original estimation.

Included in the ML Equalizer is a statistical model which takes as an input the information about the cell and its neighbors, and outputs a prediction of the likelihood that it stores 0 or 1. The statistical model makes its prediction only on "weak" cells, such as cells which have low reliability 3SD values. Cells which have high reliability 3SD values are skipped and their 3SD values remain unchanged.

Figure 22:
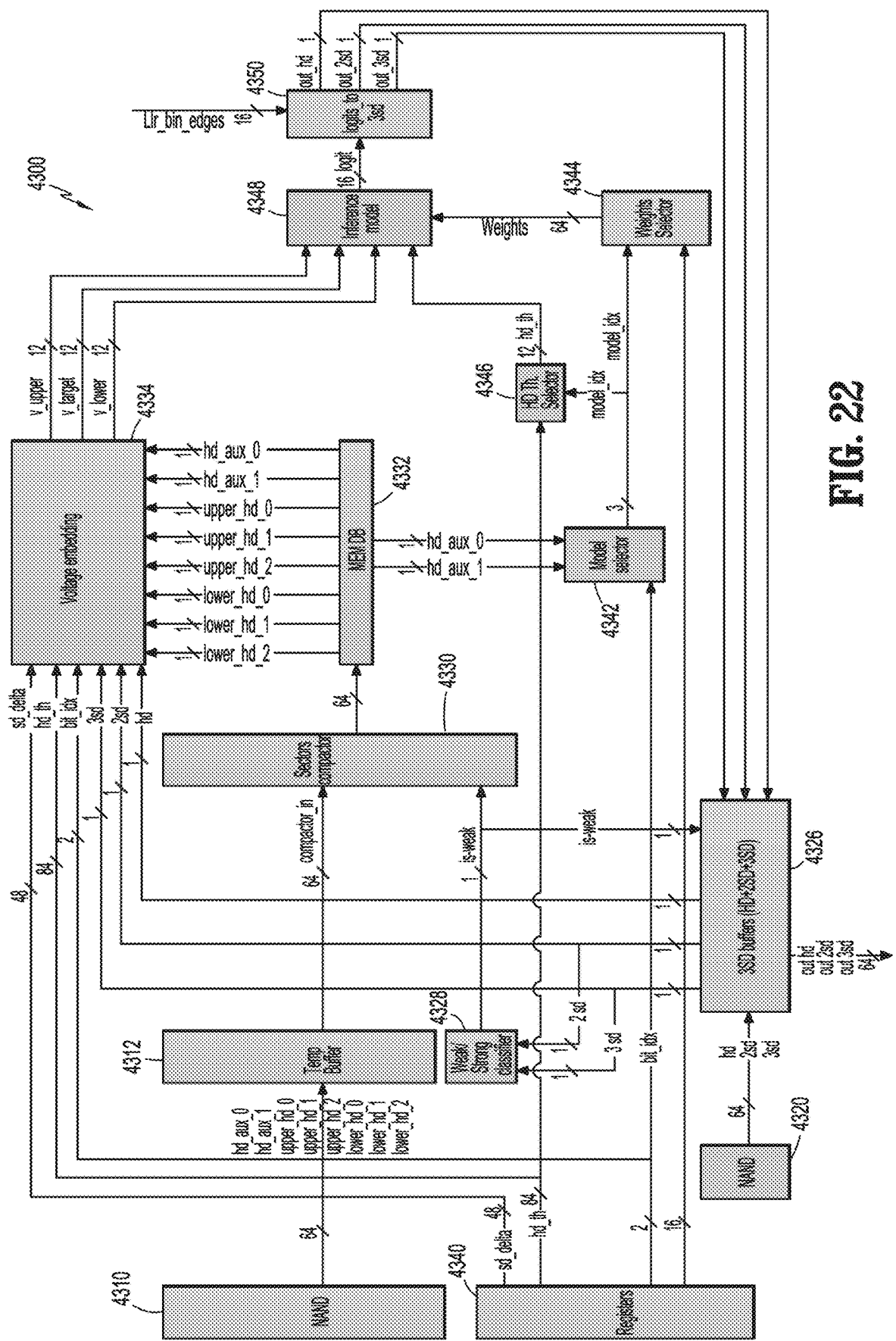
FIG. 22 is a block diagram showing a top level architecture for an ML equalizer in accordance with an embodiment of the present disclosure.

As shown in FIG. 22, a top-level ML Equalizer architecture 4300 includes a first NAND flash memory 4310, a temporary buffer 4312 connected to the first NAND, a second NAND flash memory 4320, 3SD buffers 4326 connected to the second NAND, a weak/strong classifier 4328 connected to the 3SD buffers, a sectors compactor 4330 connected to the temporary buffer 4312 and the weak/strong classifier 4328, a memory data buffer 4332 connected to the sectors compactor 4330, a voltage embedder 4334 connected to the 3SD buffers 4326 and the memory data buffer 4332, registers 4340 connected to the voltage embedder 4334, a model selector 4342 connected to the memory data buffer 4332 and the registers 4340, a weights selector 4344 connected to the registers 4340 and the model selector 4342, an HD Threshold selector 4346 connected to the registers 4340 and the model selector 4342, an inference model 4348 connected to the voltage embedder 4334 and the weights selector 4344 and the HD Threshold selector 4346, and a logits-to-3SD converter 4350 connected between the inference model 4348 and the 3SD buffers 4326.

Micro Special Function Register (uSFR) configurations and/or variables may be provided. Some of these may be configured once at booting time, or at a relatively low frequency, and others may be configured per-sector. A corresponding uSFR configuration protocol is described in greater detail further below. Non-uSFR registers or local variables may be provided. In alternate embodiments, some uSFR and/or non-uSFR values may be interchanged, without limitation thereto.

Figures 23, 24:
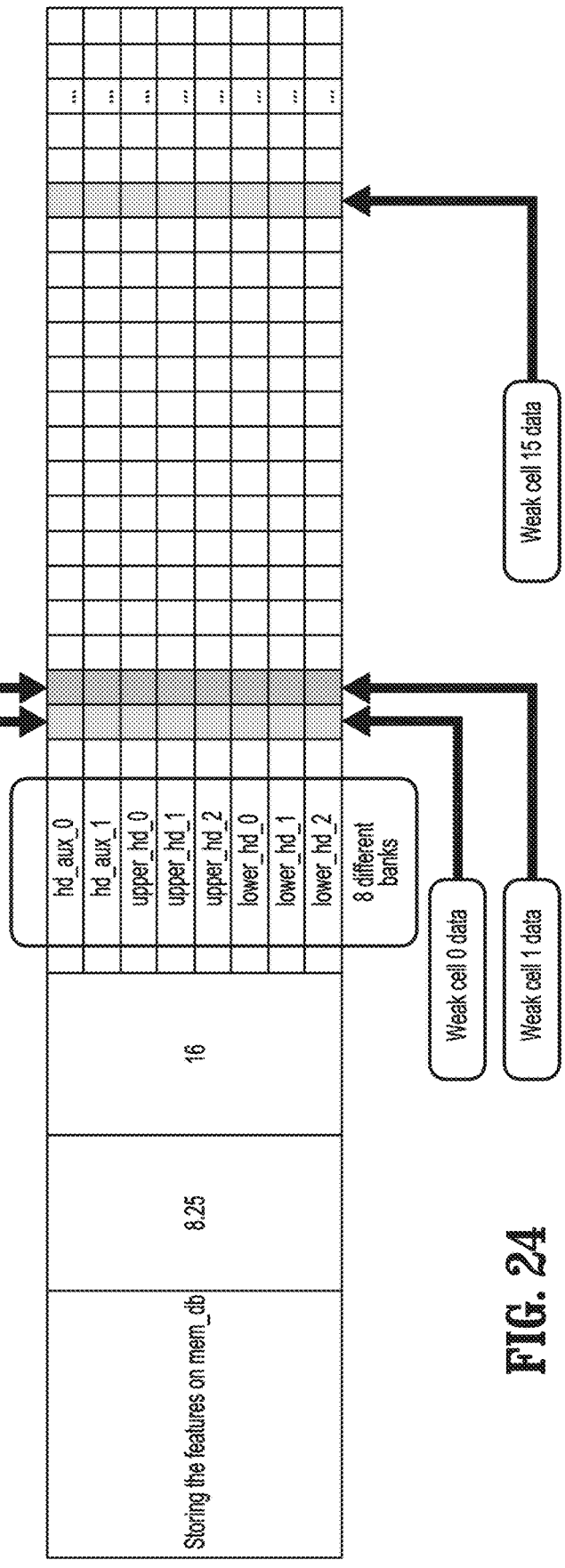
FIG. 23 is a tabular diagram showing mappings between 3SD symbols to/from two-bit soft decision (2SD) and three-bit soft decision (3SD) bits for an ML equalizer in accordance with an embodiment of the present disclosure.
FIG. 24 is a hybrid diagram showing compaction for an ML equalizer in accordance with an embodiment of the present disclosure.

As shown in FIG. 23, the processing stages include pre-processing stages, a first of which may be a weak/strong classification. The 3SD channel output may be one of the following options (ordered from the strongest "1" to the strongest "0"): [VS1, NS1, NW1, VW1, VW0, NW0, NS0, VS0], where: VS1—Very strong 1; NS1—Normal strong 1; NW1—Normal weak 1; VW1—Very weak 1; VW0—Very weak 0; NW0—Normal weak 0; NS0—Normal strong 0; and VS0—Very strong 0, which may be implemented as different types of hardware machines.

The ML equalizer will be operated only over the "weak" samples. A "weak" sample is a sample having a 3SD value that is one of the following options: [NS1, NW1, VW1, VW0, NW0, NS0], thus its reliability is not at the highest level. A "strong" sample is a sample having a 3SD value that is one of the following options: [VS1, VS0], thus its reliability is at the highest level.

Each sample may be classified as "weak" or "strong" according to 2 bits: the 2SD-bit and the 3SD-bit. The mapping from a 3SD symbol to its corresponding (2SD, 3SD) bits may be performed accordingly. Thus, in order to classify a sample as "weak" or "strong", the following compare should be applied: Classification="Strong" if (2SD, 3SD)=="11" else "Weak"

During sectors compaction, a 3SD read involves the reading of 3 buffers, 4.5 KB each, which represent the HD, 2SD and 3SD data of the target sector, respectively. In addition, the ML Equalizer may read 8 additional auxiliary buffers, 4.5 KB each, including: 2 HD buffers for other sectors in the same WL as the target sector, 3 HD buffers for all the sectors from the WL above the target WL in the same SSL, and 3 HD buffers for all the sectors from the WL below the target WL in the same SSL.

In an embodiment, the 8 auxiliary sectors might otherwise consume more memory than application criteria might afford, such as 8 buffers of 4.5 KB each. Thus, only samples which are related to "weak" samples from the target sector will be stored compactly in the MEM_DB buffer. In an embodiment, the first and the last TLC WLs may have MLC neighbors which require fewer buffers.

An auxiliary sectors list may include: hd_aux_0: HD-bit of the first non-target sector (For-bit_idx=0, the first non-target sector is hd_1, For-bit_idx=1, the first non-target sector is hd_0, For-bit_idx=2, the first non-target sector is hd_0); hd_aux_1: HD-bit of the second non-target sector (For-bit_idx=0, the second non-target sector is hd_2, For-bit_idx=1, the second non-target sector is hd_2, For-bit_idx=2, the second non-target sector is hd_1); upper_hd_0: Upper WL HD-bit for-bit index 0; upper_hd_1: Upper WL HD-bit for-bit index 1; upper_hd_2: Upper WL HD-bit for-bit index 2; lower_hd_0: Lower WL HD-bit for-bit index 0; lower_hd_1: Lower WL HD-bit for-bit index 1; and lower_hd_2: Lower WL HD-bit for-bit index 2.

A corresponding process may include:
a) Make sure that the HD, 2SD, 3SD buffers of the target sector are ready to use; and
b) for auxiliary_sector_index in range(8),
1. Read auxiliary_sectors[auxiliary_sector_index] to a temporary buffer (temp_buf);
2. Run over the target's (2SD, 3SD) buffers and the temp_buf simultaneously; and
3. If sample i is weak:
i. mem_db[auxiliary sector index][weak_sample_ind]= temp_buf[i]; and
ii. weak_sample_ind+=1.

Turning now to FIG. 24, the compaction process is indicated generally by the reference numeral 4800. Here, the mapping from 3SD symbol to (2SD, 3SD) bits is as defined in the weak or strong classification.

In Edge WL processing: If is_upper_wl=1, the compaction will skip upper_hd_2 and won't consider that sector because it does not exist for MLC WLs. Similarly, if is_lower_wl=1, the compaction will skip lower_hd_2 and won't consider that sector because it does not exist for MLC WLs.

Figure 25:
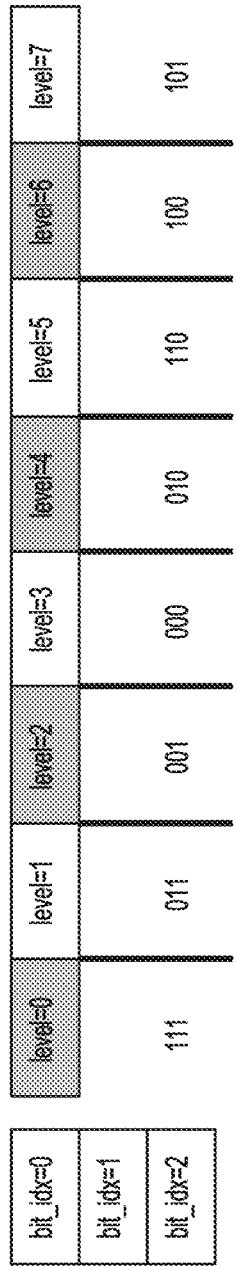
FIG. 25 is a tabular diagram showing mappings between bits and levels for model selection in an ML equalizer in accordance with an embodiment of the present disclosure.

As shown in FIG. 25, model selection may proceed. The mapping between bits and levels is made by the TLC Gray code or RBC mapping as shown.

For example: in order to decode-bit_idx=0, only 2 thresholds out of 7 should be applied; in order to decode-bit_idx=1, only 3 thresholds out of 7 should be applied; and in order to decode-bit_idx=2, only 2 thresholds out of 7 should be applied.

Each "weak" sample is being handled by one and only one of the models, according to its related HD threshold. The related HD threshold is set according to 3 parameters: 1) bit_idx (for TLC it might be: 0, 1, 2); 2) hd_aux_0: HD-bit of the first non-target sector (For-bit_idx=0, the first non-target sector is hd_1, For-bit_idx=1, the first non-target sector is hd_0, For-bit_idx=2, the first non-target sector is hd_0); and 3) hd_aux_1: HD-bit of the second non-target sector (For-bit_idx=0, the second non-target sector is hd_2, For-bit_idx=1, the second non-target sector is hd_2, For-bit_idx=2, the second non-target sector is hd_1).

In an example, setting the appropriate model index model_idx (A number between 0:6) may be performed according to the combination of the 3 parameters above. Here, the "don't care" values may be the same as those in the reference model.

For weights selection, there are 7 sets of 4 weights each for the 7 models, respectively. Each single row of weights is to be extracted according to each model_idx, respectively:

For example, voltage embedding mappings may be provided where the inference model expects features which may be encoded as voltages rather than bits. Thus, the voltage encoding may be a function of the bit index, read bits, HD thresholds, and SD delta.

A voltage embedding module may be split into 2 parts: A) Initialization (e.g., once every sector), including: building target sector voltage embedding table, and building neighbor sectors voltage embedding table; and B) Evaluation including extracting voltages from v_target_arr and v_neighbor_arr according to the read bits.

Initialization may be performed once per sector, although not limited thereto, and may include initializing a target voltage embedding table. The target sector voltage mapping may be initialized once in a sector. Here, "hd_th" is the single variable in that equation, whereas all of the other terms may be fixed. Therefore, the second addition or subtraction term can be prepared in advance. All possible v_target output values may be listed as numbered expressions. Such numbered expressions may be applied to input and calculation variables as shortcuts.

The neighbor (upper/lower) sector voltage mapping is initialized once in a sector: Here, the neighbor voltage embedding is different for each combination of neighbor input values and the corresponding output expression.

Evaluation may be performed for every sample. After being initialized once per sector, the outputs are evaluated for every sample as follows:

v_target = v_target_arr[hd, hd_aux_0, hd_aux_1, 2sd, 3sd];
v_lower = v_neighbor_arr[lower_hd_0, lower_hd_1, lower_hd_2]; and
v_upper = v_neighbor_arr[upper_hd_0, upper_hd_1, upper_hd_2].

In edge WLs management, the first and last TLC wordlines have no TLC neighbors. Their neighbors are MLC WLs. A different voltage embedding may be applied for these neighbors. If "is_upper_wl"=1, it may be applied to the upper WL. If "is_lower_wl"=1, it may be applied to the lower WL. The second neighbor may be handled as any other case.

Figure 26:
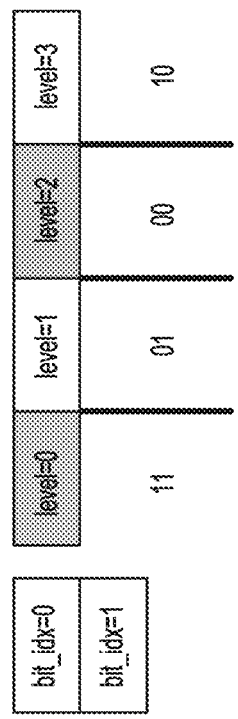
FIG. 26 is a tabular diagram showing multi-level cell (MLC) Gray code or reflected binary code (RBC) mapping in an ML equalizer in accordance with an embodiment of the present disclosure.

Turning to FIG. 26, the MLC neighbor voltage embedding table is based on sub-sampling the TLC neighbor voltage embedding table. Assuming the MLC Gray or RBC mapping as shown in FIG. 26, the MLC voltage embedding table may be as based on an initialization. During evaluation: if is_upper_wl=1, v_upper = v_neighbor_mlc_arr[neighbor_hd_0, neighbor_hd_1].
If is_lower_wl=1,
v_lower = v_neighbor_mlc_arr[neighbor_hd_0, neighbor_hd_1].

Figure 27:
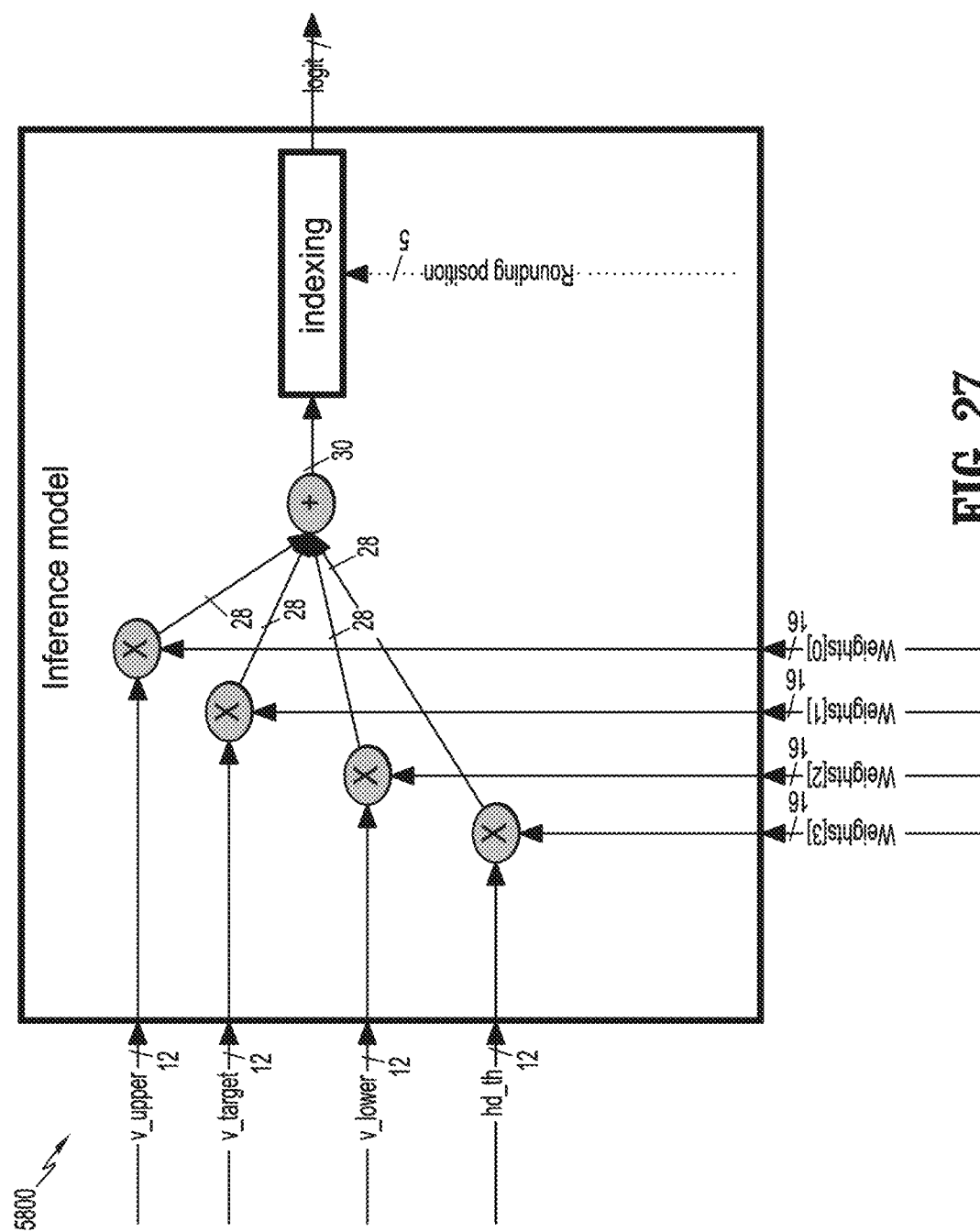
FIG. 27 is a hybrid diagram showing an inference model implementation in an ML equalizer in accordance with an embodiment of the present disclosure.

As shown in FIG. 27, an inference model is indicated generally by the reference numeral 5800. The inference model 5800 includes an indexing block 5810. The inference model 5800 applies the following calculation equation:

$$\text{Mac\_output} = W_{i0} \cdot v\_upper + W_{i1} \cdot v\_target + W_{i2} \cdot v\_lower + W_{i3} \cdot hd\_th[\text{model}\_idx].$$

The Multiply Accumulator (MAC) output should reduce its bit width in order to be compatible with the next modules. The translation from a 30 bit vector to a 16 bit vector includes 2 operations: Rounding and Right-Shift.

The Rounding operation applies the equation:
round_shift=[MAC_output]& (1<<(rounding_pos−1)), where the ampersand represents a bitwise- and operation. Therefore, round_shift may be 0 or (1<<(rounding_pos−1));

abs_MAC_output_round = |MAC_output| + round_shift, and
MAC_output_round = abs_MAC_output_round × sign(MAC_output)

The Right-Shift operation applies the equation:
logit[0:15]=MAC_output_round[round_pos+15], where "round_pos" is an integer between 0 to 14.

In post-processing, the LLR bin edges are specific values of LLR that partition the LLR space into 8 bins. Each bin is assigned a different 3SD symbol. The LLR bin edges are different for each HD thresholds. For ease of explanation, they may identical for all the WLs in a block. Therefore, there are 7 bin edges per HD threshold and 7 HD thresholds.

Each row represents the 7 bin edges for a specific HD threshold or model. Because for a given sector, only 2 or 3 HD thresholds or models are relevant, only 2 or 3 out of the 7 rows may be used for the whole sector.

Logit to 3SD translation is included. For each model_idx, a single row may be extracted from the table. Each column represents the LLR bin edge for a specific HD threshold. In order to translate a logit value into three 3SD bits, the appropriate table expression may be applied.

Verification may use test vectors. Each test vector will have the file list drawn from the table. For checkers, in addition to the above test vectors, intermediate signals may be supplied on demand after each module.

The reflected binary codes (RBC) or Gray codes of the present disclosure may include multi-level cell (MLC) (e.g., two bits per memory cell) and TLC (e.g., three bits per memory cell) Gray codes. While the Gray codes may be hard-coded for ease of explanation, alternate embodiments may use configurable RBC or Gray codes without limitation thereto.

An alternate embodiment may read the 3SD buffer data again or store it in a temporary buffer, which may improve robustness and/or recovery in the event that SHPC decoding failed and/or the data on the 3SD buffer became corrupted.

Auxiliary pages may be used for the ML Equalizer. Adjustments may be done in the controller. For example, if decoding page index 21 on a VSTLC embodiment, the values from the table may be read out for the ML equalizer.

Turning now to FIG. 28, a determination of which pages to read may be made by using a pages to word-lines mapping table. For example, at WL 89, the SSL0 second table value is shown as 21.

In an embodiment, a maximum number of bits to fix may be set, such as on the order of 8000, for example, without limitation thereto. Thus, a fallback scheme may be applied depending on how many bits beyond the limit are in use (e.g., 1 or 10 or 100 or 1000).

Moreover, if a hardware anomaly occurs such that the system cannot fix as many bits as expected at some stage, a process stop may be applied. If, for example, there are more than the expected number of flipped bits, or if during calculation it determines that the results may be insufficient, either the fallback scheme or the process stop may be initiated.

As shown in FIG. 29, a uSFR register is indicated generally by the reference numeral 6400. The uSFR register 6400 may be used by a uSFR read/write protocol. The uSFR register 6400 includes a 12-bit uSFR register, such as may be defined by a Pascal controller without limitation thereto. To configure or read the register, a serial indirect memory access may be adopted.

Turning to FIG. 30, the 4 left-most bits (e.g., I3-I0) of FIG. 64 may represent an Access Identifier. The Access Identifier identifies whether the access (e.g., a read or write) involves an address or data.

Turning now to FIG. 31, uSFR registers are indicated generally by the reference numeral 6600. A uSFR register 6610 contains an address word. Here, the fourth bit is zero indicative of an address word, without limitation thereto; and the word itself has eight bits, without limitation thereto. A uSFR register 6620 contains a data word. Here, the fourth bit is one indicative of a data word, without limitation thereto; and the word itself has eight bits, without limitation thereto. Moreover, the address register is not limited to the four indicator bits shown, as one or more bits may be used in alternate embodiments.

The 8 right-most bits (P7-P0) are the Payload which represents the address or data itself. In order to read or write a data piece that is wider than 8 bits, additional access may be supported.

An address space is defined in an embodiment where the table summarizes the address of each uSFR configuration. Unused bits may be zero padded, without limitation. A booting sequence for fixed configurations is also defined. Fixed configurations may be configured once at booting time, or at a relatively very low frequency interval. A table sequence may be applied to configure a fixed configuration embodiment, without limitation. A per-sector sequence for per-sector configurations is further defined. Per-sector configurations may be configured every sector. The table sequence may be applied to configure a per-sector embodiment, without limitation.

In a reconfigurable embodiment, such as to test different configurations, shared parts may be included, whether implemented in hardware, software, or a combination thereof. A relatively constant single booting sequence part "equalizer_uSFR_fixed" may be used, and may include a booting sequence having 12 bits per row, for example. Multiple per-sector configuration parts "equalizer_uSFR_ word[word_index]" may be used that include the per-sector sequence with 12 bits per row, such as including (equalizer_uSFR_word_0, equalizer_uSFR_word_1, . . . ), without limitation thereto.

Turning to FIGS. 32A and 32B, a Machine-Learning Equalizer (MLE) memory control method is indicated generally by the reference numeral 7100. The method 7100 includes exemplary pseudocode for initialization 7110, pre-decoding 7120, soft-input soft-output (SISO) decoding 7130, post-decoding 7140, error decision/determination 7150, decision error syndrome 7160, end criteria 7170, and codeword decoding 7180. In an example, 3 bit SD decoding may be performed with this method, without limitation thereto.

Figure 33:
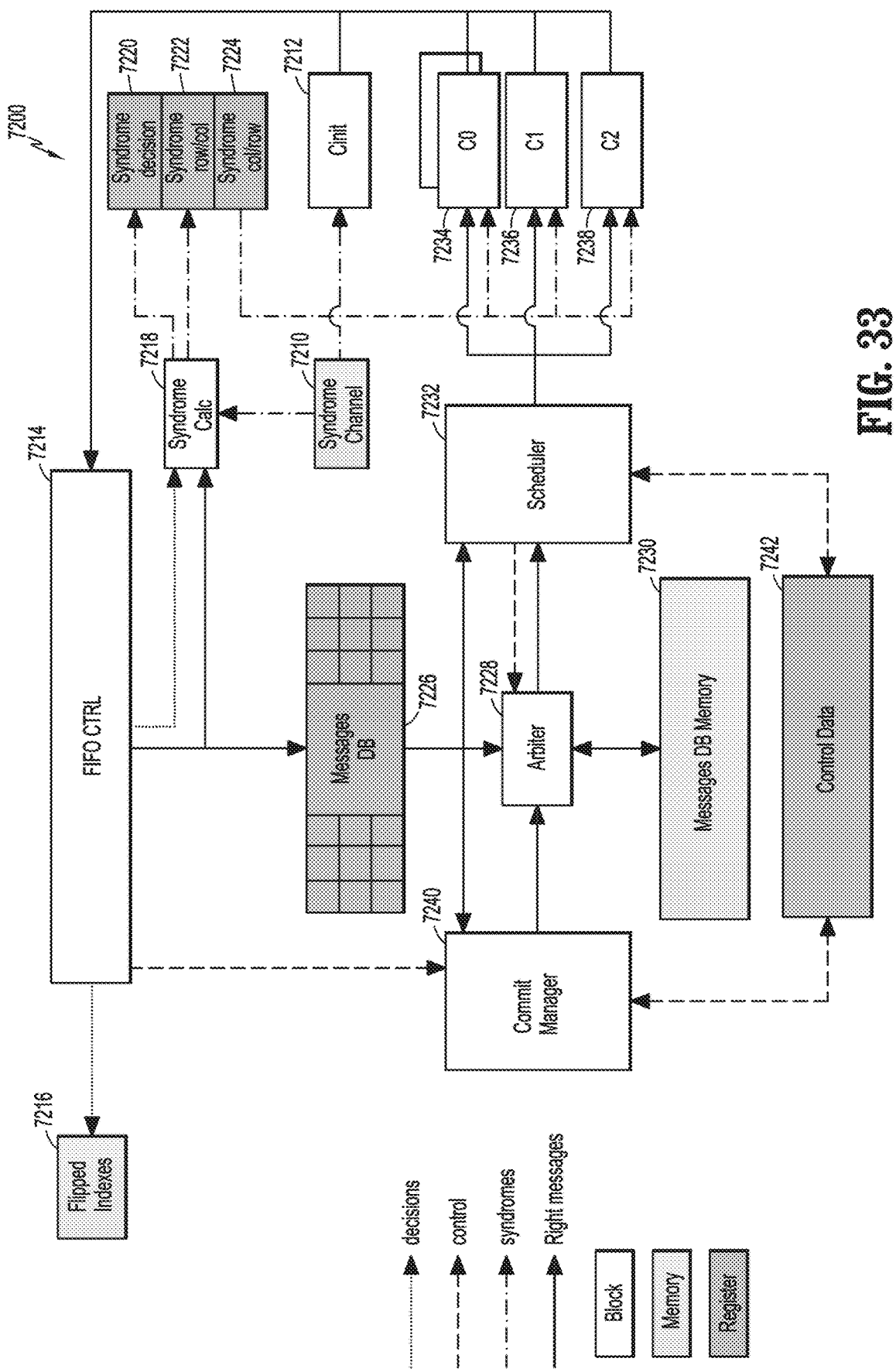
FIG. 33 is a block diagram of a machine-learning memory controller in accordance with an embodiment of the present disclosure.

Turning now to FIG. 33, an MLE memory controller is indicated generally by the reference numeral 7200. The controller 7200 includes an error syndrome channel 7210 that provides error syndromes to a C-Initialization machine 7212 and an error syndrome calculator 7218. The C-Initialization machine 7212 issues messages to a first-in first-out (FIFO) controller 7214. The FIFO controller 7214 issues messages to a messages database 7226 and to the error syndrome calculator 7218, and provides decisions to a flipped indexes module 7216 and to the error syndrome calculator 7218. The error syndrome calculator 7218 provides error syndromes to an error syndrome decision module 7220 and an error syndrome row/column module 7222 connected to an error syndrome column/row module 7224. The error syndrome column/row module 7224 provides the error syndromes to a C0 machine 7234, a C1 machine 7236 and a C2 machine 7238, which issue messages to the FIFO controller 7214.

The FIFO controller 7214 provides control signals to a commit manager 7240, which, in turn, sends and receives control signals to and from a control data module 7242. The commit manager 7240 issues messages to an arbiter 7228 and a scheduler 7232, and receives messages from the scheduler 7232. The arbiter 7228 receives messages from the messages database 7226, stores and retrieves messages to and from a messages database memory 7230, and issues messages to the scheduler 7232. The scheduler 7232 sends and receives control signals to and from the control data module 7242, sends control signals to the arbiter 7228, and issues messages to each of the C0 machine 7234, the C1 machine 7236 and the C2 machine 7238, without limitation thereto.

SHPC as well as Hamming Permutation Code (HPC) may have implementation aspects for machines and message-passing that implement soft-input soft-output (SISO) decoding of the constituent codes, such as shortened Hamming codes. For descriptive purposes, a main machine C2 is presented, which implements the full SISO decoder as may be described in greater detail further below.

Machines C0, C1 and C2_light are degenerated machines, each based on the SISO decoder of machine C2, for the specific cases described below, where substantially duplicate description may be omitted. These machines may decrease the implementation complexity with negligible changes in performance. In addition, a C-Initialization machine may be used to set the initial Log-Likelihood Ratio (LLR) values indicating the probability that a bit is reliable in the case of Hard-decision (HD) throughput.

Additional implementation simplification or reduction may be accomplished in a message-passing algorithm, which may be described in greater detail further below. This may reduce both memory usage and/or computation, for example. The message may include a bit index and a value, where the value is presented in 5 bits LLR, without limitation thereto. In general, each SISO decoding of a constituent code has a default LLR value for all bits except the special bits, such as suspect bits and flipped bits. The value for regular bits and the values for special bits in machine C2 may be further specified below. Each constituent code may be decoded in at least one of the following machines.

Machine C2 performs a full SISO decoder implementation. The C2 machine will operate in two cases: 1) In a case where the conditions for C0 and C1 and C2_light machines have not been fulfilled. 2) In a case where machine C1 has failed to decode, then the word will be redirected for decoding by machine C2. Implementation wise: A) Machine C2 will generate special bits (e.g., suspect and/or flip bits). B) For regular bits: Set $\beta=\beta max$ from a lookup table (when $min1=0$). The output message will be $Lleft,i=\beta max$ for all bits. C) Negative input LLRs $Lin,i$ will preserve the sign at $Lleft,i$.

Machine C0 operates when the parity bit is zero ($p=0$) and the error syndrome is zero ($s=0$). In this case, if no error occurs in the received word, the nearest candidate will be a codeword with Hamming distance of 4 that may be assumed to have a negligible probability of occurrence. Implementation wise: A) The C0 machine will not generate any special-bit (e.g., suspect or flip bits). B) Set $\beta=\beta max$ from the lookup table (as in C2 when $min1=0$). C) The output message will be $Lleft,i=\beta max$ for all bits. D) Negative input LLRs $Lin,i$ will preserve the sign at $Lleft,i$.

Machine C1 operates when the parity bit is one ($p=1$) and the error syndrome is not equal to zero ($s\neq 0$). In this case, the C1 machine tries to evaluate whether the received word is one bit away from a legitimate codeword. For $p=1$, only odd numbers of flip bits are expected. For a single flip-bit, the Machine-Learning (ML) hypothesis in the SISO decoder will be the all zero bits hypothesis and the flip-bit. A condition for operating machine C1 is to check between the all zero hypothesis and the next candidate hypothesis, which is the hypothesis with two suspect bits and one flip-bit (i.e., 3 flips overall). Hence, the condition for the C1 machine is: $|Lin,lip-bit|<|Lin,sus-bit\ 1|+|Lin,sus-bit\ 2|+|Lin,sus-bit\ 3|$, where the suspect bits are in ascending order of the LLRs absolute value.

Implementation wise: A) The machine C1 may calculate a flip-bit from the error syndrome. If flip-bit is invalid return false and send word to machine C2. B) Calculate absolute value of input LLR of flip, that is $|Lin,lip-bit|$. C) Check the condition $|Lin,lip-bit|<|Lin,sus-bit\ 1|+|Lin,sus-bit\ 2|+|Lin,sus-bit\ 3|$. If not satisfied, return false and send word to machine C2. D) If flip-bit is one of the three suspect bits, then: i) $Lleft,flip-bit=-\beta max\cdot sign(Lin,flip-bit)$, that is, sign flip. ii) The output message for all other bits, including the two other suspect bits, will be: $Lleft,i=\beta max$ for positive input LLRS; $Lleft,i=-\beta max$ for negative input LLRs. E) If the flip-bit is not one of the three suspect bits, then: i) Compute $tmp=|Lin,sus-bit\ 1|+|Lin,sus-bit\ 2|+|Lin,sus-bit\ 3|$. ii) Set $\alpha c1$ from lookup table as in machine C2 for $min1=|Lin,flip-bit|$. iii) Compute $Lleft,i$ for flip-bit $Lleft,lip-bit=\alpha c1\cdot\{[|Lin,flip-bit|-tmp]\cdot sign(Lin,flip-bit)-Lin,flip-bit\}$. iv) Compute $Lleft,i$ for 3 suspect bits $Lleft,us-bit\ i=\alpha c1\cdot\{[tmp-|Lin,flip-bit|]\cdot sign(Lin,sus-bit\ i)-Lin,sus-bit\ i\}$. Compute right message $Lright,i=Lch,i+Lleft,i$.

Machine C2_light operates when the parity bit is zero ($p=0$) and the error syndrome is not equal to zero ($s\neq 0$). In this case, the C2_light machine tries to evaluate if the received word is two bits away from a legitimate codeword. For $p=0$, only an even number of flip bits are expected. For double flip bits, the ML hypothesis in the SISO decoder will be the hypothesis with a single suspect bit and the flip bit. The condition for operating machine C2_light is to check between the two flips hypothesis (e.g., one suspect bit and one flipped bit) and the next candidate hypothesis, which is the hypothesis with three suspect bits and one flip-bit (i.e., 4 flips overall). Hence the condition for the C2_light machine is: $\min j \in \{1 \text{ suspect hypothesis}\} |\text{Lin,sus-bit } j| + |\text{Lin,flip-bit}(j)| < \Sigma |\text{Lin,sus-bit } i| 4i=1$, where suspect bits in RHS are in ascending order of the LLRs absolute value.

Implementation wise: A) The C2_light machine may calculate flip bits for hypothesis with one suspect. B) Calculate absolute value of input LLR of flip bits. C) Check the condition: $\min j \in \{1 \text{ suspect hypothesis}\} |\text{Lin,sus-bit } j| + |\text{Lin,flip-bit}(j)| < \Sigma |\text{Lin,sus-bit } i| 4i=1$. If not satisfied, return false and send the data word to machine C2. D) Compute right message as in machine C2.

Machine C-Initialization, in HD mode, checks that the input Lin for the SISO decoder at the first iteration for all constituent codes is constant, effectively, so there are no "weak" bits for suspect bits. The C-Initialization machine goes over all constituent codes at the first iteration and for each word tries to extract the weak bits. This is done by error syndrome decoding the hard bits at the input. Three cases are handled in machine C-Initialization: 1) No error where the received word is a codeword then all bits will get the "high" score in the same direction as the input reliable bits. 2) Single error where the received word is one-bit from a codeword then flip-bit will get opposite "high" score while the rest of the bits will get "low" score in the same direction as the input. 3) Other errors where all bits will be indicated by "low" opposite score of the input.

Implementation wise: A) S=0, P=0 yields beta=10, Lout=10*sign. B) S!=0, valid flip-bit yields beta=1, Lout=1*sign, For flip-bit Lout=-7*sign. C) S!=0, flip-bit on short yields beta=-1, Lout=-1*sign. An SHPC encoder embodiment is disclosed herein. But embodiments are not limited thereto.

Figure 34:
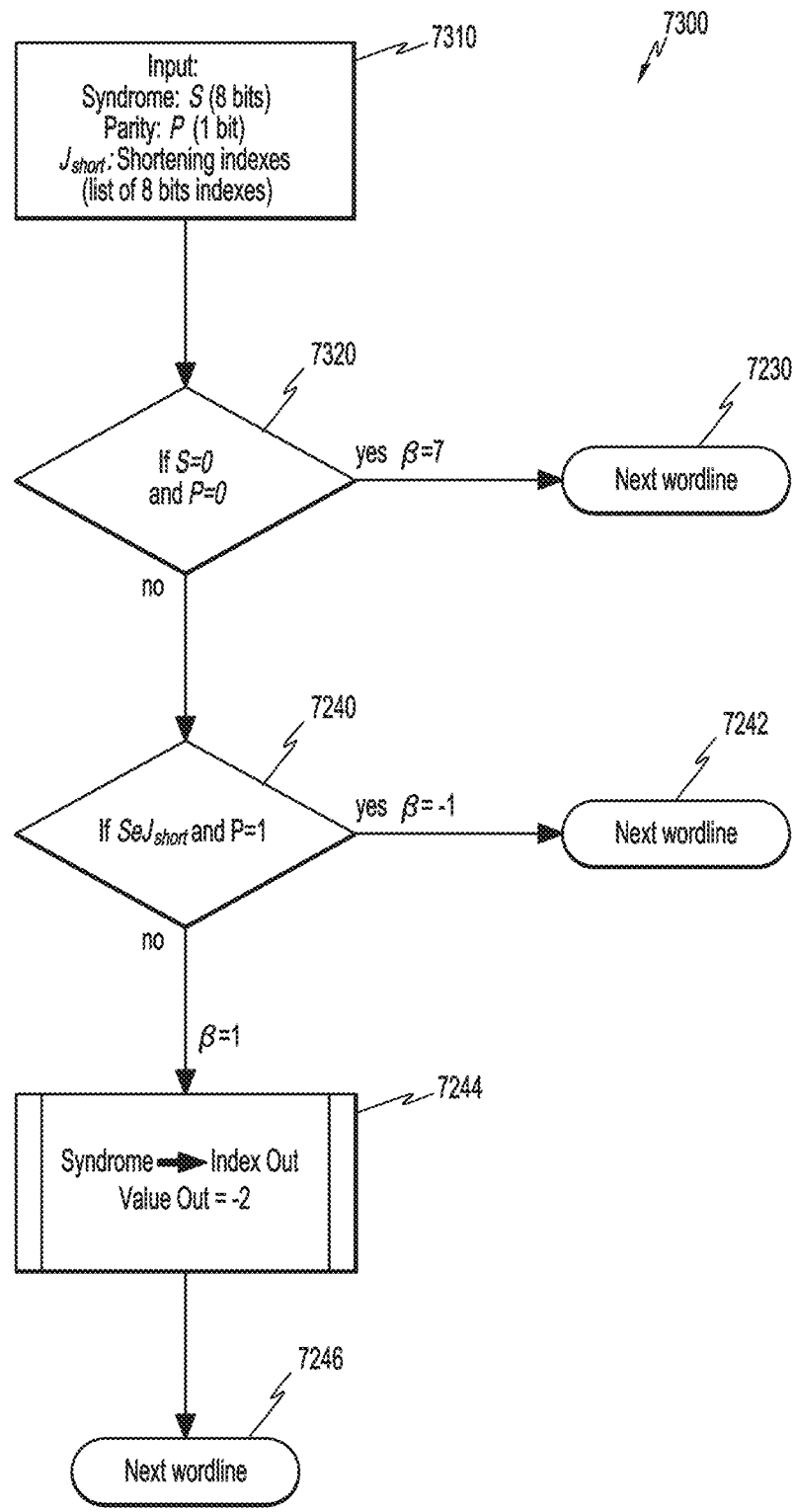
FIG. 34 is a flowchart diagram for operation of a machine-learning memory controller in accordance with an embodiment of the present disclosure.

As shown in FIG. 34, a C-Initialization machine initialization method is indicated generally by the reference numeral 7300. Here an input block 7310 receives input including an 8-bit error syndrome S, a 1-bit parity P, and a list of 8-bit shortening indexes $J_{short}$. The input block 7310 passes control to a decision block 7320 that determines if s=0 and p=0. If so, control is passed with beta=7 to a block 7230 to receive the next word-line. If not, control is passed to another decision block 7240 that determines if $Sel_{short}$ and P=1. If so, control is passed with beta=-1 to a block 7242 to receive the next word-line. If not, control is passed with beta=1 to a function block 7244, which first assigns the error syndrome to the index_out, and the value_out=-2, and then passes control to a block 7246 to receive the next word-line.

Figure 35:
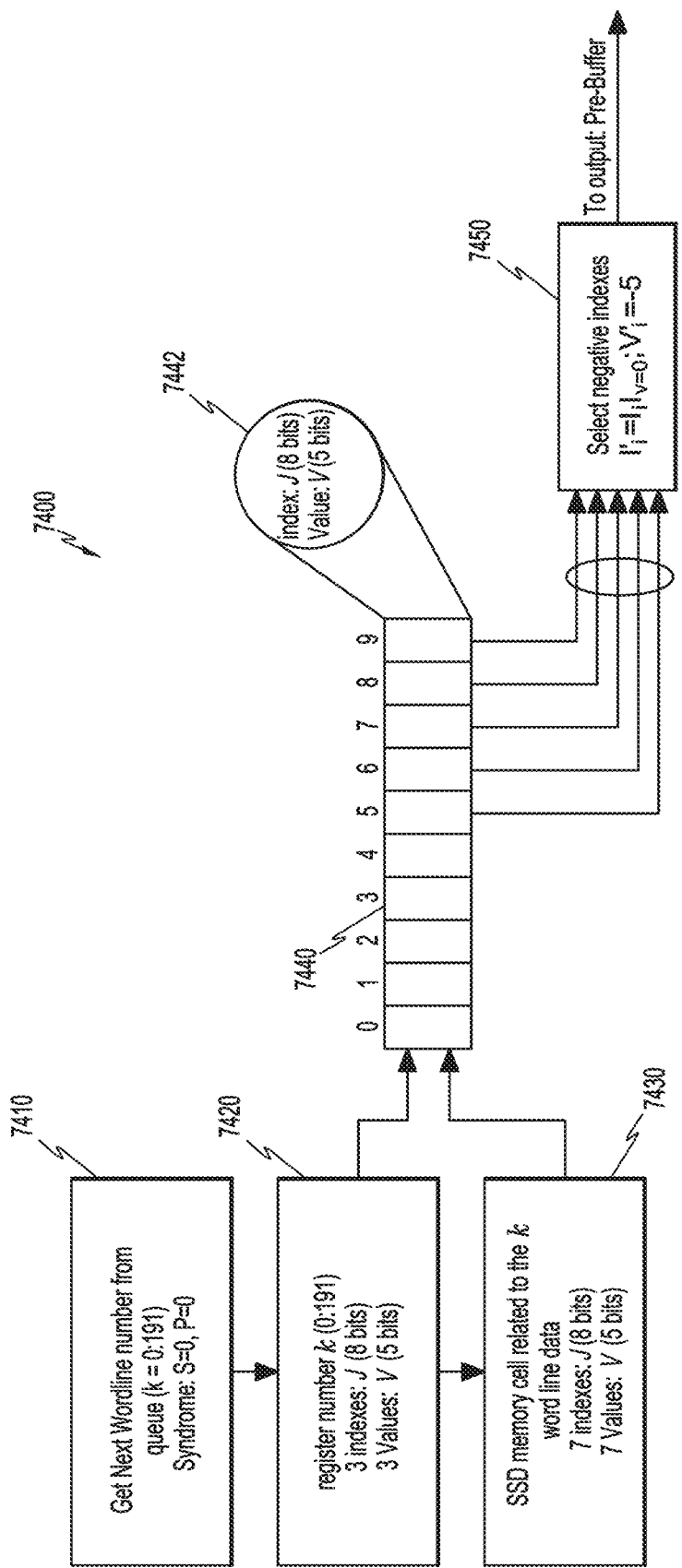
FIG. 35 is a block diagram of a machine-learning memory controller in accordance with an embodiment of the present disclosure.

Turning to FIG. 35, a C0 machine is indicated generally by the reference numeral 7400. The C0 machine includes a machine unit 7410 that gets the next word-line number from a queue where k=0:191, error syndrome s=0 and p=0. The machine unit 7410 is connected to a machine unit 7420, which provides to both a next machine unit 7430 and a queue 7440 a register number k (0:191), 3 indexes J (8 bits), and 3 values V (5 bits). The machine unit 7420 is connected to a machine unit 7430, which provides to the queue 7440 an SSD memory cell related to the k word-line data, 7 indexes J (8 bits), and 7 values V (5 bits). The queue 7440 includes a plurality of slots 7442, such as 0 to 191 slots where slots 0 to 9 are illustrated for ease of description. Each slot 7442 includes an index J (8 bits) and a corresponding value V (5 bits), without limitation thereto. A machine unit 7450 is connected to the queue 7440, and receives a plurality of slots 7442 to select negative indexes and provide output to a pre-buffer, for example.

Figure 36:
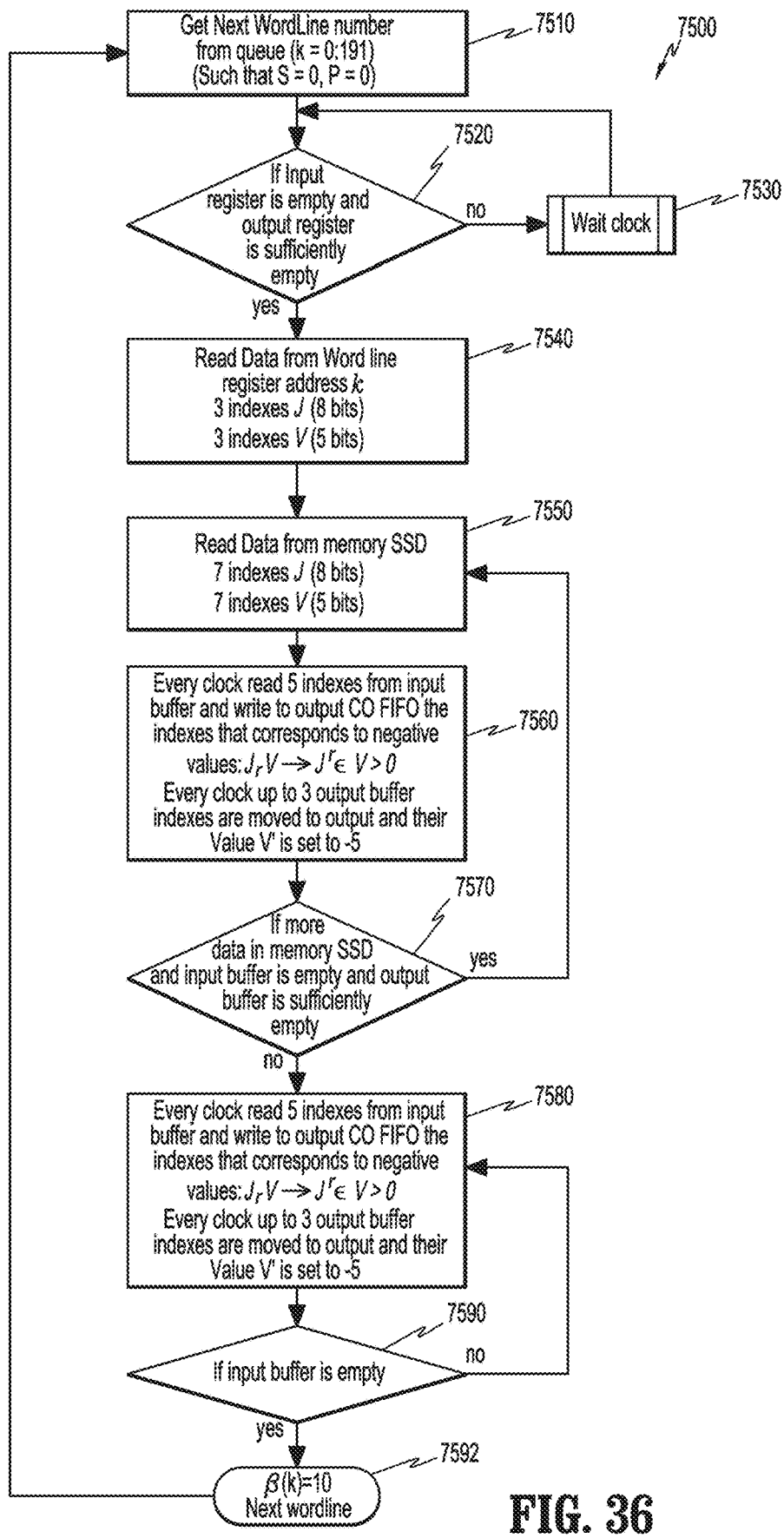
FIG. 36 is a flowchart diagram for operation of a machine-learning memory controller in accordance with an embodiment of the present disclosure.

Turning now to FIG. 36, an operating method of the C0 machine is indicated generally by the reference numeral 7500. The method 7500 includes a function block 7510 to get the next word-line number from the queue, where k=0:191 such that s=0 and p=0. The function block 7510 passes control to a decision block 7520. The decision block 7520 determines whether the input register is empty and the output register is sufficiently empty. If not, the decision block 7520 passes control to a wait clock block 7530 which passes control back to the decision block 7520. But if so, the decision block 7520 passes control to an I/O block 7540 to read data from the word-line including register address k, 3 indexes J (8 bits) and 3 corresponding values V (5 bits). The I/O block 7540 passes control to an I/O block 7550.

The I/O block 7550 reads data from memory SSD including 7 indexes J (8 bits) and 7 corresponding values V (5 bits), and passes control to a function block 7560. Every clock period, the function block 7560 reads 5 indexes from the input buffer and writes output to the C0 FIFO including the indexes that correspond to negative values, where every clock period up to 3 output buffer indexes are moved and their value V is set to −5. The function block 7560 passes control to a decision block 7570. If there is more data in the memory SSD, the input buffer is empty and the output buffer is sufficiently empty, it passes control back to the I/O block 7550; but if not, it passes control to a function block 7580.

Every clock period, the function block 7580 reads 5 indexes from the input buffer and writes output to the C0 FIFO buffer including the indexes J that correspond to negative values V. Every clock period, up to 3 output buffer indexes are moved to output and their values V are set to −5. The function block 7580, in turn, passes control to a decision block 7590, which determines whether the input buffer is empty. If not, it passes control back to the function block 7580; but if so, it passes control to a function block 7592. The function block 7592 increments the index to the next word-line, and passes control back to the function block 7510.

Figure 37:
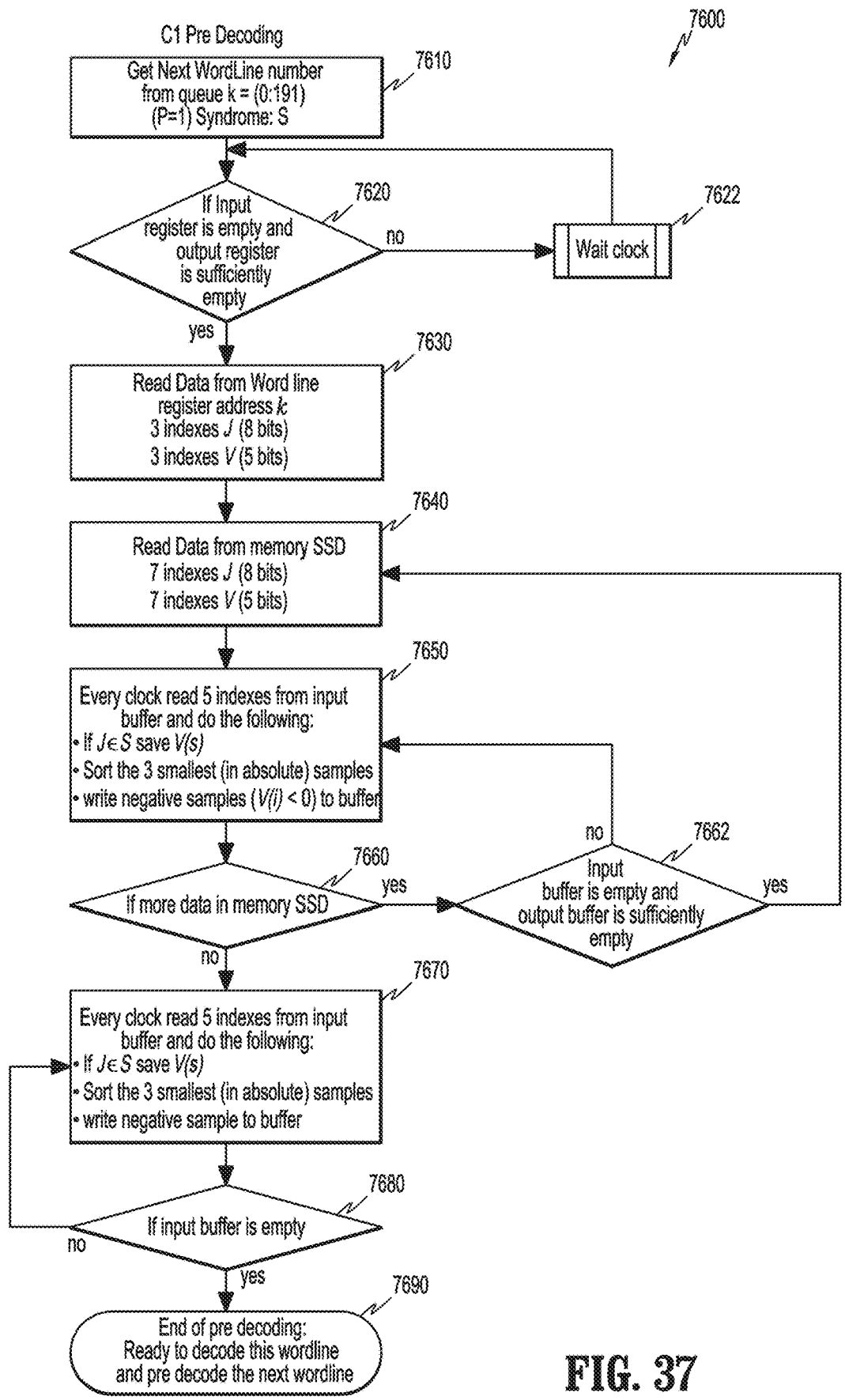
FIG. 37 is a flowchart diagram for operation of a machine-learning memory controller in accordance with an embodiment of the present disclosure.

As shown in FIG. 37, an operating method of the C1 machine for pre-decoding is indicated generally by the reference numeral 7600. The method 7600 is a pre-decoding method that includes a function block 7610 to get the next word-line number from the queue, where k=0:191 such that P=1. The function block 7610 passes control to a decision block 7620. The decision block 7620 determines whether the input register is empty and the output register is sufficiently empty. If not, the decision block 7620 passes control to a wait clock block 7622, which passes control back to the decision block 7620. But if so, the decision block 7620 passes control to an I/O block 7630 to read data from the word-line including register address k, 3 indexes J (8 bits) and 3 corresponding values V (5 bits). The I/O block 7630 passes control to an I/O block 7640.

The I/O block 7640 reads data from memory SSD including 7 indexes J (8 bits) and 7 corresponding values V (5 bits), and passes control to a function block 7650. Every clock period, the function block 7650 reads 5 indexes from the input buffer, saves the values V if the indexes J are elements of the syndrome S, sorts the three smallest absolute value samples, and writes negative samples to the buffer. The function block 7650 passes control to a decision block 7660. If there is more data in the memory SSD, control is passed to a decision block 7662; but if not then control is passed to a function block 7670. Decision block 7662 determines if the input buffer is empty and the output buffer is sufficiently empty and the output buffer is sufficiently empty. If so, it passes control back to the I/O block 7640; but if not, it passes control back to function block 7650.

Every clock period, the function block 7670 reads 5 indexes from the input buffer, saves the values V if the indexes J are elements of the syndrome S, sorts the three smallest absolute value samples, and writes negative samples to the buffer. The function block 7670, in turn, passes control to a decision block 7680, which determines whether the input buffer is empty. If not, it passes control back to the function block 7670; but if so, it passes control to a function block 7690, which marks the end of pre-decoding, readiness to decode this word-line and readiness to pre-decode the next word-line.

Figure 38:
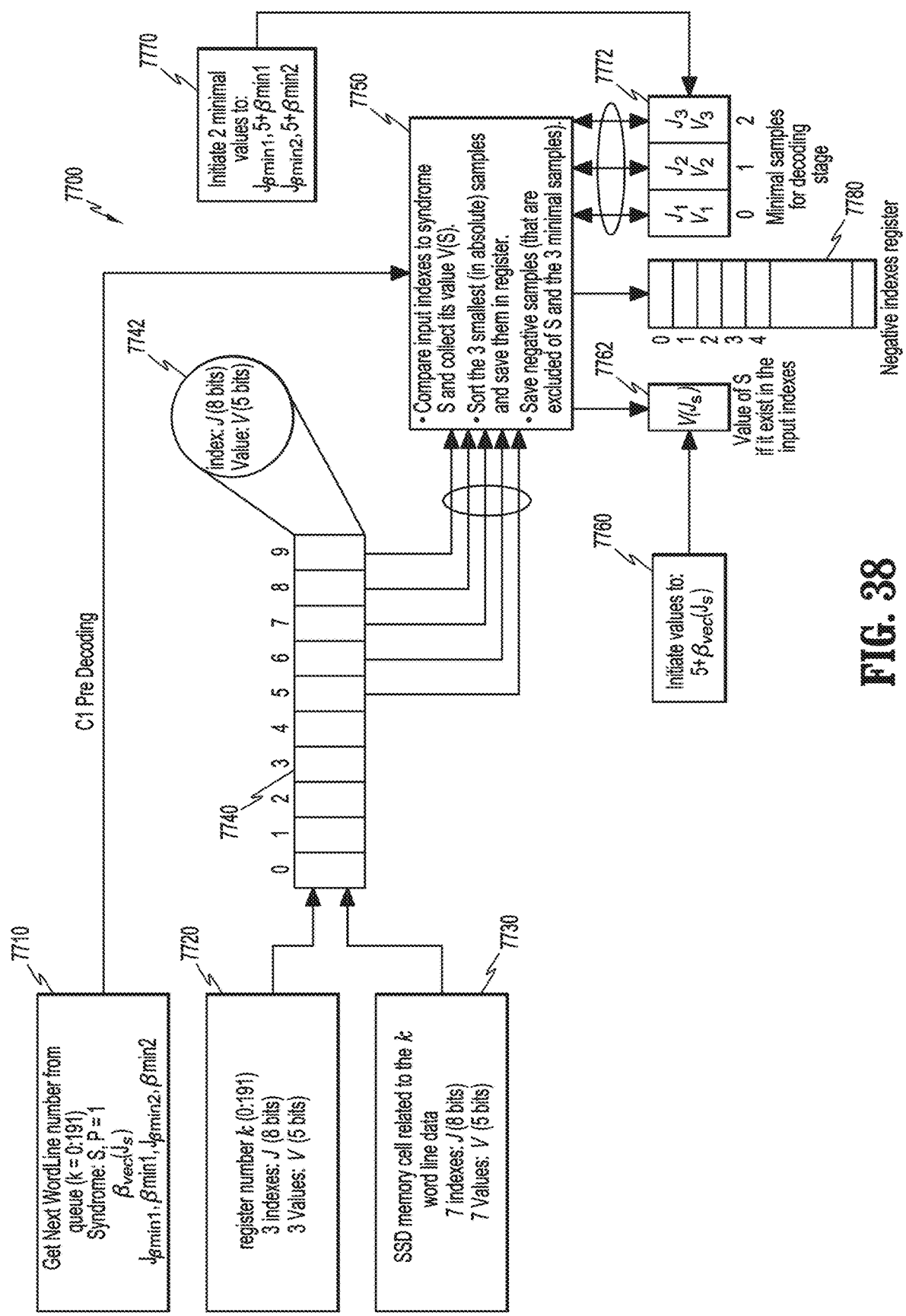
FIG. 38 is a block diagram of a machine-learning memory controller in accordance with an embodiment of the present disclosure.

Turning to FIG. 38, a C1 machine for pre-decoding is illustrated generally by the reference numeral 7700. The C1 machine includes a machine unit 7710 to get the next word-line number from a queue where k=0:191, error syndrome S and P=1. The machine unit 7710 passes control to a machine unit 7750. A machine unit 7720 provides to a queue 7740 a register number k (0:191), 3 indexes J (8 bits), and 3 values V (5 bits). A machine unit 7730 provides to the queue 7740 an SSD memory cell related to the k word-line data, 7 indexes J (8 bits), and 7 values V (5 bits). The queue 7740 includes a plurality of slots 7742, such as 0 to 191 slots where slots 0 to 9 are illustrated for ease of description. Each slot 7742 includes an index J (8 bits) and a corresponding value V (5 bits), without limitation thereto. The machine unit 7750 is connected to the queue 7740, and receives a plurality of slots 7742.

Figure 39:
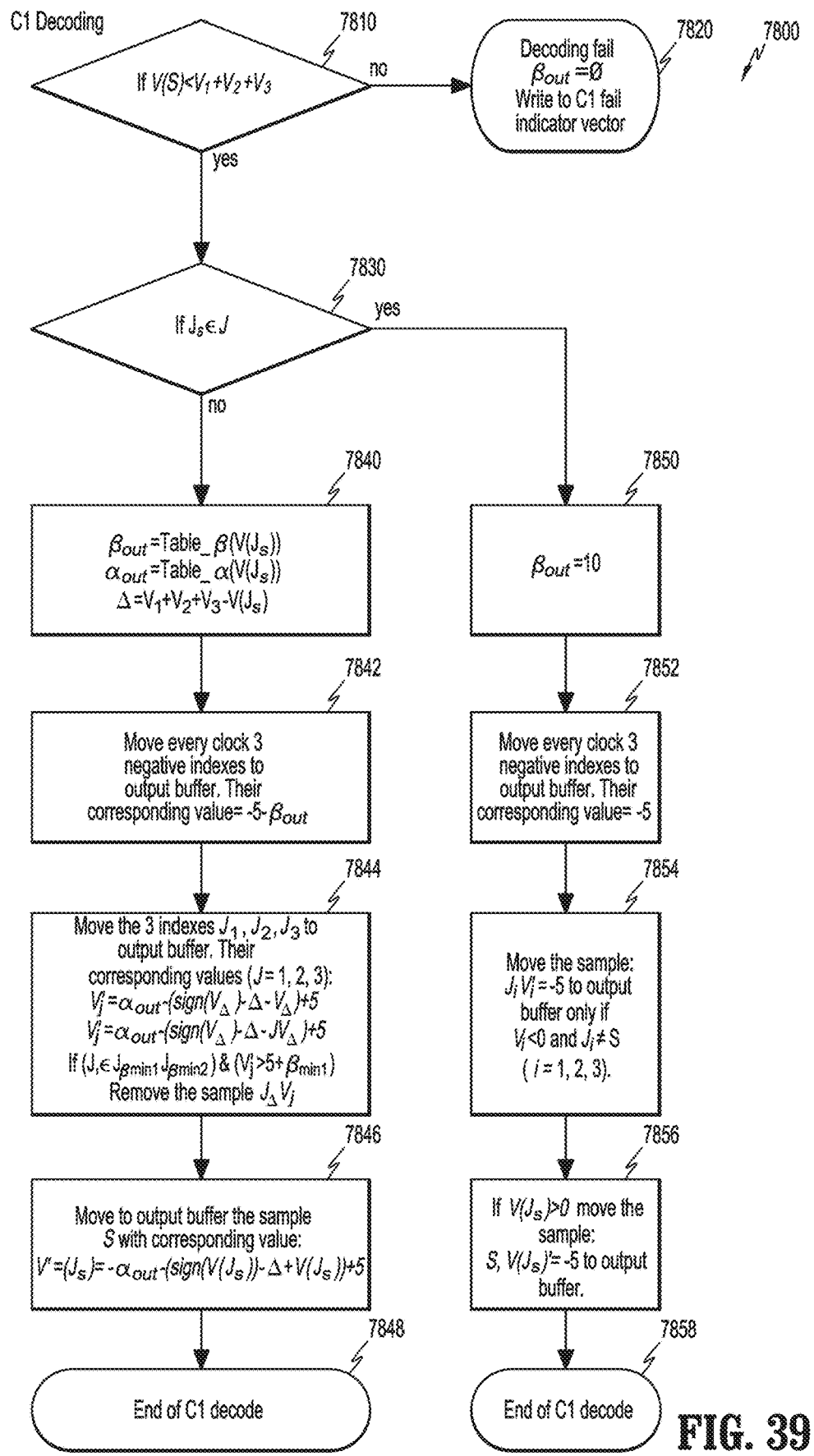
FIG. 39 is a flowchart diagram for operation of a machine-learning memory controller in accordance with an embodiment of the present disclosure.

Turning now to FIG. 39, a decoding method of a C1 machine is indicated generally by the reference numeral 7800. Here, a decision block 7810 determines if decoding may proceed based on a value V(S). If not, it passes control to an output block 7820 to indicate a decoding failure and write to a C1 machine failure indicator vector. But if so, it passes control to a decision block 7830 which determines whether a syndrome index is an element of the syndromes. If so, control is passed to a function block 7850 that sets beta output to a fixed value, which passes control to a function block 7852 to move negative indexes to the output buffer on every third clock and fix a corresponding value, which passes control to a function block 7854 to move the sample to the output buffer only if the value is negative and the index is not the same as the syndrome, which passes control to a function block 7856 to move the sample to the output buffer if the value of the index is positive, which, in turn, passes control to an end block 7858 which marks the completion of the C1 machine decoding.

If the decision block 7830 determines that syndrome index is not an element of the syndromes, it passes control to a function block 7840. The function block 7840 sets the beta output to the beta table value for the index of the syndrome, sets the alpha output to the alpha table value for the index of the syndrome, sets the delta output to the sum of the values less the value for the index of the syndrome, and passes control to a function block 7842. The function block 7842 moves negative indexes to the output buffer on every third clock, fixes a corresponding value less the beta output, and passes control to a function block 7844. The function block 7844 moves the first three indexes to the output buffer, determines their corresponding values, removes the corresponding samples, and passes control to a function block 7846. The function block 7846, in turn, moves the sample having a corresponding value to the output buffer, and passes control to an end block 7848, which marks completion of the C1 machine decoding.

Figure 40:
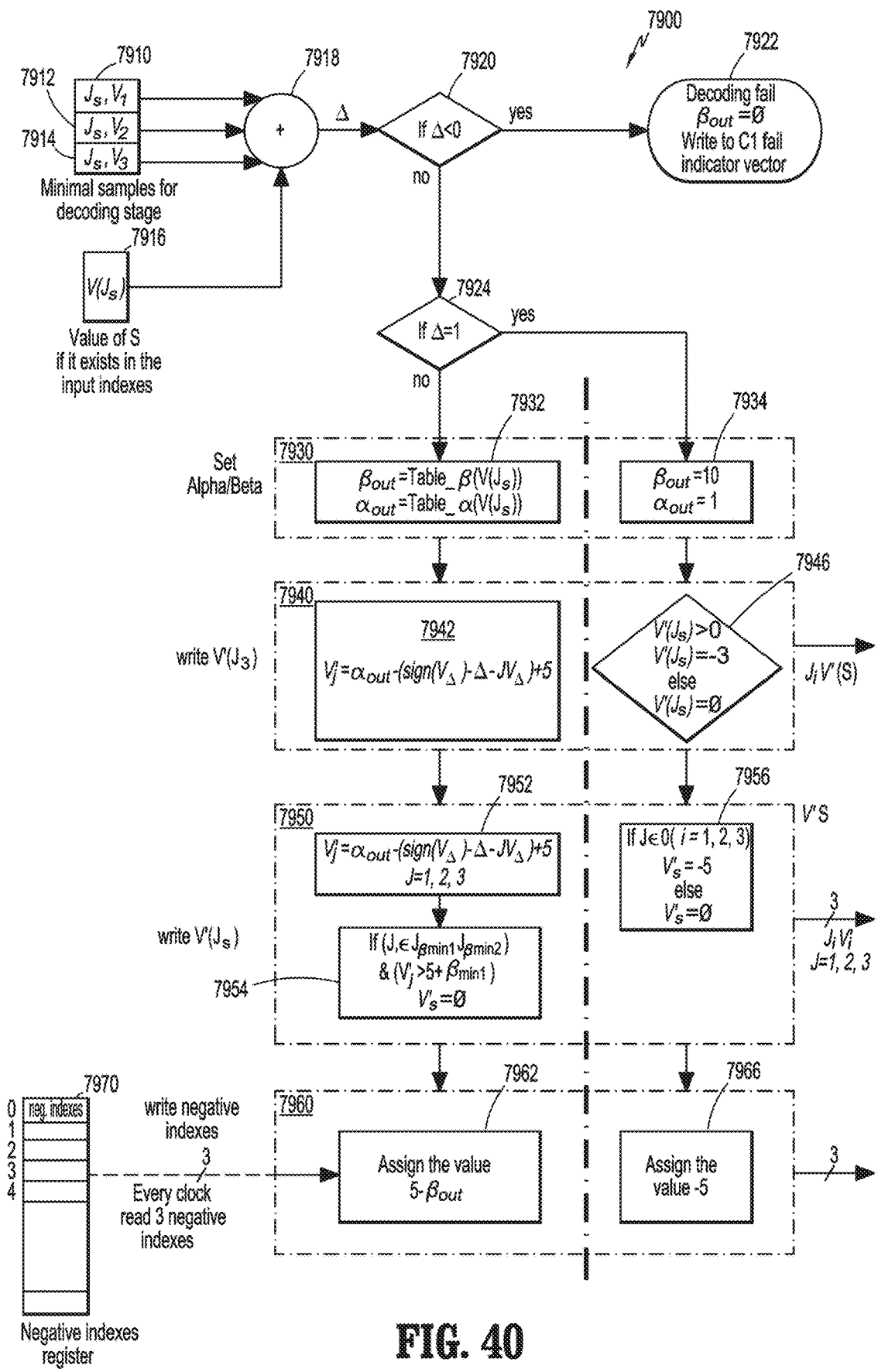
FIG. 40 is a hybrid diagram of a machine-learning memory controller in accordance with an embodiment of the present disclosure.

As shown in FIG. 40, a machine-learning memory controller is indicated generally by the reference numeral 7900. Input blocks 7910, 7912, 7914, which may receive minimal samples for the decoding stage, and 7916, which may receive a value of the syndrome if it exists in the input indexes, are received at operation block 7918, which passes control to a decision block 7920. If the 7920 result is true, then control passes to an output block 7922 to indicate a decoding failure with a corresponding indictor vector. If the 7920 result is false, then control passes to another decision block 7924. If, in turn, the 7924 result is true, then control passes to a function block 7932 of an Alpha/Beta unit 7930. If the 7924 result is false, then control passes to a function block 7936 of the Alpha/Beta unit 7930. The function block 7932 passes control to a function block 7942 of a write unit 7940. The function block 7936 passes control to a decision block 7946 of the write unit 7940. The function block 7942 passes control to a function block 7952 of a write unit 7950, which, in turn, passes control to a function block 7954 of the write unit 7950. If the 7946 result is true, the write unit 7940 provides an output. If the 7946 result is false, control is passed to a function block 7956 of the write unit 7950. The function block 7954 passes control to a function block 7962 of a negative indexes write unit 7960, which also receives input from a negative indexes register 7970. The function block 7956 passes control to a function block 7966 of the negative indexes write unit 7960, which provides an output.

Figure 41:
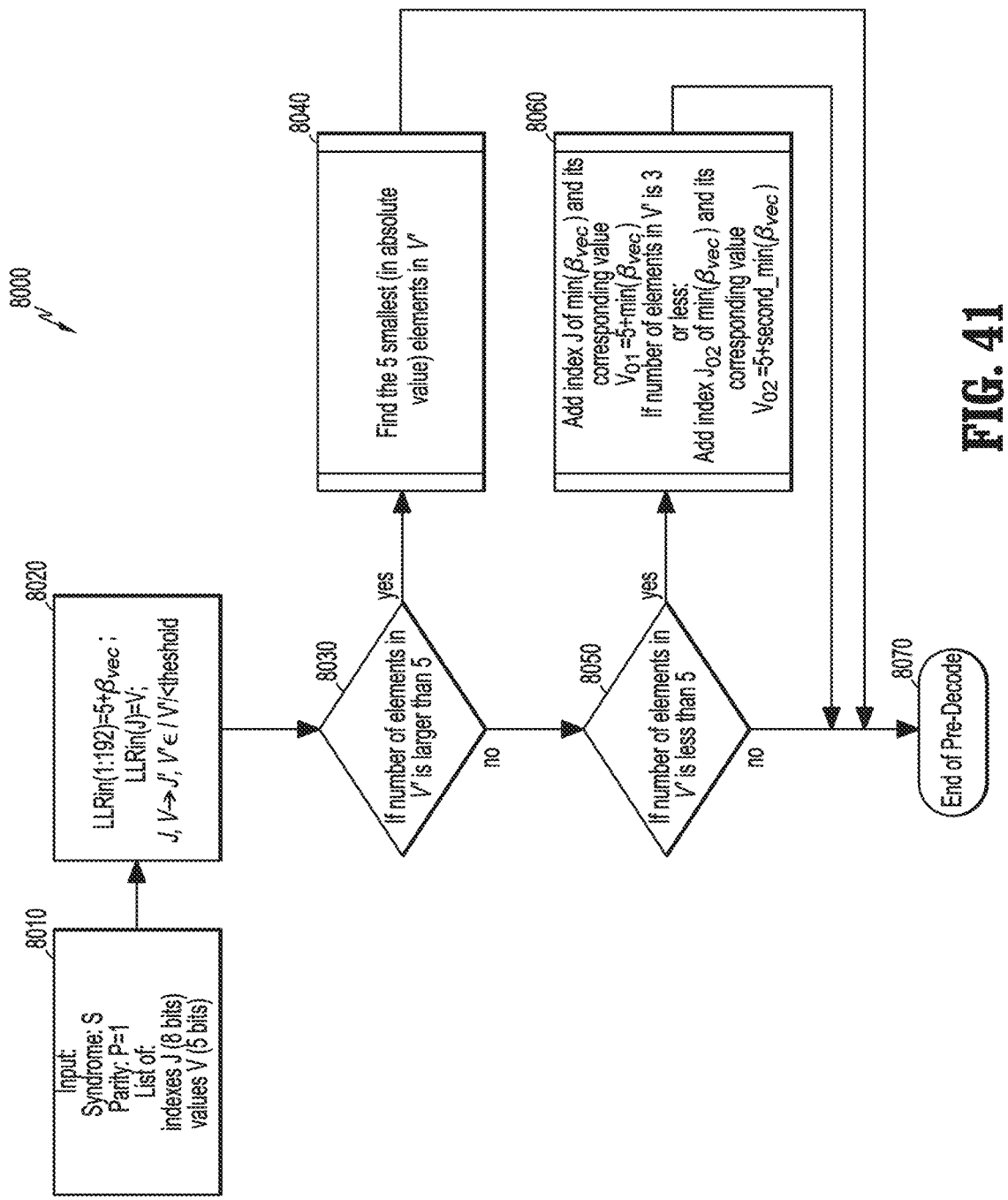
FIG. 41 is a flowchart diagram for operation of a machine-learning memory controller in accordance with an embodiment of the present disclosure.

Turning to FIG. 41, a machine-learning memory controller is indicated generally by the reference numeral 8000. A function block 8010 receives a syndrome, parity, indexes and values, and passes control to a function block 8020. The function block 8020 processes an LLRin vector, and passes control to a decision block 8030. If the 8030 result is true, control passes to a subroutine 8040 to find the five smallest elements, and then to end block 8070. If the 8030 result is false, control passes to decision block 8050 to determine if the number of elements is less than five. If the 8050 result is true, control passes to a subroutine 8060 to add an index, and then to the end block 8070. If the 8050 result is false, control passes to the end block 8070 at the end of pre-decode routine.

Figure 42:
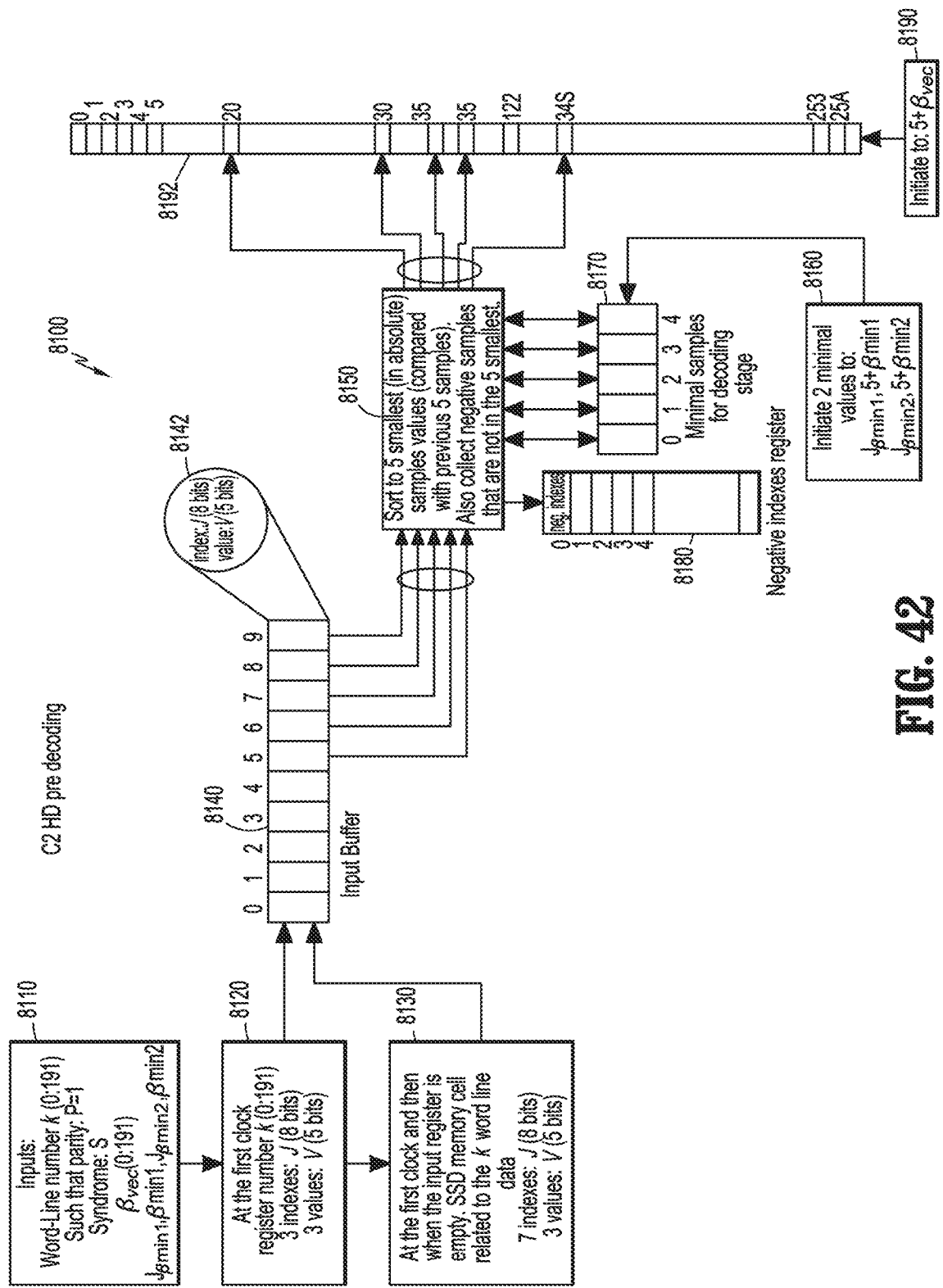
FIG. 42 is a block diagram of a machine-learning memory controller in accordance with an embodiment of the present disclosure.

Turning now to FIG. 42, a machine-learning memory controller is indicated generally by the reference numeral 8100. A function block 8110 receives a word-line number, parity and syndrome, and passes control to a function block 8120. The function block 8120 operates at a first clock, outputs to an input buffer 8140, and passes control to a function block 8130. The function block 8130 operates at the first clock and when the input buffer is empty, and outputs to the input buffer 8140. The input buffer 8140 incudes 10 index and value pairs 8142. A function block 8150 receives the oldest five pairs 8142 from the input buffer. A function block 8160 initiates two minimal values and outputs to a length five buffer 8170. An initialization block 8190 initiates an output interface 8192. The function block 8150 exchanges minimal samples for a decoding stage with the length five buffer 8170, and outputs to a negative indexes register 8180 and to the output interface 8192.

Figure 43:
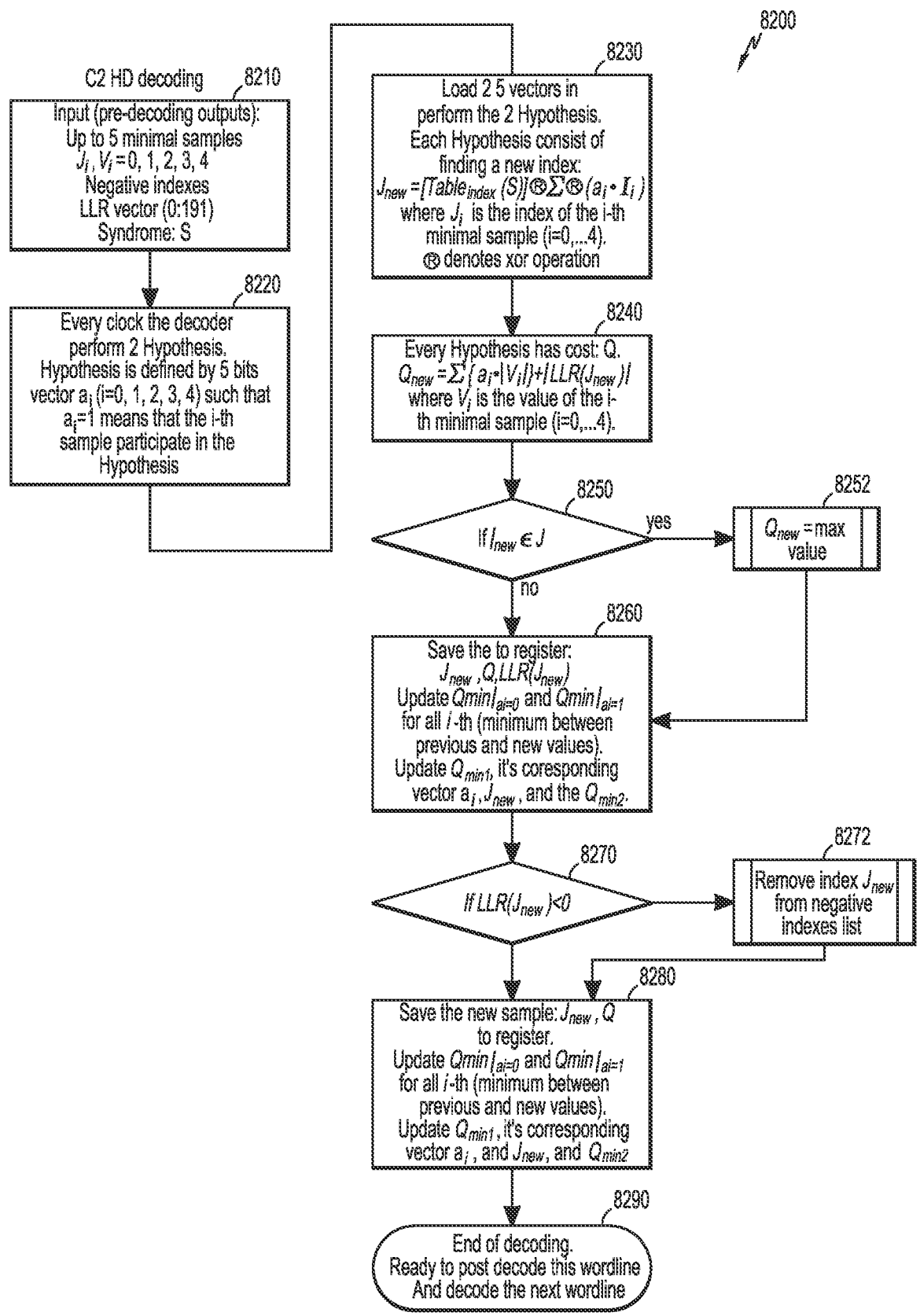
FIG. 43 is a flowchart diagram for operation of a machine-learning memory controller in accordance with an embodiment of the present disclosure.

As shown in FIG. 43, operation of a machine-learning memory controller for HD decoding by a C2 machine is indicated generally by the reference numeral 8200. A function block 8210 receives inputs such as pre-decoding outputs including up to three minimal samples, index values, negative indexes, an LLR vector and a syndrome, and passes control to a function block 8220. The function block 8220 initializes two hypotheses on every clock cycle, where each hypothesis is defined by a 5-bit vector indicative of samples participating in the hypothesis, and passes control to a function block 8230, which, in turn, loads the two 5-bit vectors to perform the two hypotheses, and passes control to a function block 8240. The function block 8240 determines the cost of each hypothesis, and passes control to a decision block 8250. If the 8250 result is true, control is passed to a subroutine block 8252 to determine a maximum value, and thence to a function block 8260. If the 8250 result is false, control is passed directly to the function block 8260. The function block 8260 saves the LLR to a register, updates the cost, and passes control to a decision block 8270 to compare the LLR. If the 8270 result is true, control is passes to a subroutine block 8272, and thence to a function block 8280. If the 8270 result is false, control passes directly to the function block 8280. The function block 8280, in turn, saves the sample and update its cost, and passes control to an end block 8290 which marks the completion of C2 HD decoding for this word-line, readiness to post-decode this word-line, and readiness to decode the next word-line.

Figure 44:
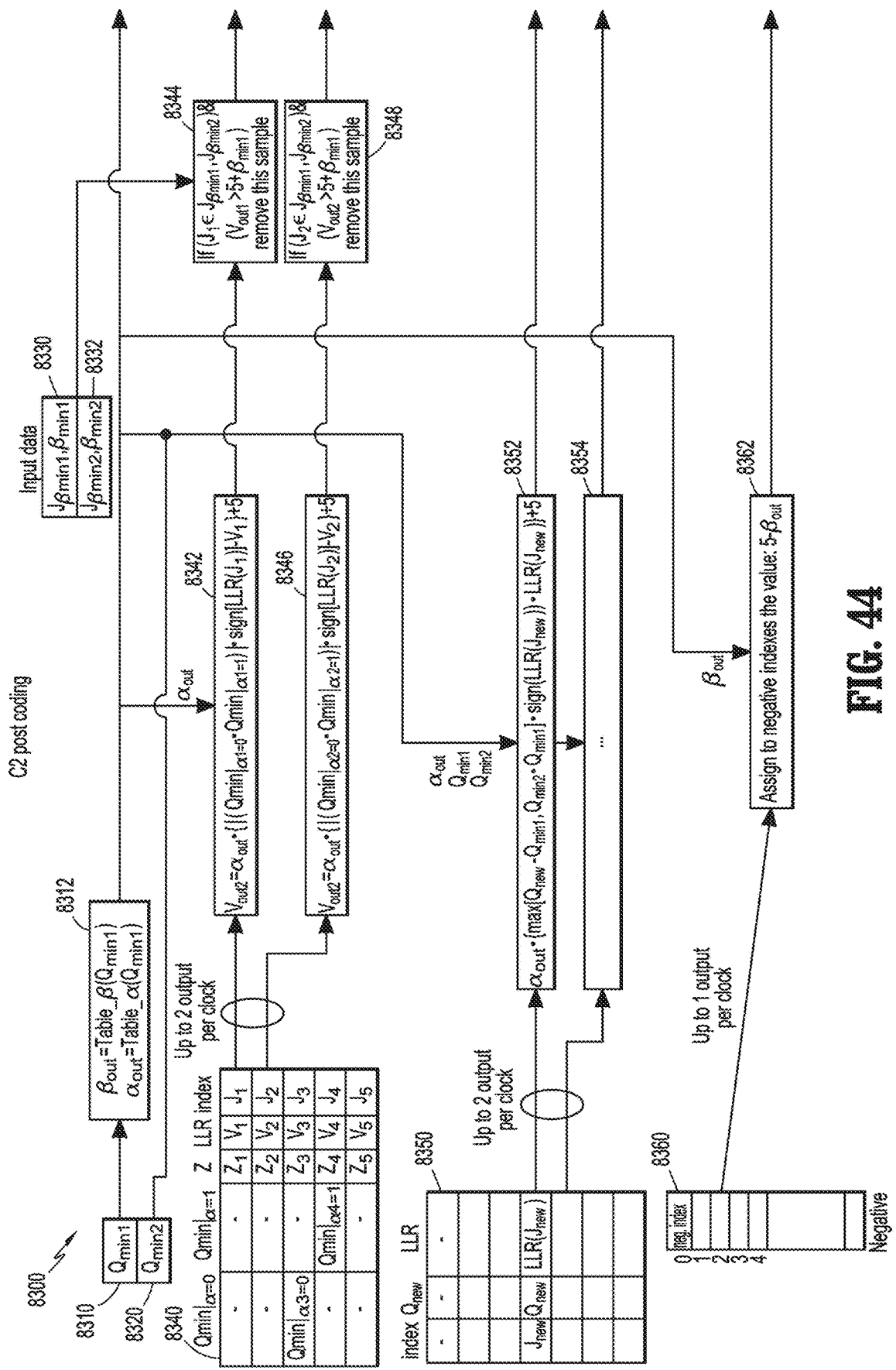
FIG. 44 is a hybrid diagram of a machine-learning memory controller in accordance with an embodiment of the present disclosure.

Turning to FIG. 44, a machine-learning memory controller for machine C2 post coding is indicated generally by the reference numeral 8300. Scaler inputs 8310, 8320, 8330, 8332 are provided, as are vector inputs 8340, 8350 and 8360. A function block 8312 processes the input 8310, and outputs to function blocks 8342, 8352 and 8362. The function block 8342 receives the output from 8312 and an input from 8340, and provides outputs to function blocks 8344 to remove a sample and to 8346. The function block 8346 receives the output from 8342 and an input from 8340, and provides output to function block 8348 to remove a sample. The function block 8352 receives the output from 8312 and an input from 8350, and provides an output to function block 8354. The function block 8354 receives the output from 8352 and an input from 8350, and provides an output. The function block 8362 receives the output from 8312 and an input from 8360, and provides an output.

Figure 45:
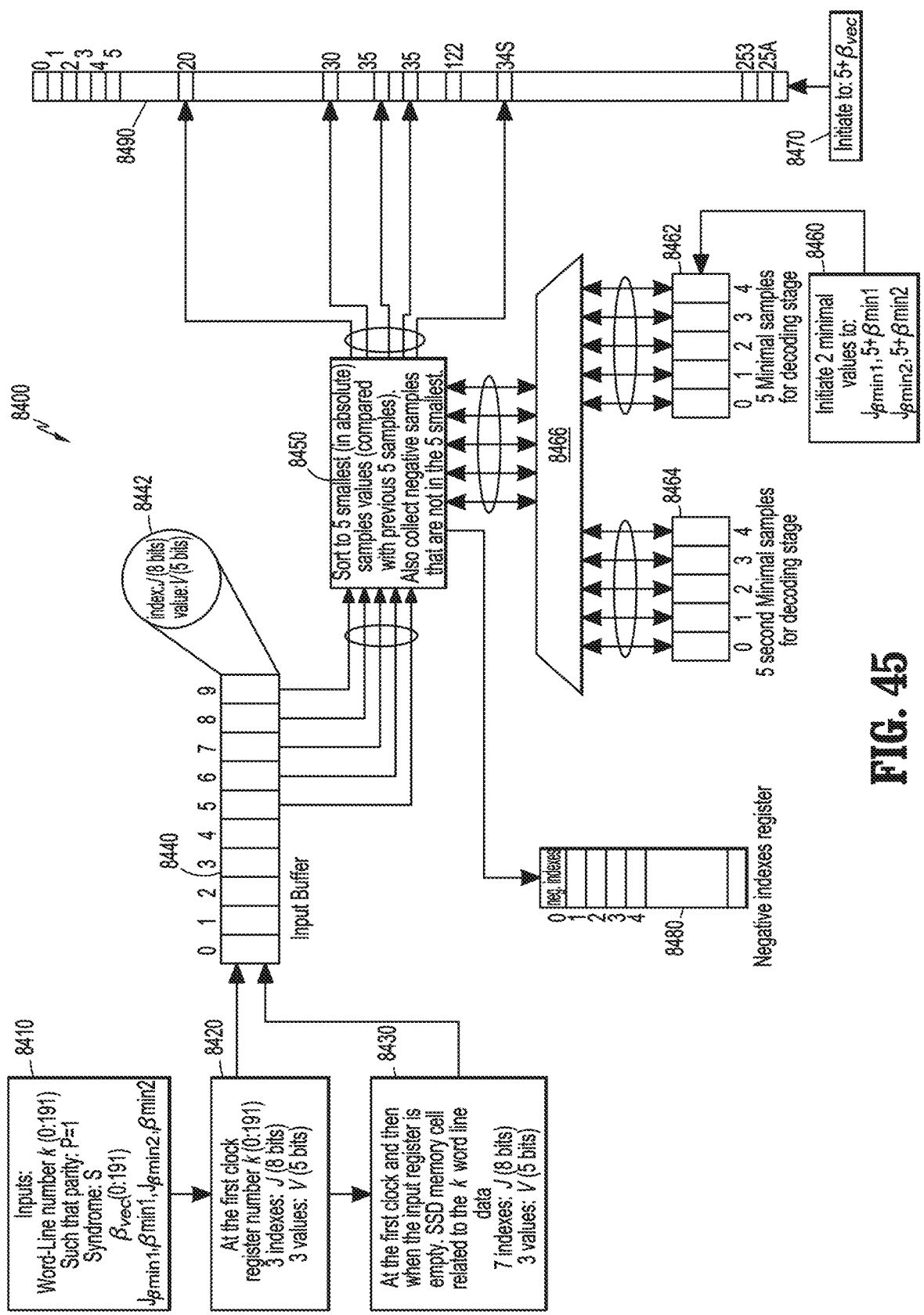
FIG. 45 is a block diagram of a machine-learning memory controller in accordance with an embodiment of the present disclosure.

Turning now to FIG. 45, a machine-learning memory controller is indicated generally by the reference numeral 8400. A function block 8410 receives a word-line number, parity, and syndrome, and passes control to a function block 8420. The function block 8420 operates at a first clock, outputs to an input buffer 8440, and passes control to a function block 8430. The function block 8430 operates at the first clock and when the input buffer is empty, and outputs to the input buffer 8440. The input buffer 8440 incudes 10 index and value pairs 8442. A function block 8450 receives the oldest five pairs 8442 from the input buffer. A function block 8460 initiates two minimal values and outputs to a length five buffer 8462. An initialization block 8470 initiates an output interface 8490. The function block 8450 exchanges minimal samples for a decoding stage with the length five buffer 8462 and a second length five buffer 8464 via a multiplexer/demultiplexer 8466, and outputs to a negative indexes register 8480 and to the output interface 8490.

Figure 46:
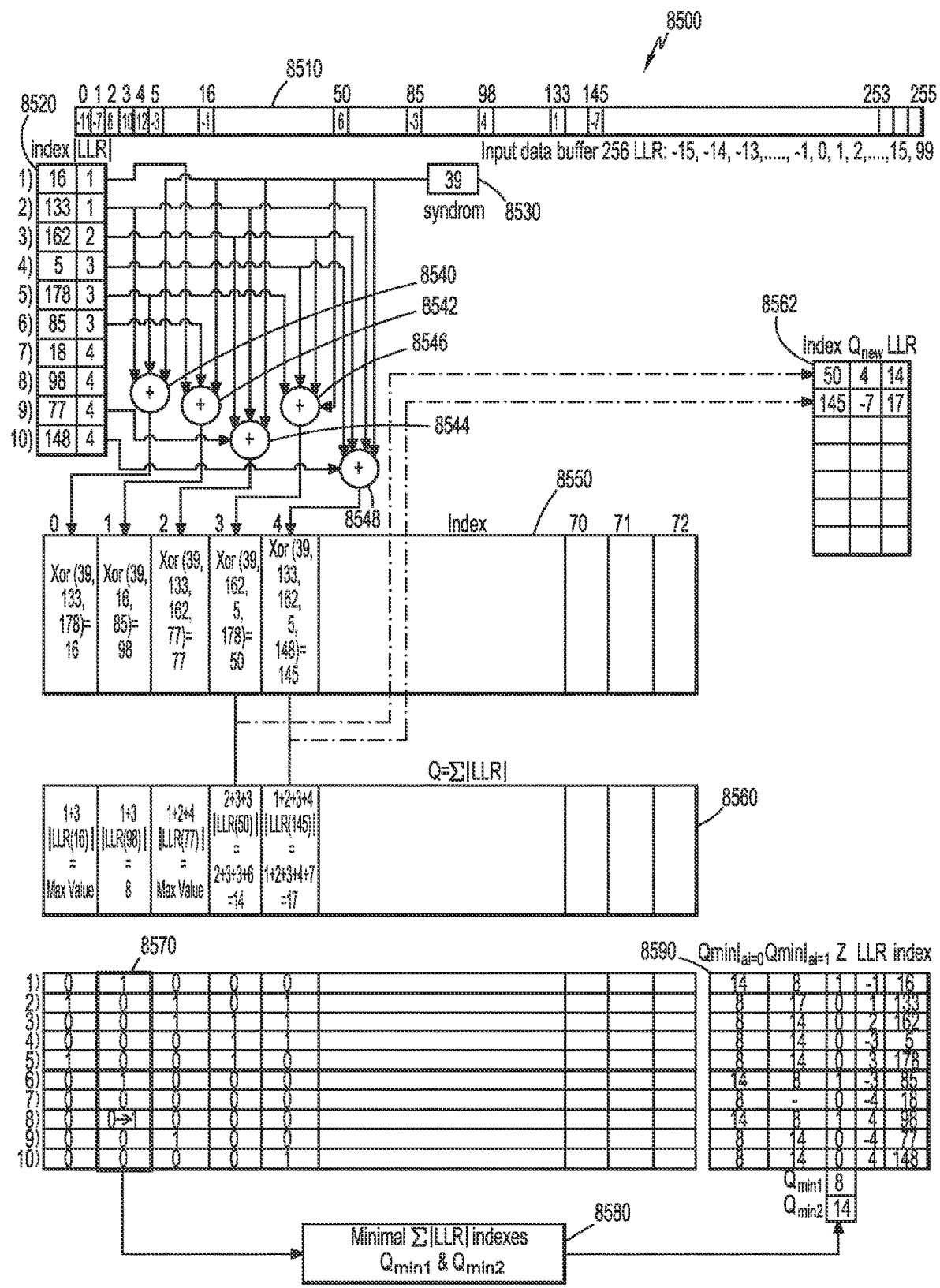
FIG. 46 is a block diagram of a machine-learning memory controller in accordance with an embodiment of the present disclosure.

As shown in FIG. 46, a machine-learning memory controller is indicated generally by the reference numeral 8500. The controller includes an input data buffer 8510. a two column input matrix buffer 8520 provides signals to summing junctions 8540, 8542, 8544, 8546 and 8548, which also receive a syndrome signal from a syndrome buffer 8530. The summing junction results are fed to an index buffer 8550, which provides outputs to an index matrix 8562 and to a summation buffer 8560. A binary matrix buffer 8570 provides input to a minimization function 8580, which, in turn, provides output to a Q matrix 8590.

Figure 47:
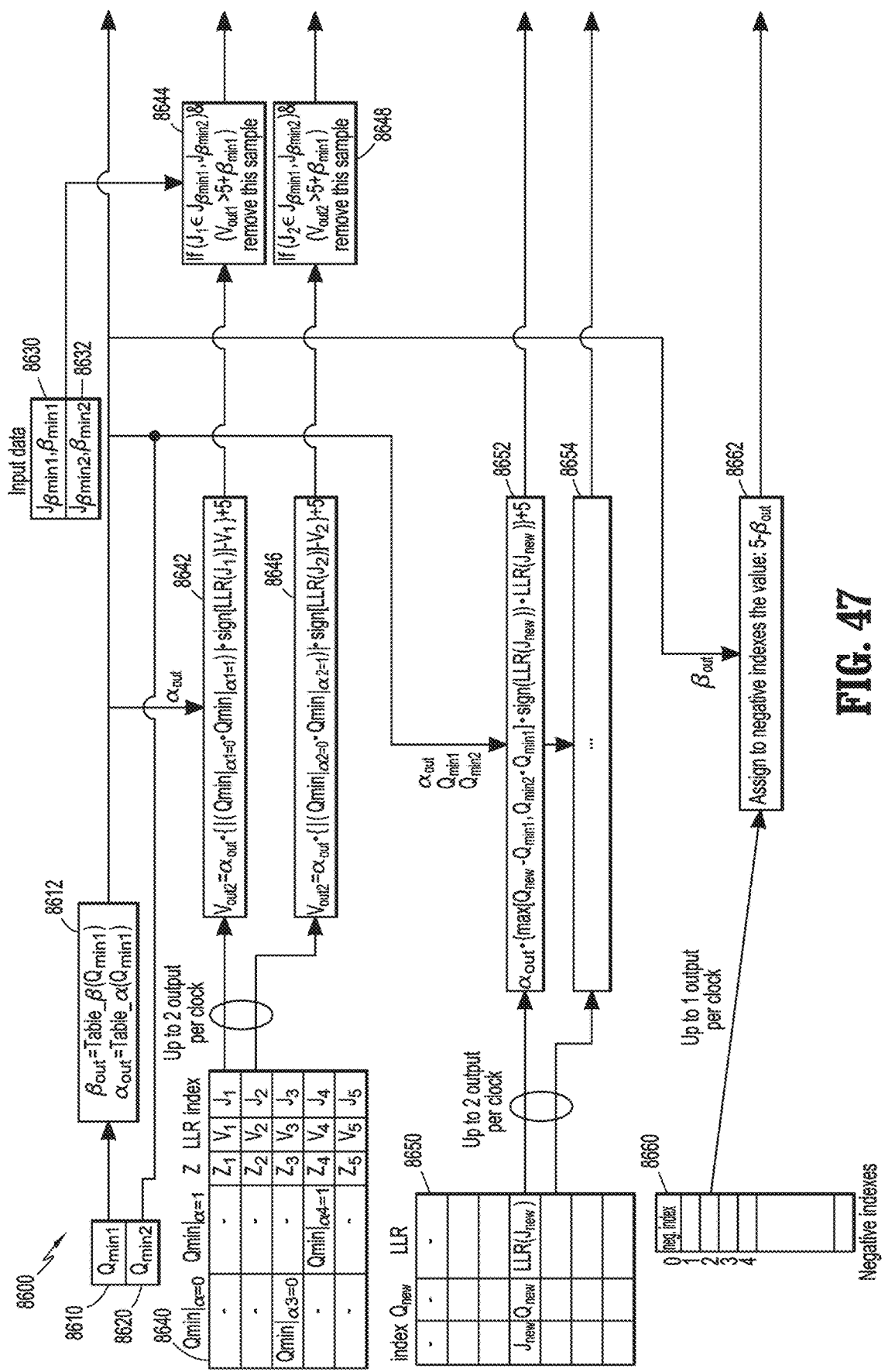
FIG. 47 is a hybrid diagram of a machine-learning memory controller in accordance with an embodiment of the present disclosure.

Turning to FIG. 47, a machine-learning memory controller is indicated generally by the reference numeral 8600. Scaler inputs 8610, 8620, 8630 and 8632 are provided, as are vector inputs 8640, 8650 and 8660. A function block 8612 processes the input 8610, and outputs to function blocks 8642, 8652 and 8662. The function block 8642 receives the output from 8612 and an input from 8640, and provides outputs to function blocks 8644 to remove a sample and to 8646. The function block 8646 receives the output from 8642 and an input from 8640, and provides output to function block 8648 to remove a sample. The function block 8652 receives the output from 8612 and an input from 8650, and provides an output to function block 8654. The function block 8654 receives the output from 8652 and an input from 8650, and provides an output. The function block 8662 receives the output from 8612 and a negative index input from 8660, and provides an output.

Figure 48:
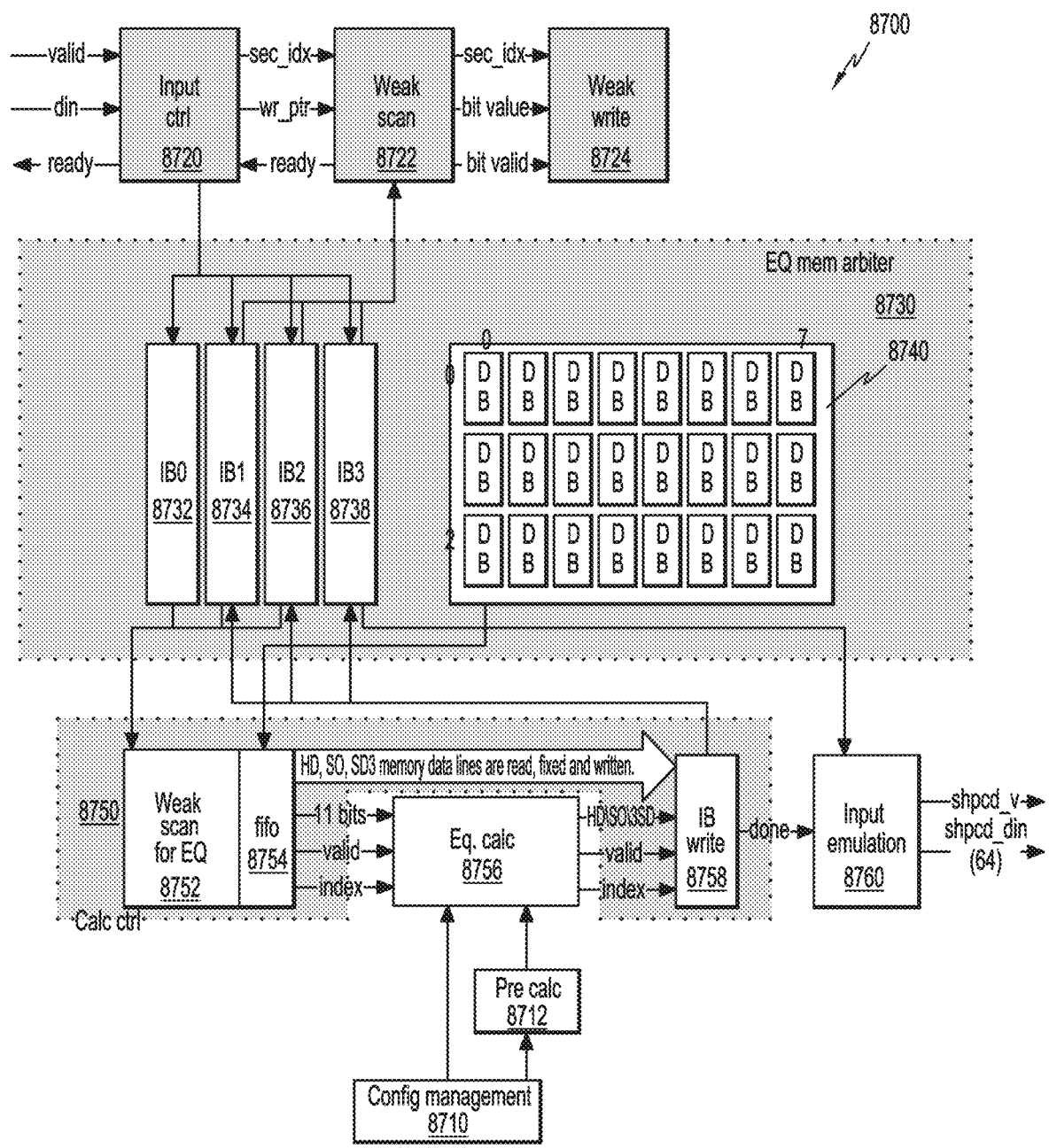
FIG. 48 is a block diagram of equalizer hardware for a machine-learning memory controller in accordance with an embodiment of the present disclosure.

Turning now to FIG. 48, equalizer hardware for a machine-learning memory controller is indicated generally by the reference numeral 8700. The hardware embodiment of FIG. 48 is functionally similar to the embodiment of FIG. 13, so duplicate description may be omitted.

An input control circuit 8720 is connected to four input buffers (IB) 8732, 8734, 8736 and 8738 of an equalizer (EQ) memory arbiter 8730. The last three input buffers 8734, 8736 and 8738 are connected to a weak scan circuit 8722, which, in turn, is connected to a weak write circuit 8724. The weak write circuit 8724 is connected to a three by eight flip-flop matrix 8740 of the EQ memory arbiter 8730. The matrix 8740, in turn, is connected to a FIFO buffer 8754 of a calculation control circuit 8750. The first three input buffers 8732, 8734 and 8736 are connected to a weak scan for EQ sub-circuit 8752 of the calculation control circuit 8750. The FIFO buffer 8754 is connected to an equalization calculation circuit 8756, and to an IB write sub-circuit 8758 of the calculation control circuit 8750. The IB write sub-circuit 8758 is connected to the last three input buffers 8734, 8736 and 8738, as well as to an input emulation circuit 8760. A configuration management circuit 8710 is connected to a pre-calculation circuit 8712, both of which are connected to the equalization calculation circuit 8756.

Figure 49:
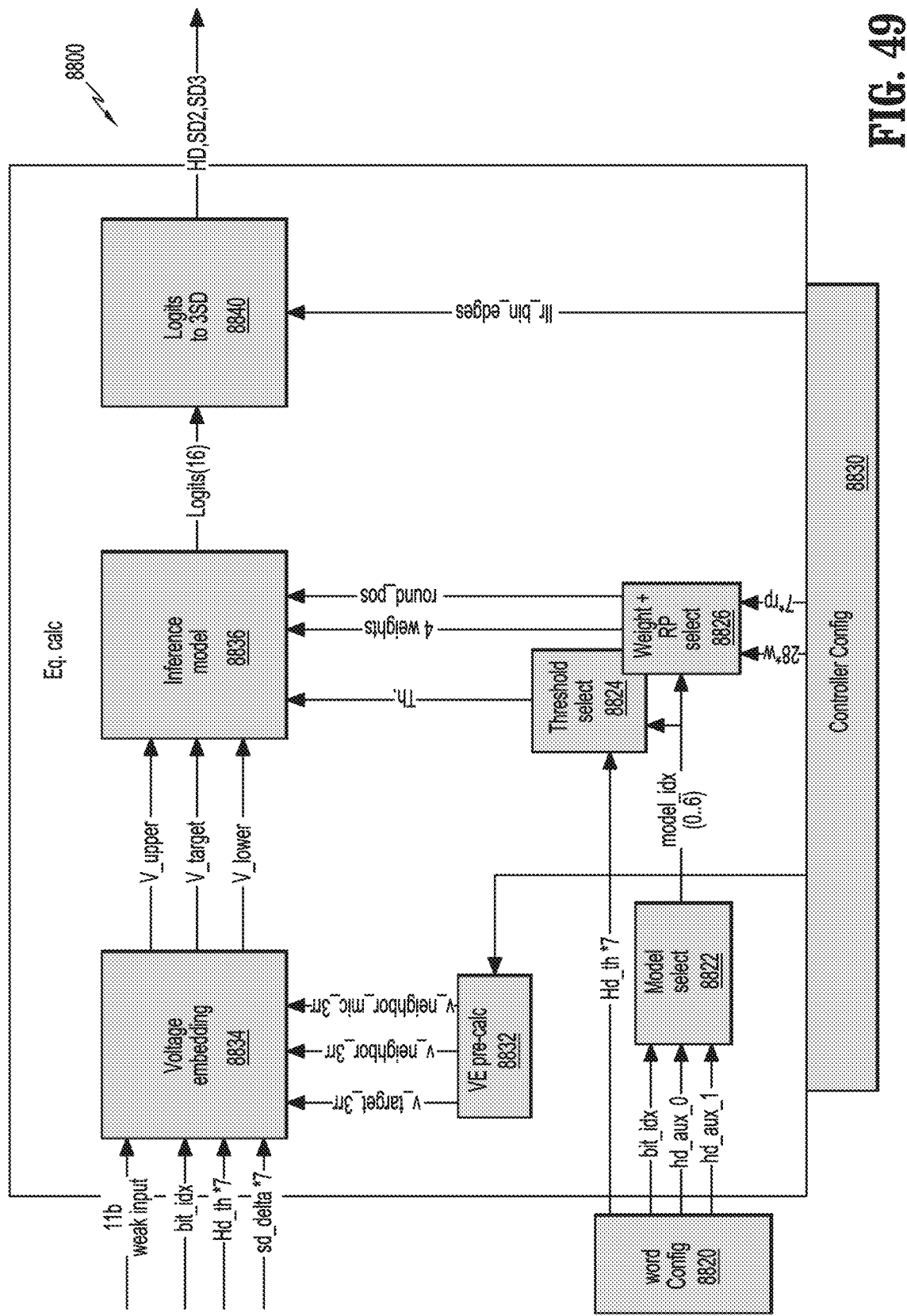
FIG. 49 is a block diagram of equalizer hardware for a machine-learning memory controller in accordance with an embodiment of the present disclosure.

As shown in FIG. 49, equalizer hardware for a machine-learning memory controller is indicated generally by the reference numeral 8800. The hardware embodiment of FIG. 49 is functionally similar to the embodiment of FIG. 14, so duplicate description may be omitted.

An equalizer calculation circuit 8810 is connected to a word configuration circuit 8820 and a controller configuration circuit 8830. The equalizer calculation circuit 8810 includes a model selection sub-circuit 8822 connected between the word configuration circuit 8820 and a weight selection sub-circuit 8826, a threshold selection sub-circuit 8824 connected between the word configuration circuit 8820 and an interface model sub-circuit 8836, a pre-calculation sub-circuit 8832 connected between the controller configuration circuit 8830 and a voltage embedding sub-circuit 8834, and a logits to 3SD sub-circuit 8840 connected between the interface model sub-circuit 8836 and an output channel for HD, SD2 and SD3 data.

Referring to FIGS. 40 through 49, in operation, embodiments of the present disclosure may support tests in SSD/UFS between the NAND and the controller. For example, when performing a data read from the NAND to the controller in SSD, an embodiment may detect whether an increase in the number of read bit errors causes the controller to apply additional read commands for neighbor word-lines, such as at adjacent NAND addresses. Similarly, an embodiment may provide high SSD/UFS reliability.

Figure 50:
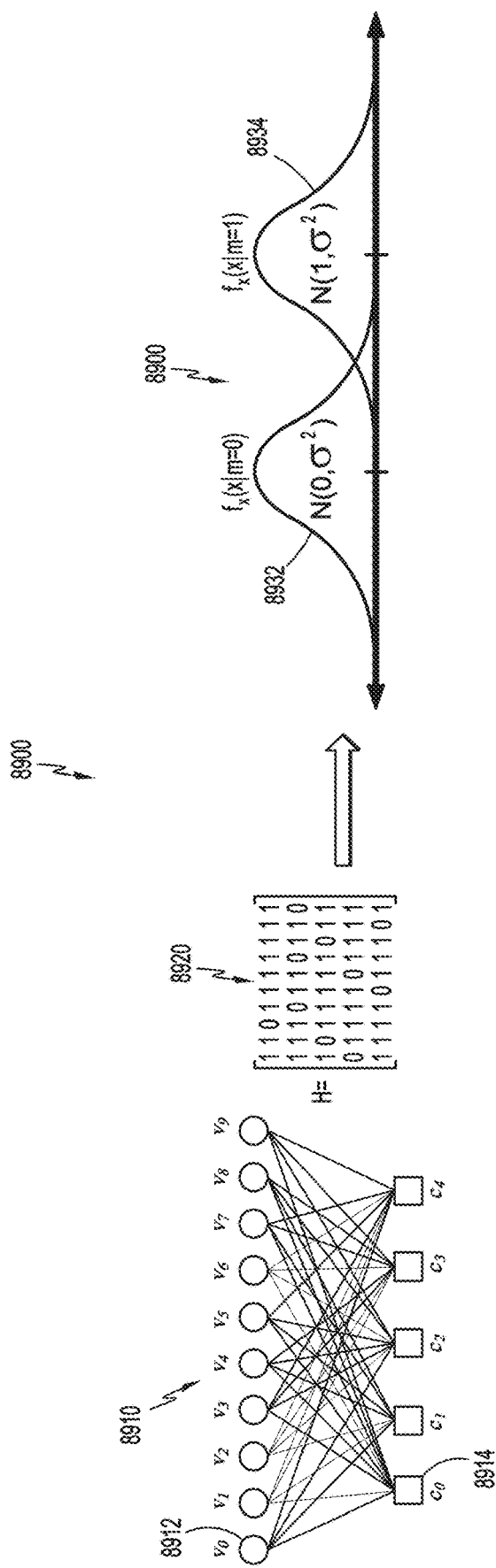
FIG. 50 is a hybrid diagram that shows a brief overview of a universal algorithm based on a theoretical Additive white Gaussian noise (AWGN) channel in accordance with an embodiment of the present disclosure.

Turning to FIG. 50, a universal algorithm is indicated generally by the reference numeral 8900. The universal algorithm 8900 may be based on BCH, RS, LDPC, or the like. Encoded data 8910, including values v0-v9 indicated by 8912 and codes c0-c4 indicated by 8914 are decoded with the matrix H indicated by 8920. The decoded result 8930 includes those bits decoded as 0 indicated by 8932 and those bits decoded as 1 indicated by 8934. For maximum correctability measured on a theoretical Additive white Gaussian noise (AWGN) channel, the coverage is bounded by a residual bit error rate (RBER) of about 8.5e-3 when applied to a TLC overhead (OH) NAND Flash memory, for example. TLC OH refers to the spare memory cells that may be used for ECC parity bits. TLC NAND Flash memory may have three bits or eight levels per cell. However, NAND Flash memory need not be limited to correctability based on a theoretical AWGN channel.

Figure 51:
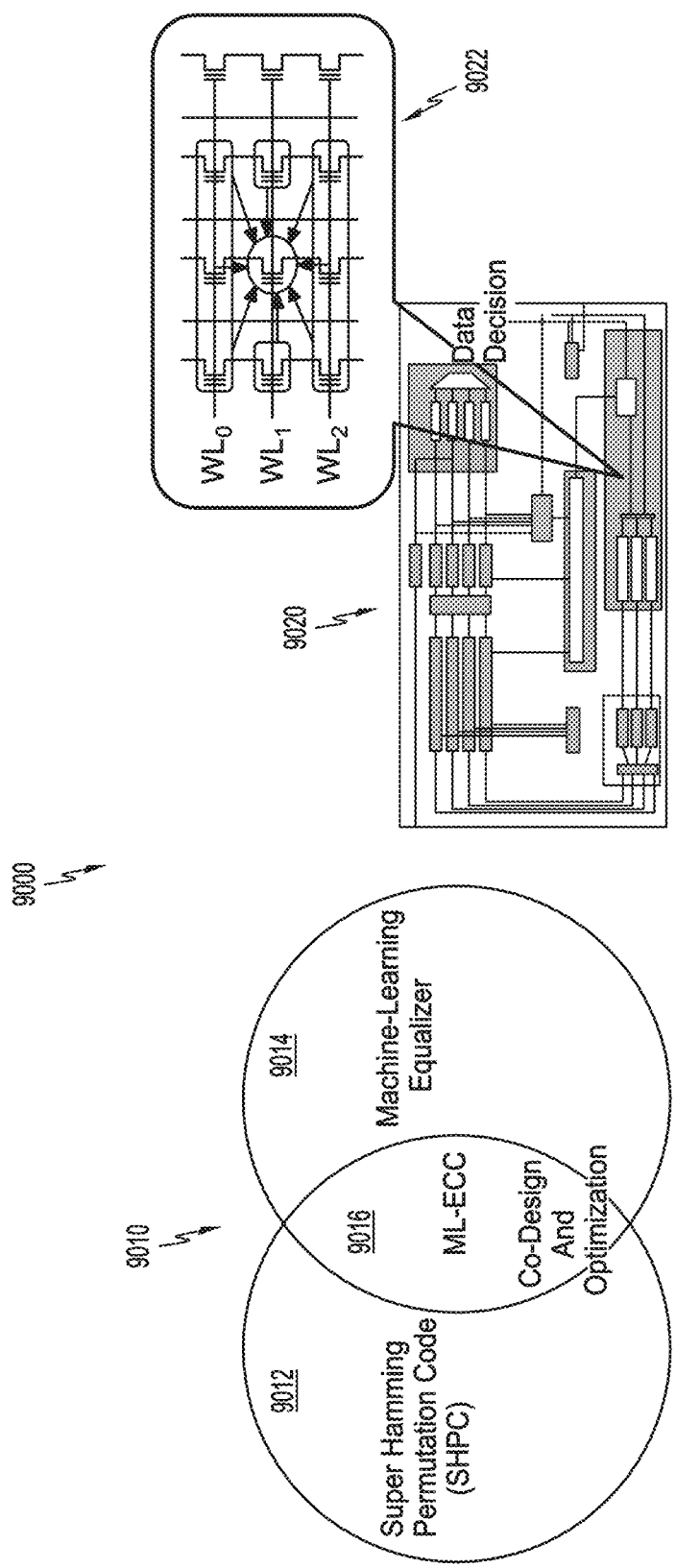
FIG. 51 is a hybrid diagram that shows a machine-learning memory controller in accordance with an embodiment of the present disclosure.

Turning now to FIG. 51, a machine-learning (ML) memory controller is indicated generally by the reference numeral 9000. The ML controller 9000 includes a soft Hamming permutation code (SHPC) decoder 9012, an ML equalizer 9014, and a co-designed and optimized ML-ECC decoder 9016. The ML-ECC 9016 decoder includes an ML-ECC circuit 9020 having a neighbor-based data decision portion 9022. In this embodiment, the SHPC ECC decoder 9012 is used for HD mode, which may provide speed-optimized HD throughput coverage with low gate-count and low power with a 4 KB-codeword, for example. Moreover, the ML equalizer is used for SD mode, which may provide correctability-optimized NAND-aware decoding based on neighbor cells. In alternate embodiments, the ML-ECC 9016 and circuit 9020 may be trained and fit to various Flash memory architectures such as NAND Flash, without limitation thereto.

Figure 52:
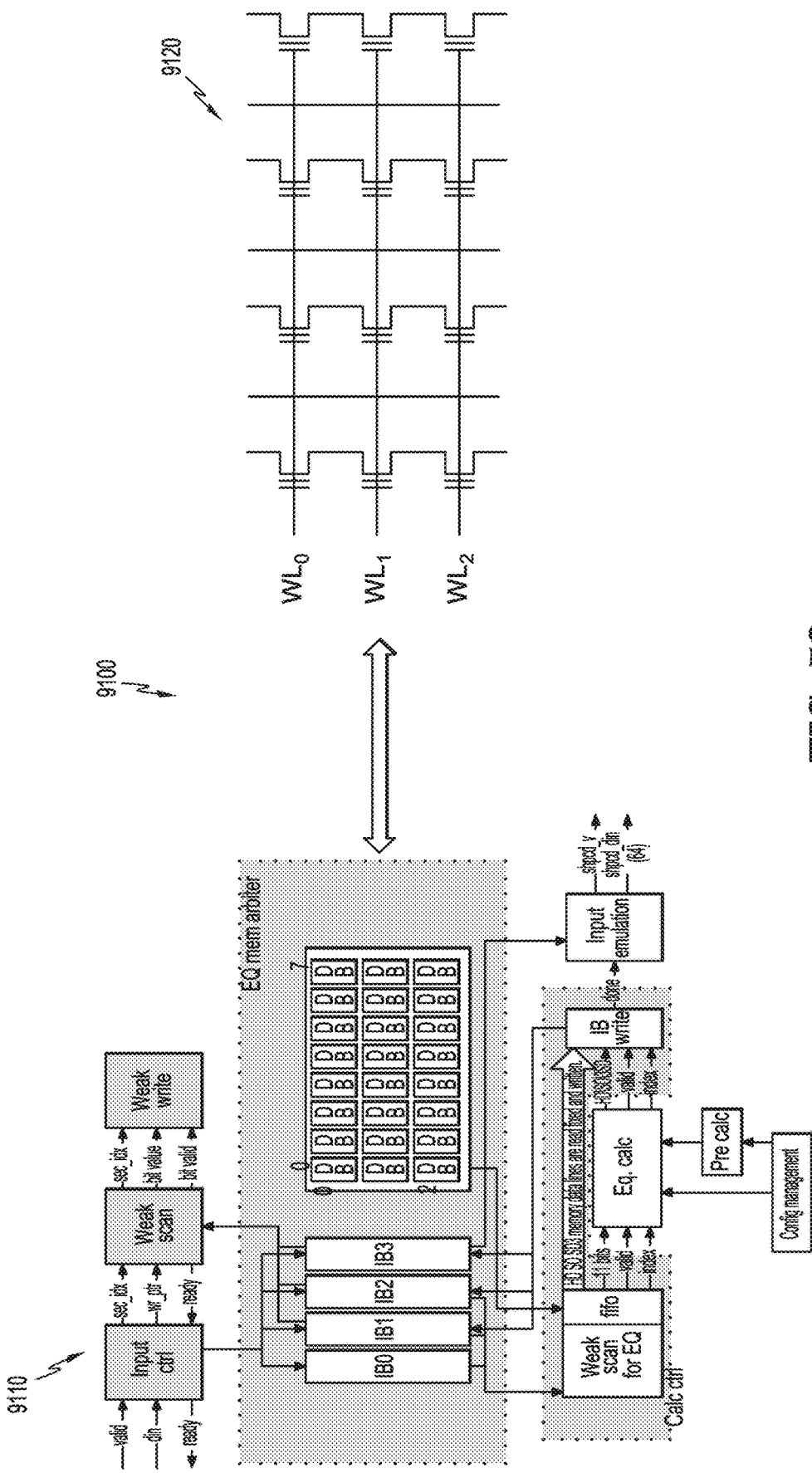
FIG. 52 is a hybrid diagram that shows a machine-learning memory controller in accordance with an embodiment of the present disclosure.

As shown in FIG. 52, an ML memory controller is indicated generally by the reference numeral 9100. The ML controller 9100 includes an SHPC ECC decoder with 4 KB read, where HD, 2SD and/or 3SD may have substantially the same operation as described above. The ML controller 9100 includes an ML equalizer mode 9100 utilizing 3-bit SD data 9110 and neighbor cells data 9120. In operation, the ML memory controller performs a 3-bit SD read, including two neighbor sectors in the same word-line (such as by HD read without decoding), three neighbor sectors in the upper word-line (such as by HD read without decoding), and three neighbor sectors in the lower word-line (such as by HD read without decoding). The ML equalizer flips error bits and outputs new SD data, and performs 3-bit SD decoding and outputs the decoded data (such as by co-optimization of SHPC code and ML equalizer Log-Likelihood Ratio (LLR).

Figure 53:
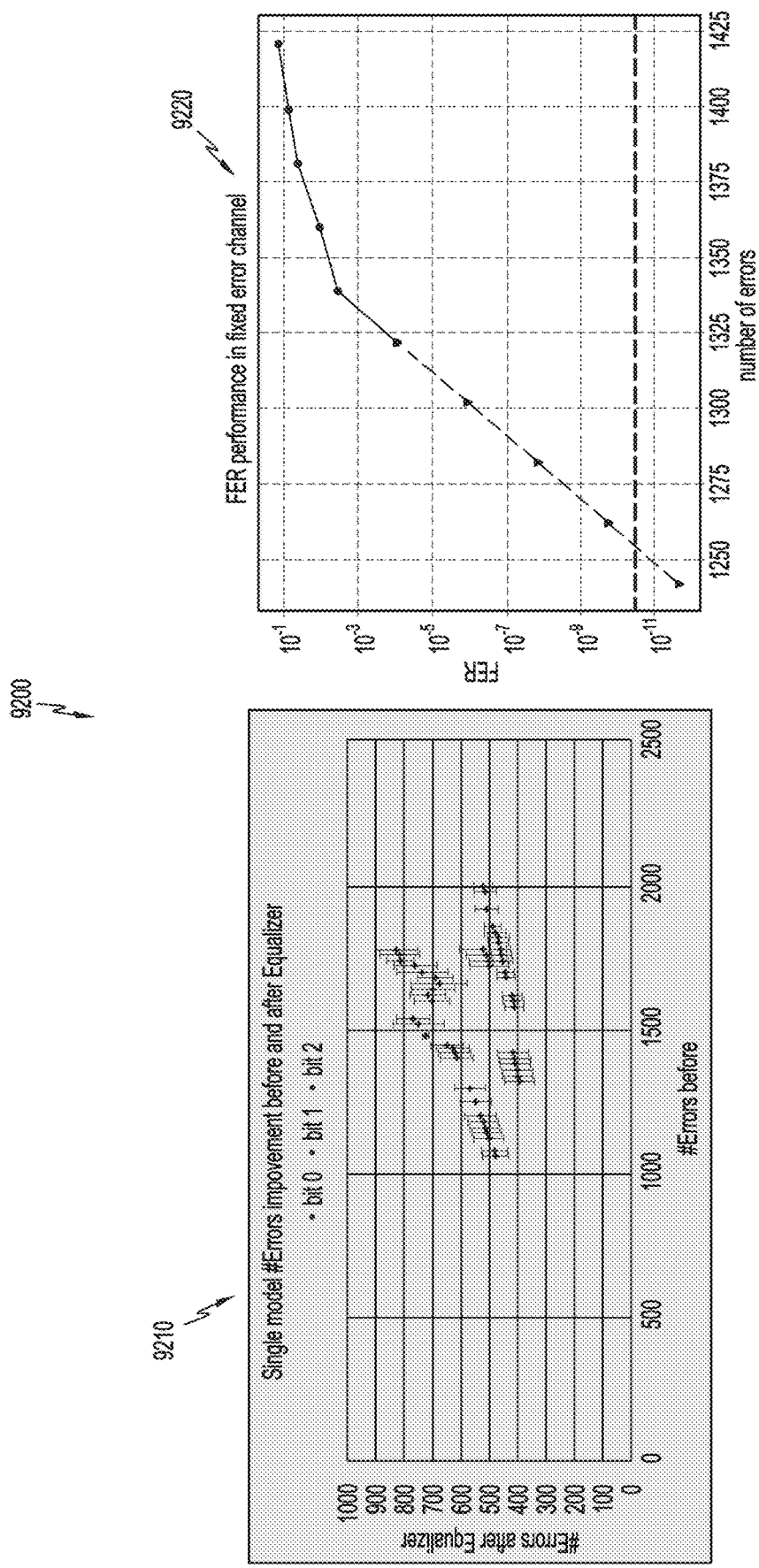
FIG. 53 is a graphical diagram that shows a machine-learning memory controller in accordance with an embodiment of the present disclosure.

Turning to FIG. 53, the ML memory controller 9100 reduces the number of errors after application of the equalizer as indicated in the plot 9210, where improvements in bit 0 are shown in the lower row, bit 1 in the middle row, and bit 2 in the upper row. The finite error response (FER) in a fixed error channel of triple-level cell NAND Flash memory is as indicated in the plot 9220. As shown, the ML memory controller 9100 with optimized SD mode correctability breaks the theoretical AWGN bound.

Figure 54:
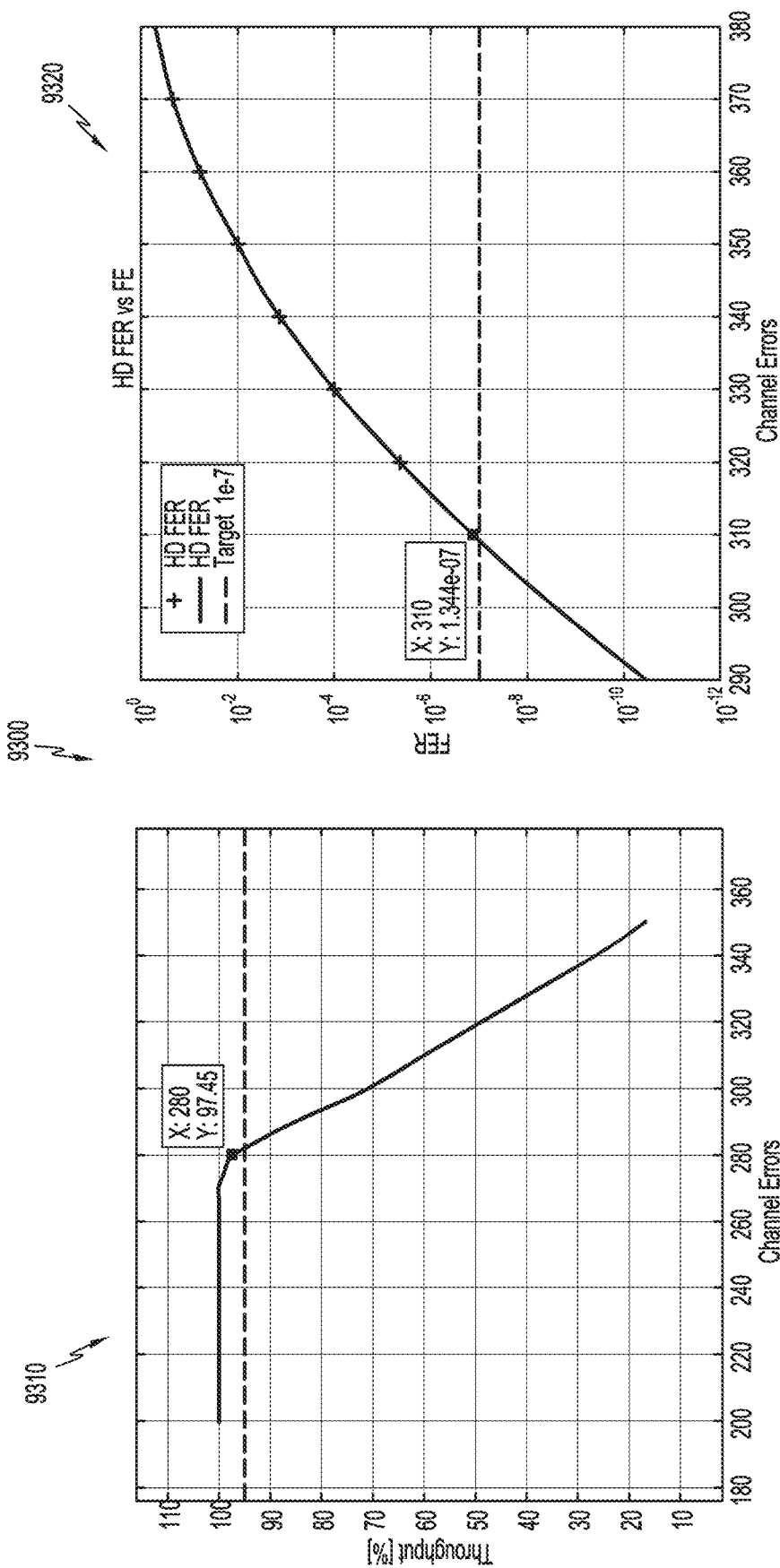
FIG. 54 is a graphical diagram that shows a machine-learning memory controller in accordance with an embodiment of the present disclosure.

Turning now to FIG. 54, the ML memory controller 9100 has optimizable HD throughput coverage 9310 and HD FER 9320. Thus, the ML-ECC 9016 has scalable HD throughput that may be further increased with additional decoding machines.

As shown in FIG. 55, the ML memory controller 9100 has physical properties 9410 including areas and gate counts for the encoder and decode, and power properties 9420. At just 1110-K/and 28-K for SVP RTL for the encoder and decoder, respectively, these represent significant reductions even before final optimization. That is, the ML-ECC 9116 has a relatively low cost implementation in terms of area, gate count, and power consumption.

Figure 56:
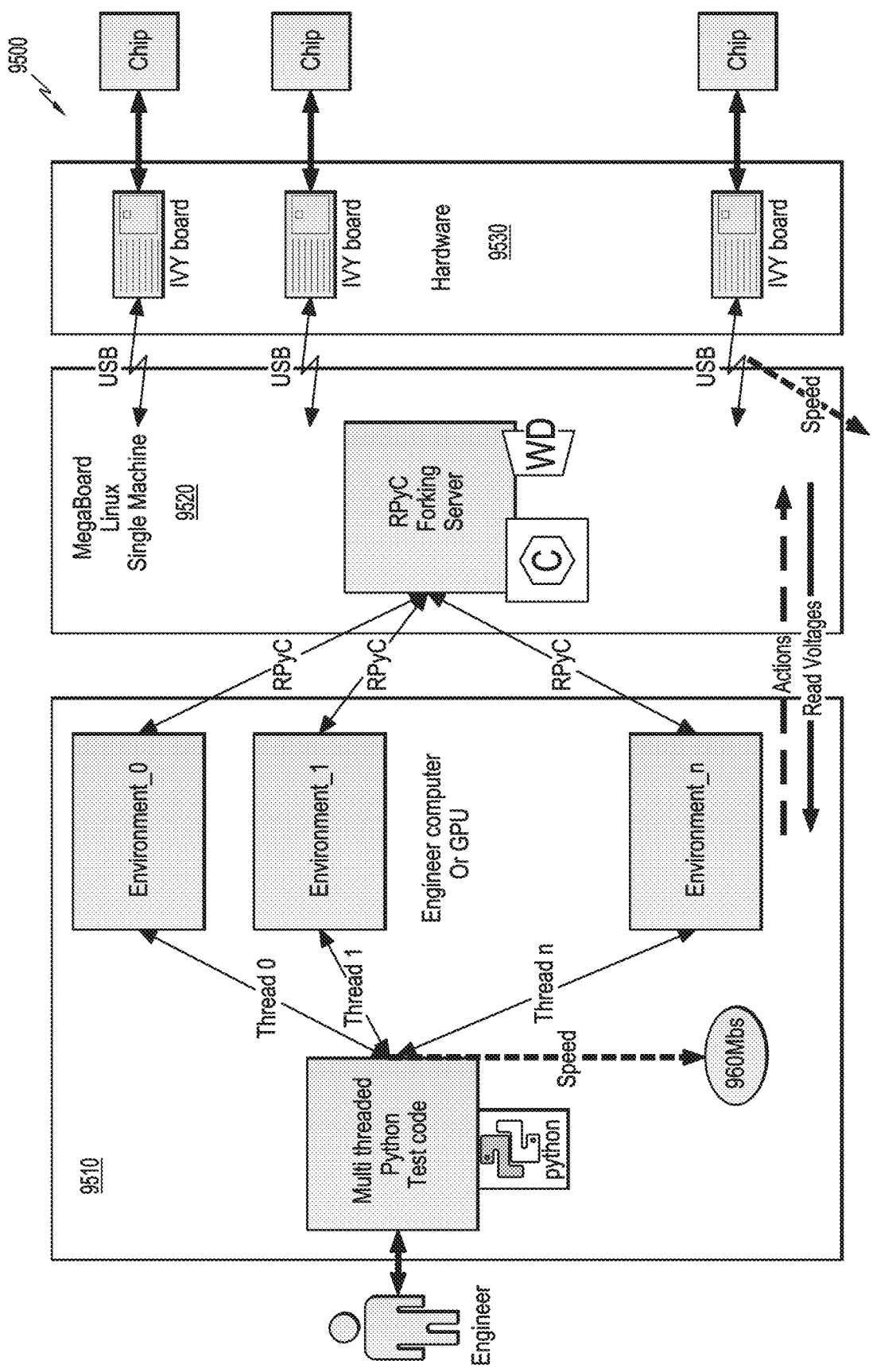
FIG. 56 is a graphical diagram that shows a machine-learning memory controller in accordance with an embodiment of the present disclosure.

Turning to FIG. 56, an optimization environment for an ML memory controller is indicated generally by the reference numeral 9500. The optimization environment 9500 includes an engineering computer 9510 with replay buffer, a forking server 9520, and multi-board interface 9530, without limitation thereto. The engineering computer 9510 may include multi-threaded test code and a plurality of environments. The multi-board interface 9530 may include a plurality of bridge boards connectable to NAND Flash memory chips.

What is claimed is:

1. A memory controller comprising:
   a hard-decision (HD) error-correcting code (ECC) decoder configured to receive and decode at least one first binary vector indicative of an encoded data word based on the encoded data word itself;
   a soft-decision (SD) ECC decoder configured to receive and decode at least one second binary vector indicative of the encoded data word based on the encoded data word and an associated probability of reliability measure; and
   a machine-learning equalizer (MLE) configured to variably select for output a decoded data word from one of the HD ECC decoder or the SD ECC decoder on a per data word basis in accordance with a learned cost function.

2. The memory controller of claim 1, wherein the MLE is configured to implement the HD ECC decoder and the SD ECC decoder with shared hardware resources including an inverse interleaver defining a mapping between the first binary vector and the second binary vector.

3. The memory controller of claim 1, wherein the MLE is configured to implement the HD ECC decoder and the SD ECC decoder in parallel and to select for output a decoded data word from the HD ECC decoder or a decoded data word from the SD ECC decoder in accordance with a cost function of a neural network.

4. The memory controller of claim 1, wherein the MLE is configured to implement the HD ECC decoder or the SD ECC decoder based on error rate predictions from previous data words.

5. The memory controller of claim 1, wherein the MLE is configured to implement the HD ECC decoder or the SD ECC decoder based on predicted buffer availability, wherein the HD ECC decoder is used if the predicted buffer availability is low.

6. The memory controller of claim 1,
   wherein the MLE comprises a neural network and is configured to implement the HD ECC decoder or the SD ECC decoder based on destination device,
   wherein the HD ECC decoder is used if the neural network predicts the SD ECC decoder is less likely to meet destination device data speed demands or the SD ECC decoder is used if the neural network predicts the HD ECC decoder is less likely to meet destination device data correctability demands.

7. The memory controller of claim 1, wherein the HD ECC decoder comprises an inverse interleaver configured to implement a linear ECC.

8. The memory controller of claim 7,
wherein the linear ECC is a soft Hamming permutation code (SHPC),
wherein the inverse interleaver includes a diagonal interleaver.

9. The memory controller of claim 1 comprised by a memory system, the memory system further comprising:
a flash memory connected to the memory controller,
wherein the HD ECC decoder is configured for high-speed data throughput from the flash memory,
wherein the SD ECC decoder is configured for high-correctability data throughput from the flash memory.

10. The memory controller of claim 9, wherein the flash memory is a NAND flash memory.

11. The memory controller of claim 9, wherein the flash memory has at least two bits per cell.

12. The memory controller of claim 9, wherein the flash memory is a NAND Flash memory having at least three bits per cell.

13. The memory controller of claim 9, wherein the SD ECC decoder is configured to:
ECC encode first data frames;
generate a plurality of syndrome units corresponding to the encoded first data frames;
ECC encode the plurality of syndrome units;
generate a syndrome codeword based on the encoded syndrome units;
ECC encode at least one second data frame to form a first bit vector;
ECC encode the at least one second data frame to form a second bit vector; and
combine the first bit vector and the second bit vector to form a third bit vector.

14. The memory controller of claim 13, wherein a value of a delta syndrome unit is generated based on the third bit vector and at least one redundancy data unit.

15. A method of controlling a memory device, comprising:
reading voltage levels as binary vectors from a plurality of memory cells connected to a string select line (SSL) of a memory device into a machine-learning (ML) neural network configured to minimize a learned cost function based on data word speed and correctability through the memory device;
receiving and decoding at least one first binary vector indicative of a data word encoded based on a hard-decision (HD) error-correcting code (ECC);
receiving and decoding at least one second binary vector indicative of the data word encoded based on a soft-decision (SD) ECC including an associated probability of reliability measure;
variably selecting for output a decoded data word based on the ML neural network's selection of one of the HD ECC or the SD ECC for each data word; and
cancelling noise on the SSL based on the selection,
wherein each of the HD ECC and the SD ECC are based on a linear ECC,
wherein the at least one first binary vector and the at least one second binary vector are mapped through an inverse interleave.

16. The method of claim 15, wherein cancelling noise includes changing at least one of the voltage levels from a first voltage level based on a first cluster of memory cells to a second voltage level based on a second cluster of memory cells.

17. The method of claim 16,
wherein the memory cells of the second cluster are exclusive of the memory cells of the first cluster,
wherein the linear ECC is a soft Hamming permutation code (SHPC),
wherein the inverse interleave includes a diagonal interleave.

18. The method of claim 15, wherein a plurality of word-lines connected to the SSL corresponds to a same plurality of read voltage levels.

19. The method of claim 15, further comprising:
generating a Hamming product code (HPC) codeword based on the read voltage levels;
performing extended Hamming code encoding on columns of bits from among bits of a plurality of encoded data frames of the read voltage levels and a bit vector, and
storing the HPC codeword in the memory device.

20. The method of claim 15, further comprising decoding the read voltage levels based on a Bose-Chaudhuri-Hocquenghem (BCH) algorithm.

* * * * *